US011676228B2

(12) United States Patent
Copley et al.

(10) Patent No.: US 11,676,228 B2
(45) Date of Patent: Jun. 13, 2023

(54) SYSTEMS, METHODS, AND PROGRAM PRODUCTS FOR FACILITATING PARCEL COMBINATION

(71) Applicant: Rebls, Inc., Seattle, WA (US)

(72) Inventors: Bryan Copley, Seattle, WA (US); Devyn Cairns, Richmond (CA); Jeff Bumgardner, Sun Valley, ID (US); Phil Placek, Seattle, WA (US); Michael Ewald, North Myrtle Beach, SC (US)

(73) Assignee: Rebls, Inc., Bellevue, WA (US)

( * ) Notice: Subject to any disclaimer, the term of this patent is extended or adjusted under 35 U.S.C. 154(b) by 0 days.

(21) Appl. No.: 17/849,525

(22) Filed: Jun. 24, 2022

(65) Prior Publication Data
US 2022/0335353 A1    Oct. 20, 2022

Related U.S. Application Data

(63) Continuation of application No. PCT/US2022/013321, filed on Jan. 21, 2022, which
(Continued)

(51) Int. Cl.
*G06Q 10/06* (2023.01)
*G06Q 50/16* (2012.01)
(Continued)

(52) U.S. Cl.
CPC ........... *G06Q 50/165* (2013.01); *G06F 18/22* (2023.01); *G06F 30/13* (2020.01);
(Continued)

(58) Field of Classification Search
CPC ............................................. G06Q 10/06313
See application file for complete search history.

(56) References Cited

U.S. PATENT DOCUMENTS 9,245,229 B2    1/2016  Fadell et al.
9,576,083 B2    2/2017  Kozloski et al.
(Continued)

FOREIGN PATENT DOCUMENTS

EP          3614308 A1 *  2/2020  .............. G06F 17/18
WO    WO-2006023290 A2 *  3/2006  .............. G01C 15/00
WO          2021148882 A1   7/2021

OTHER PUBLICATIONS

David A. Paterson and Lorraine Cortés-Vázquez, Site Development Plan Review, New York State Department of State Division of Local Government Services, Publication Date: Aug. 1998. (Year: 1998).*
(Continued)

*Primary Examiner* — Kurtis Gills
(74) *Attorney, Agent, or Firm* — AEON Law, PLLC; Adam L. K. Philipp; Jonathan E. Olson

(57) ABSTRACT

Machine learning systems and methods are described in regard to automating and acting upon evaluations of hypothetical composite project sites of 2+ disparate land parcels so as to allow a developer, owner, or other stakeholder to see and act upon potential land uses that are not reflected in conventional valuations. Some variants include a feature augmentation protocol for speciating one or more detailed structures feasible for development, a pattern matching protocol for identifying viable composite project sites that might suit a developer's requirements, technologies for accommodating latent preferences, proactive virtual development of co-owned disparate parcels, a notification protocol implementing offers to numerous potential sellers whose responses might affect project viability, wise virtual development and prioritization, or other such innovative configurations.

21 Claims, 22 Drawing Sheets

Related U.S. Application Data is a continuation-in-part of application No. PCT/IB2021/000028, filed on Jan. 25, 2021.

(51) Int. Cl.
 *G06Q 10/0631* (2023.01)
 *G06F 30/13* (2020.01)
 *G06Q 10/0637* (2023.01)
 *G06F 18/22* (2023.01)

(52) U.S. Cl.
 CPC ... *G06Q 10/0637* (2013.01); *G06Q 10/06313* (2013.01); *G06Q 10/06315* (2013.01); *G06Q 50/16* (2013.01)

(56) References Cited

U.S. PATENT DOCUMENTS

| | | |
|---|---|---|
| 9,746,913 B2 | 8/2017 | Lam et al. |
| 9,770,189 B2 | 9/2017 | Hyde et al. |
| 10,190,791 B2 | 1/2019 | Jacobson et al. |
| 10,192,275 B2 | 1/2019 | Smith |
| 10,198,735 B1 | 2/2019 | Humphries et al. |
| 10,204,362 B2 | 2/2019 | Wang et al. |
| 10,286,128 B2 | 5/2019 | Wells et al. |
| 10,296,961 B2 | 5/2019 | Kirkby et al. |
| 10,297,129 B2 | 5/2019 | Piccolo |
| 10,373,073 B2 | 8/2019 | Kisilev |
| 10,382,383 B2 | 8/2019 | Iseminger |
| 10,387,414 B2 | 8/2019 | Isaacson et al. |
| 10,459,981 B2 | 10/2019 | Lewin-Eytan et al. |
| 10,467,353 B2 | 11/2019 | Santarone et al. |
| 10,496,927 B2 | 12/2019 | Achin et al. |
| 10,510,087 B2 | 12/2019 | Palestrant et al. |
| 10,521,508 B2 | 12/2019 | Bateman et al. |
| 10,521,865 B1 | 12/2019 | Spader et al. |
| 10,521,943 B1 | 12/2019 | Phillips et al. |
| 10,528,652 B2 | 1/2020 | Goyal et al. |
| 10,565,329 B2 | 2/2020 | Greenwood |
| 10,657,375 B1 | 5/2020 | Edwards et al. |
| 10,679,205 B2 | 6/2020 | Madden |
| 10,706,057 B2 | 7/2020 | Connolly et al. |
| 10,818,082 B2 | 10/2020 | Esposito et al. |
| 10,839,297 B1 | 11/2020 | Ezick et al. |
| 10,839,431 B1 | 11/2020 | Nath et al. |
| 10,846,873 B2 | 11/2020 | Versace et al. |
| 10,853,398 B2 | 12/2020 | Fisher |
| 10,860,023 B2 | 12/2020 | Cairano et al. |
| 10,861,187 B2 | 12/2020 | Packwood et al. |
| 10,889,925 B2 | 1/2021 | Blenis, Jr. |
| 10,897,650 B2 | 1/2021 | Kaliouby et al. |
| 10,983,026 B2 | 4/2021 | Santarone et al. |
| 10,992,836 B2 | 4/2021 | Suiter et al. |
| 11,044,393 B1 | 6/2021 | Suiter et al. |
| 11,068,385 B2 | 7/2021 | Ahamed |
| 11,134,359 B2 | 9/2021 | Liang et al. |
| 11,157,930 B1 | 10/2021 | Bachu et al. |
| 11,158,118 B2 | 10/2021 | Esposito et al. |
| 2005/0171877 A1* | 8/2005 | Weiss .................. G06Q 40/06 705/35 |
| 2005/0273346 A1 | 12/2005 | Frost |
| 2014/0136294 A1* | 5/2014 | Martinovic ...... G06Q 10/06313 705/7.37 |
| 2014/0163932 A1 | 6/2014 | Detwiler et al. |
| 2016/0063633 A1* | 3/2016 | Ross .................. G06Q 40/06 705/36 T |
| 2016/0110824 A1 | 4/2016 | Rodriguez |
| 2016/0259841 A1 | 9/2016 | Andrew et al. |
| 2017/0011548 A1 | 1/2017 | Sigaty et al. |
| 2017/0076438 A1 | 3/2017 | Kottenstette et al. |
| 2017/0109638 A1 | 4/2017 | Marcu et al. |
| 2017/0109668 A1 | 4/2017 | Marcu et al. |
| 2018/0150926 A1* | 5/2018 | Darden .............. G06Q 30/0278 |
| 2018/0293335 A1 | 10/2018 | Wayne et al. |
| 2019/0066241 A1* | 2/2019 | Budlong ................ G06F 16/29 |
| 2019/0108413 A1* | 4/2019 | Chen .................. C12N 15/8281 |
| 2019/0206002 A1 | 7/2019 | Gupta |
| 2019/0272324 A1 | 9/2019 | Esposito et al. |
| 2019/0272669 A1 | 9/2019 | Esposito et al. |
| 2020/0065968 A1* | 2/2020 | Sargent ............... G06N 3/0454 |
| 2020/0104522 A1 | 4/2020 | Collart |
| 2020/0117959 A1* | 4/2020 | Sargent ............... G06V 20/176 |
| 2021/0125294 A1 | 4/2021 | Tidwell et al. |
| 2021/0192649 A1 | 6/2021 | Darden |
| 2021/0263986 A1 | 8/2021 | Hundley et al. |
| 2021/0319059 A1* | 10/2021 | Vianello ............. G06V 20/176 |

OTHER PUBLICATIONS

International Search Report dated Jun. 21, 2022, for PCT/US2022/013321, filed Jan. 21, 2022.

Written Opinion dated Jun. 21, 2022, for PCT/US2022/013321, filed Jan. 21, 2022.

Chen, N., "Website launches to reveal how much your property is really worth," KIRO-7 News, 2022 Cox Media Group, downloaded Jun. 8, 2016 at 6:38 pm PDT.

International Search Report dated May 20, 2021, for PCT/IB21/00028, filed Jan. 25, 2021.

Levy, N., "New CityBldr valuation tool aims to help homeowners unearth hidden land value," GeekWire, downloaded Jan. 17, 2017 at 8;26 am.

Levy, N., "Realtors vs. robots: Redfin CTO says artificial intelligence shouldn't replace real estate agents," GeekWire, downloaded Oct. 2, 2017, at 4:29 pm.

Miller, P., "The Rise of the Real Estate Data Bots," ATTOM Data Solutions © 1996-2022, downloaded Jul. 12, 2017.

O'Keefe, L., "Artificial Intelligence Takeover: 11 Companies Transforming CRE," Bisnow, Sep. 27, 2017.

Risley, J., "New real-estate tool CityBldr finds more than $35B in untapped profit potential on Seattle-area properties," GeekWire, May 17, 2016 at 11:40 am.

Soper, T., "Real estate tech startups surge on the GeekWire 200 as investors bet on sector's long-term growth," GeekWire, Oct. 24, 2018.

Stiles, M., Exclusive: Seattle startup launches ar lificial intelligence system for real estate developers, Puget Sound Business Journal, Apr. 13, 2016.

Stiles, M., "Real estate reimagined: CityBldr does what Zillow and Redfin can't," Puget Sound Business Journal, Sep. 7, 2017.

Venturer, "A Women-Only Coworking Space Is Launching a Social Networking App," Entrepreneur.com Inc., © 2018, Sep. 7, 2018.

Written Opinion dated May 20, 2021, for PCT/IB21/00028, filed Jan. 25, 2021.

Wu, D., How to Recession-Proof Rental Housing, Builder Magazine, Sep. 11, 2018.

* cited by examiner

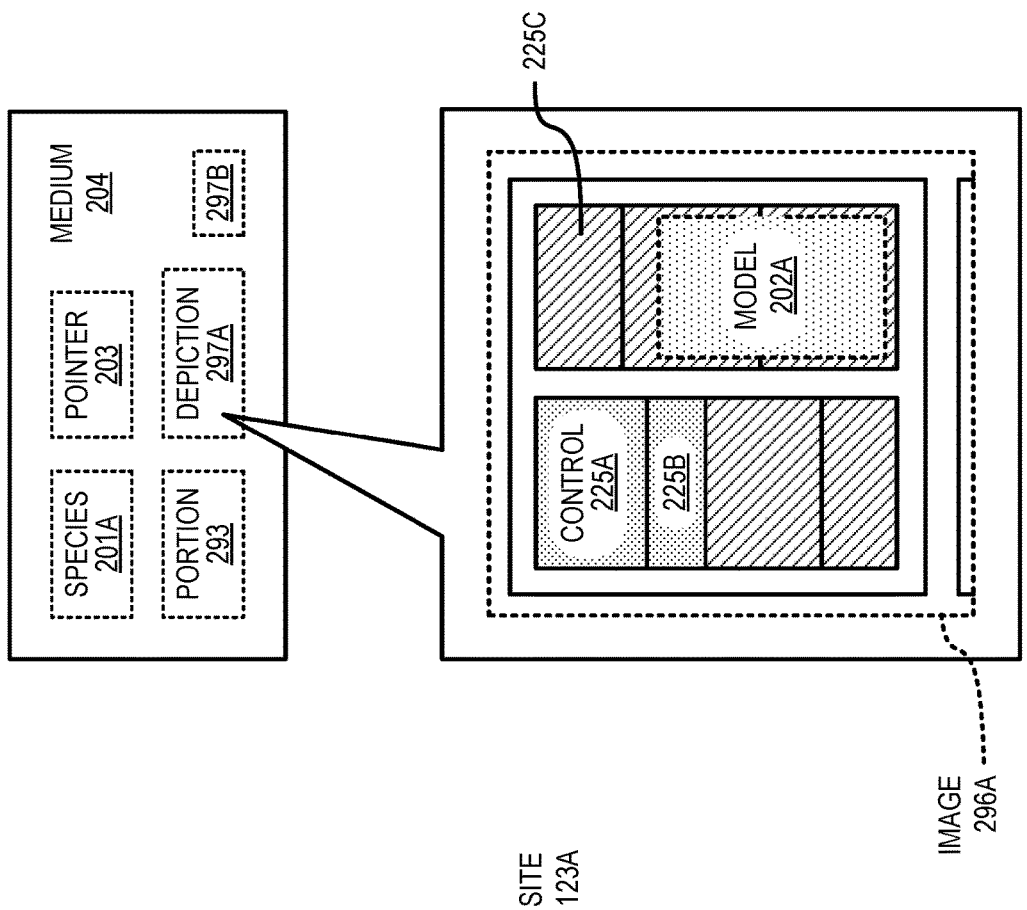
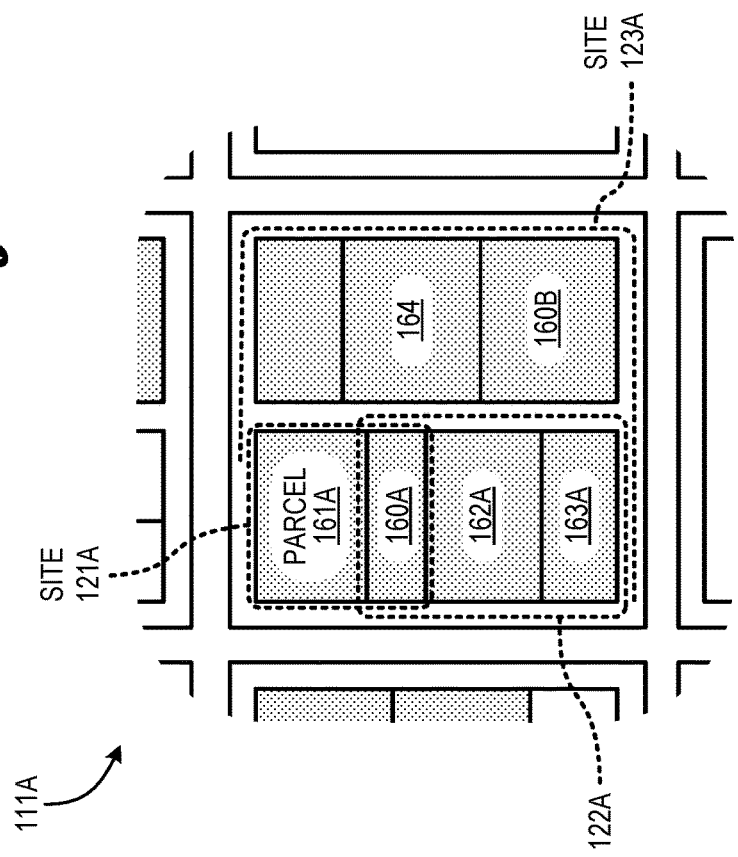

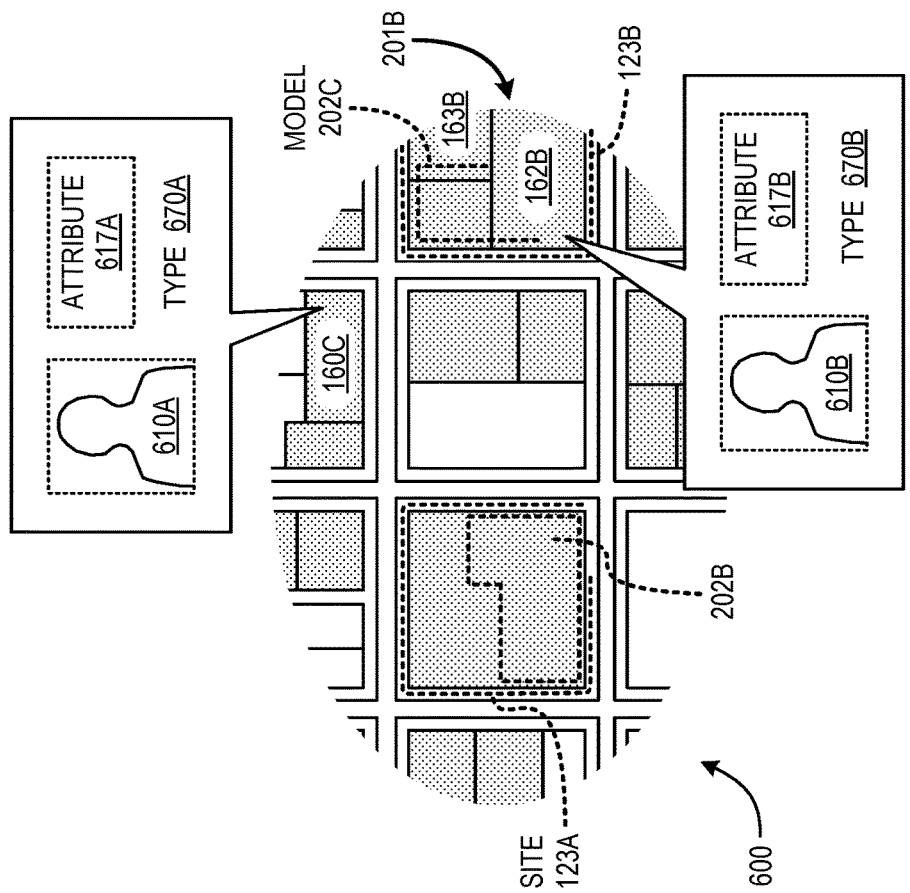
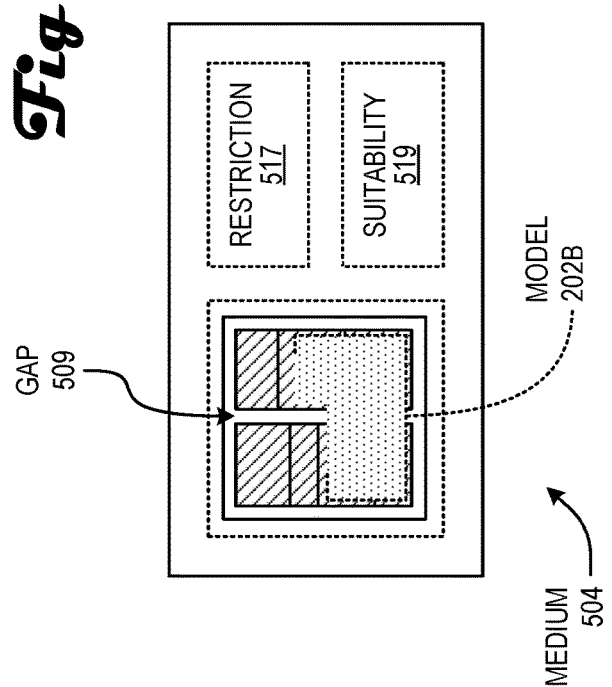

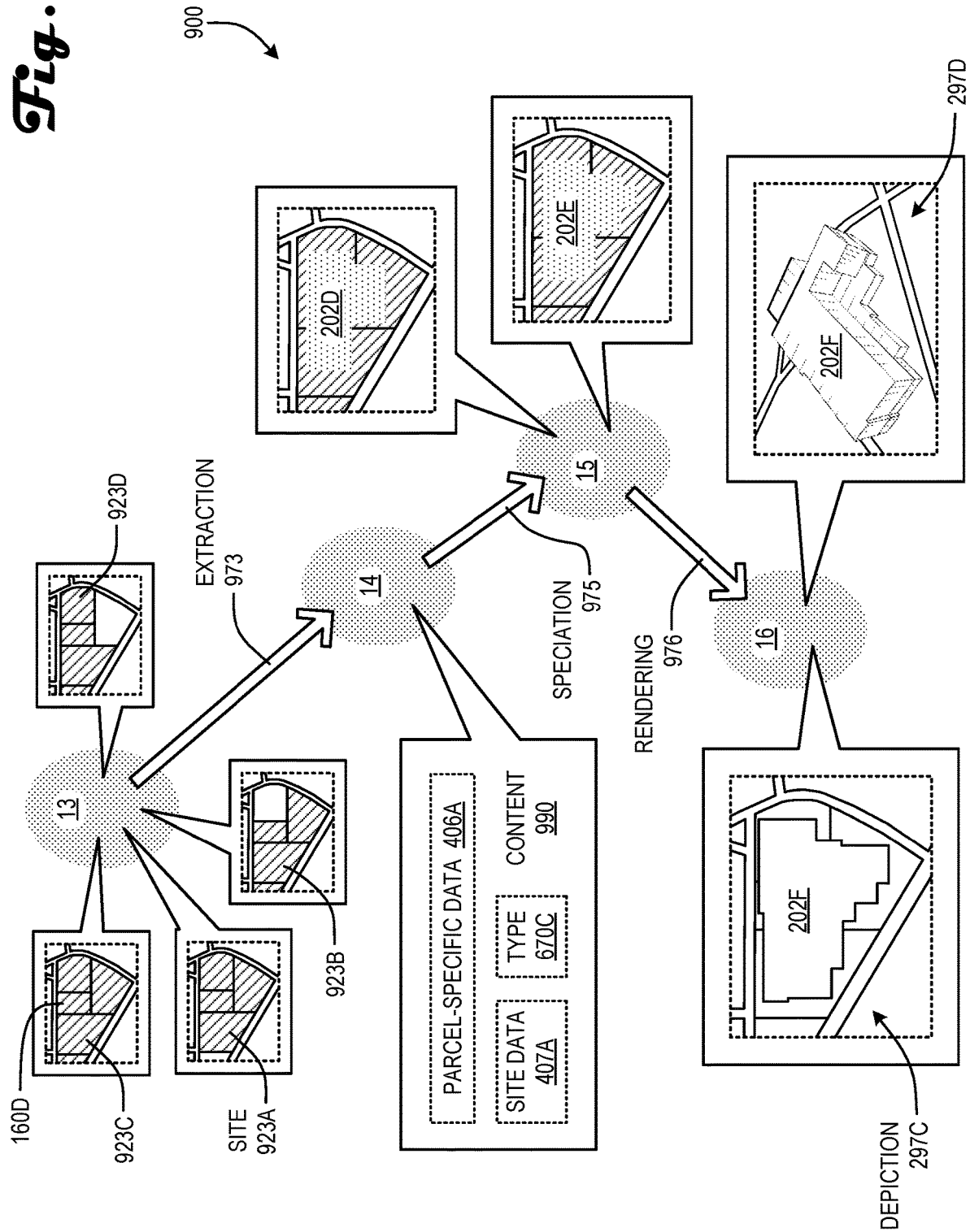

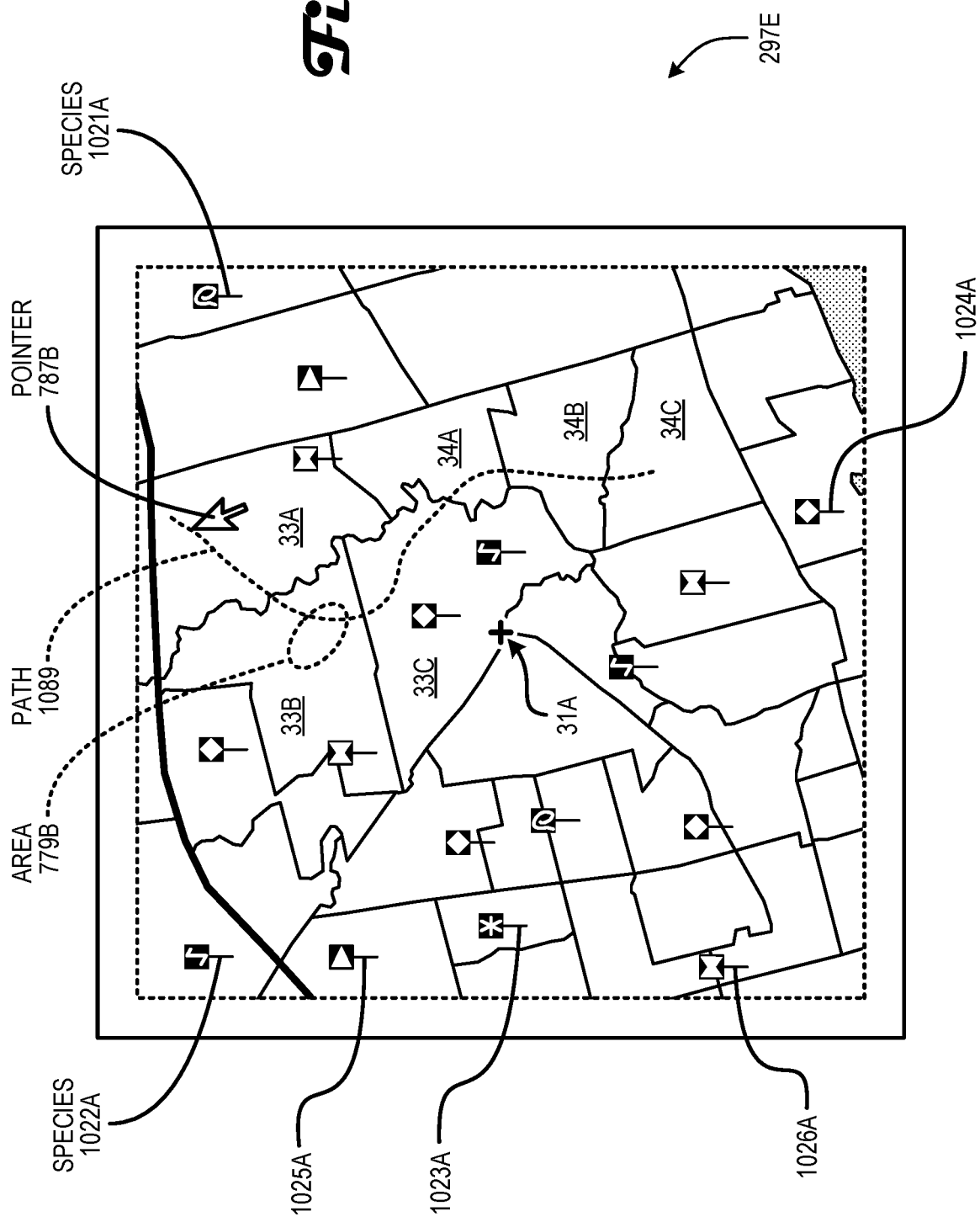

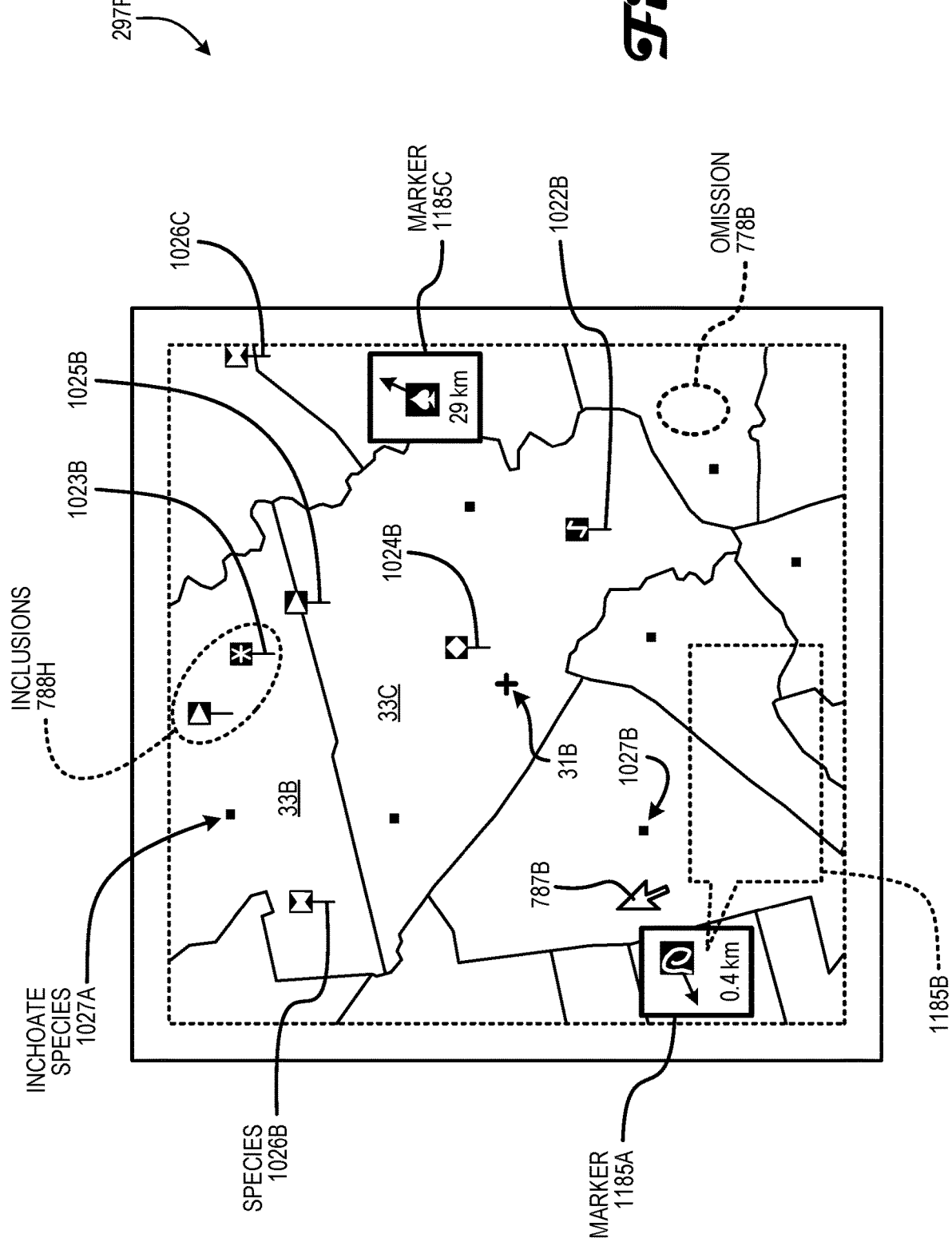

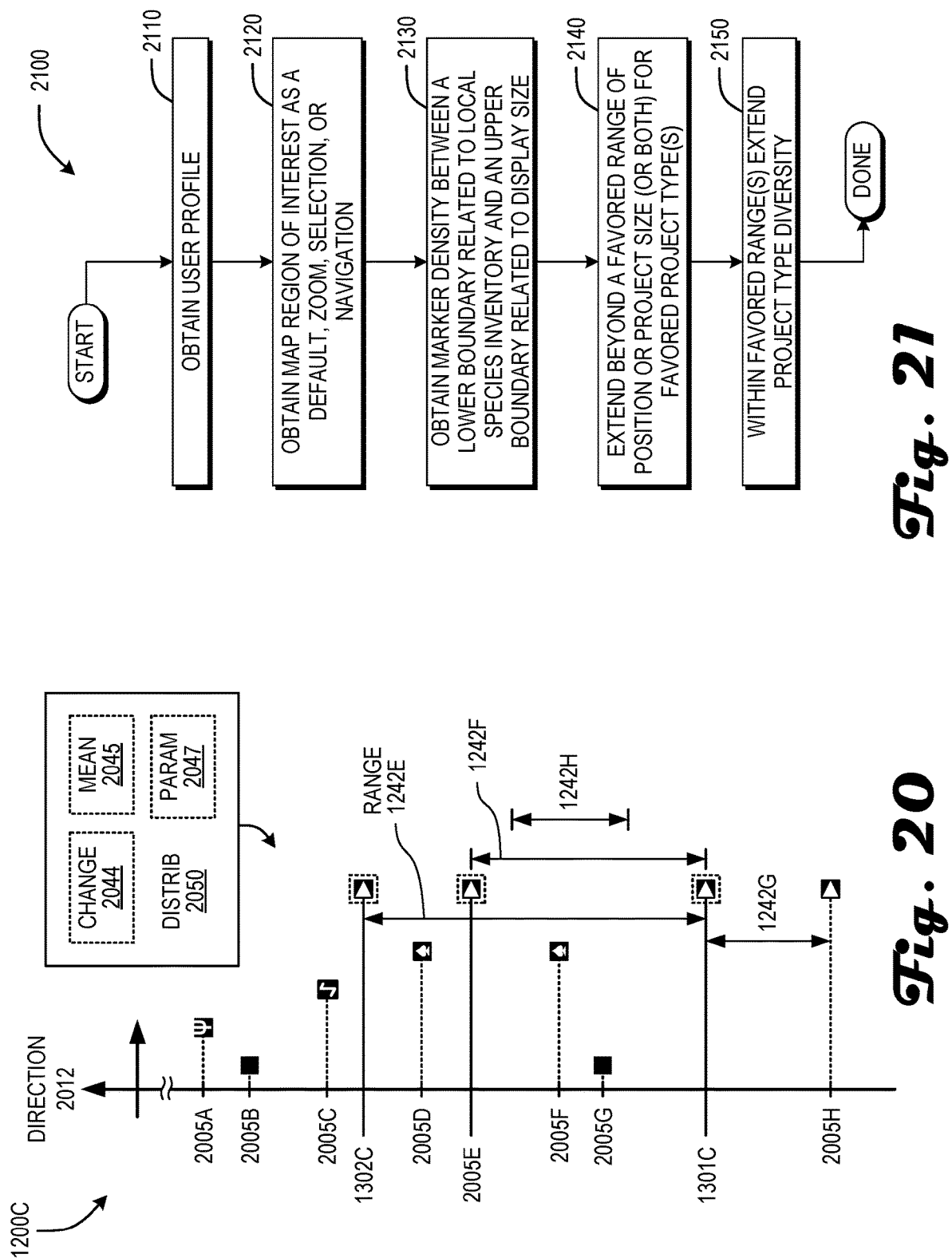

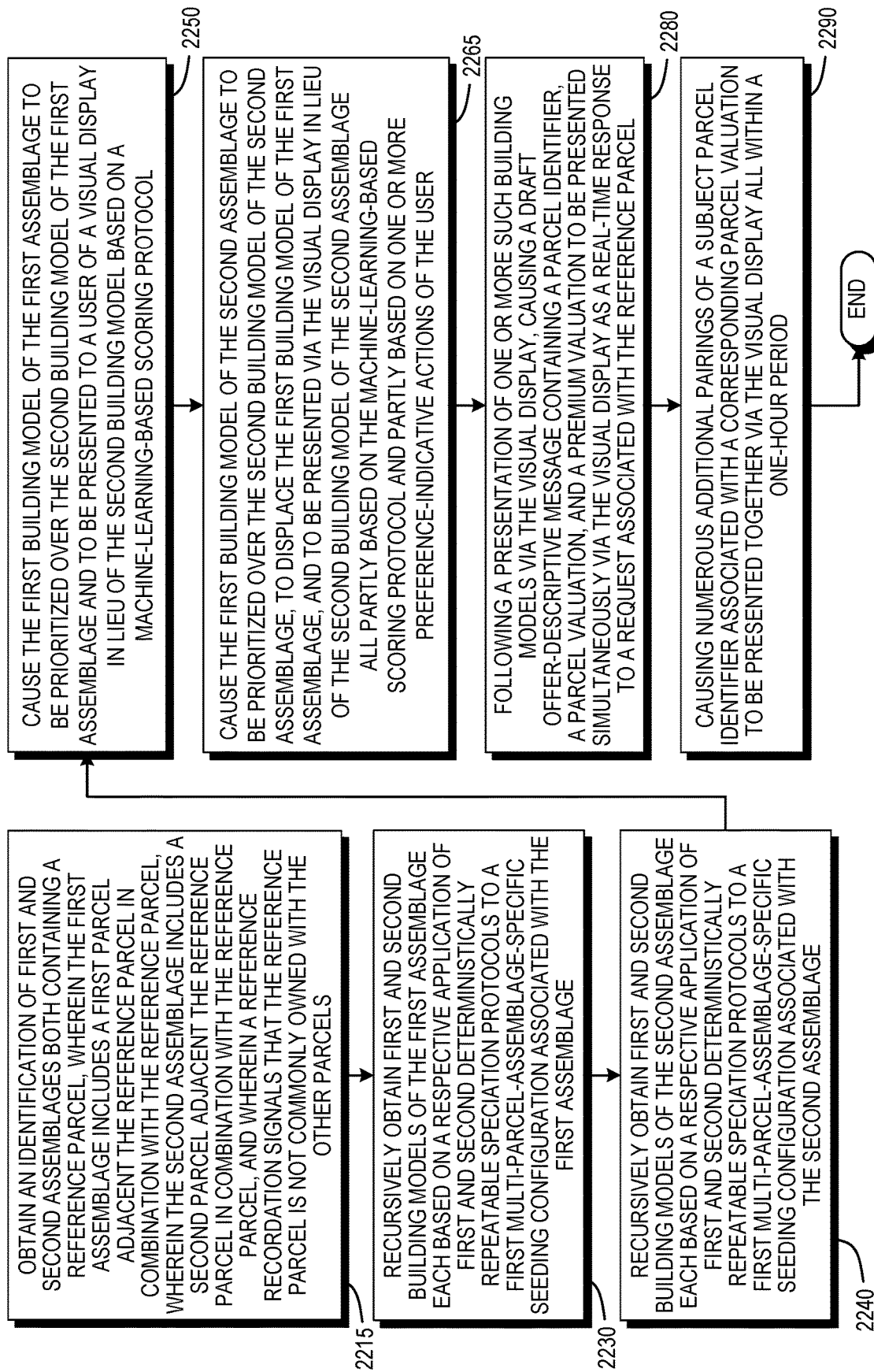

US 11,676,228 B2

SYSTEMS, METHODS, AND PROGRAM PRODUCTS FOR FACILITATING PARCEL COMBINATION

RELATED APPLICATIONS

This application is a continuation of PCT Patent Application No. PCT/US2022/013321 having International filing date of Jan. 21, 2022, which claims the benefit of priority of PCT Patent Application No. PCT/IB2021/000028 filed on Jan. 25, 2021. The entire contents of the above-referenced applications and of all priority documents referenced in the Application Data Sheet filed herewith are hereby incorporated by reference for all purposes.

BRIEF DESCRIPTION OF THE DRAWINGS

FIG. 1 illustrates land parcels and potential project sites according to one or more improved technologies.

FIG. 2 illustrates a displayable model comprising a development of several virtual shelters or other building models in which one or more improved technologies may be incorporated.

FIG. 5 depicts data-handling media containing particular information items in which one or more improved technologies may be incorporated.

FIG. 6 illustrates a displayable top-view model comprising a development of a virtual building model that spans several parcels in which one or more improved technologies may be incorporated.

FIG. 9 illustrates a progression through several stages of development in which one or more improved technologies may be incorporated.

FIG. 10 depicts a map image depicting several Toronto postal codes in which one or more improved technologies may be incorporated on a display or other non-transitory data storage medium.

FIG. 11 depicts a laterally translated map image like that of FIG. 10 but in which one or more improved technologies may be incorporated for changing a map magnification or position (or both).

FIG. 20 depicts a plot of a direction against various types of potential project sites in which one or more improved technologies may be incorporated.

FIG. 21 depicts an operational flow in which one or more improved technologies may be incorporated.

FIG. 22 depicts another operational flow in which one or more improved technologies may be incorporated.

DETAILED DESCRIPTION

Figure 3:
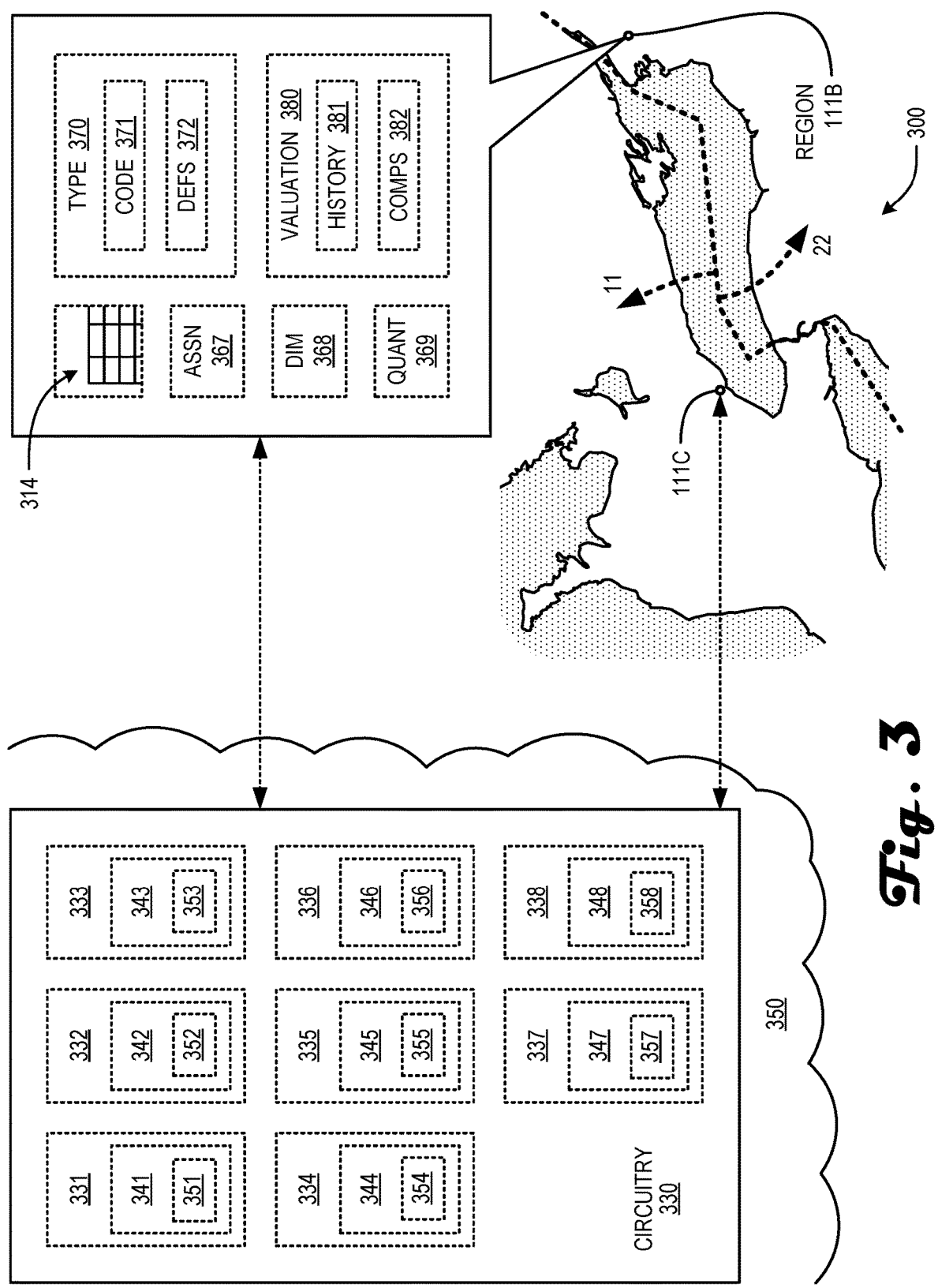
FIG. 3 depicts an international implementation featuring special-purpose transistor-based circuitry in which one or more improved technologies may be incorporated on one or both sides of the border.

The detailed description that follows is represented largely in terms of processes and symbolic representations of operations by conventional computer components, including a processor, memory storage devices for the processor, connected display devices and input devices. Furthermore, some of these processes and operations may utilize conventional computer components in a heterogeneous distributed computing environment, including remote file servers, computer servers and memory storage devices.

It is intended that the terminology used in the description presented below be interpreted in its broadest reasonable manner, even though it is being used in conjunction with a detailed description of certain example embodiments. Although certain terms may be emphasized below, any terminology intended to be interpreted in any restricted manner will be overtly and specifically defined as such.

The phrases "in one embodiment," "in various embodiments," "in some embodiments," and the like are used repeatedly. Such phrases do not necessarily refer to the same embodiment. The terms "comprising," "having," and "including" are synonymous, unless the context dictates otherwise.

"Above," "accelerating," "achieved," "aggregate," "any," "application-type," "application-specific," "assembled," "augmented," "automatic," "availability," "based on," "because," "complete," "composite," "comprising," "conditional," "consensus-driven," "configured," "correlated," "current," "decelerating," "decreasing," "digital," "directly," "displayable," "distributed," "executed," "facilitating," "first," "forward," "geographic," "given," "higher," "hybrid," "implemented," "in combination with," "included," "indicated," "inductive," "inferred," "integrated," "later," "matching," "moderate," "more," "mutually," "multiple," "negatively," "not including," "numerous," "of," "otherwise," "owned," "parcel-selective," "particular," "partly," "positively," "prioritized," "private,"

"public," "real-time," "received," "remote," "rendered," "requester-specified," "responsive," "scoring," "second," "seeding," "sequencing," "shorter," "signaling," "significant," "simultaneous," "single," "smart," "so as," "spanning," "special-purpose," "specific," "subtle," "suitability," "techniques," "temporal," "third," "through," "transistor-based," "undue," "unobtrusive," "updated," "upon," "utility," "very," "via," "virtual," "within," "without," or other such descriptors herein are used in their normal yes-or-no sense, not merely as terms of degree, unless context dictates otherwise. As used herein "data transformative" instruction sets are those that primarily implement other kinds of computations. Although one of these types of instruction sets may invoke the other as a subroutine, only very rarely is a single code component of instructions a true hybrid. As used herein a computer response to a user action is not "automatic" if the response merely implements the user action. But computer responses to a user action may be "automatic" if the user-intended event ultimately triggers the computer response in a complex cascading or combinational way that few users could foresee without access to advanced technologies disclosed herein. Two numbers are "within an order of magnitude" or "on the order of" one another if they differ by a factor of ten or less.

In light of the present disclosure those skilled in the art will understand from context what is meant by "remote" and by other such positional descriptors used herein. Likewise they will understand what is meant by "partly based" or other such descriptions of dependent computational variables/signals. A set of items is "numerous" if at least two dozen items are included. A set of items is "very numerous" if at least two hundred items are included. A responsive event is a "real time" result if a last defined trigger thereof (e.g. a user action or other programmatically detected condition) occurred less than 30 seconds before the real-time responsive result. As used herein one or more physical locations "correspond" with a map, prioritization, development, presentation, or condition thereof if the former refers to the latter, if the latter refers to the former, or if one or more digital objects (e.g. records) establish a linkage between the two. Such correspondence may or may not be one-to-one in respective variants. A "prioritization" is a distinguishing indication tending to cause one or more options 1984D to become more favorable relative to one or more other options such as by demoting or disqualifying the other option(s). An indication is "distinguishing" as used herein if it creates or clarifies any such new (apparent or other) favoritism. An item is "within" a range as used herein if it is not outside the range.

As used herein a depiction is "rendered" if its shape or a 2-dimensional projection thereof is shown graphically, portrayed as a pixel-based or vector-based list of shape objects, or otherwise expressed comprehensively enough for a human to perceive an impression of its shape. As used herein items that are "particular" or "subject" or "associated" are distinct from other items not so described in a given scenario. These are not otherwise imbued with substantive weight herein, unlike such terms as "primary" or "higher." The term "other" and ordinal identifiers like "first" are likewise used to distinguish items from other items, not for signaling a temporal or other substantive sequence.

Terms like "processor," "center," "unit," "computer," or other such descriptors herein are used in their normal sense, in reference to an inanimate structure. Such terms do not include any people, irrespective of their location or employment or other association with the thing described, unless context dictates otherwise. "For" is not used to articulate a mere intended purpose in phrases like "circuitry for" or "instruction for," moreover, but is used normally, in descriptively identifying special purpose software or structures.

Reference is now made in detail to the description of the embodiments as illustrated in the drawings. While embodiments are described in connection with the drawings and related descriptions, there is no intent to limit the scope to the embodiments disclosed herein. On the contrary, the intent is to cover all alternatives, modifications and equivalents. In alternate embodiments, additional devices, or combinations of illustrated devices, may be added to, or combined, without limiting the scope to the embodiments disclosed herein.

FIG. 1 illustrates an overhead view of a geographic region 111A in which a reference land parcel 160A may be combined with a first adjacent parcel 161A to form a contiguous and potentially viable first project site 121A, with a second adjacent parcel 162A and perhaps a third parcel 163A to form a second (option for a) project site 122A, or with both to form various larger assemblages. A largest superset assemblage project site 123A that includes these assemblages also includes parcels 160B, 163A, 164 as shown into a nominally contiguous parcel group. Notably, in some contexts a maximized-assemblage-type project site 123A is recognizable by one or more machine learning modules described herein as unsuitable for further expansion (e.g. by virtue of no additional adjacent parcels being eligible to add to the assemblage according to available parcel description records). In others, however, a project site may combine land parcels into a non-contiguous project site.

As used herein, a plain reference numeral (e.g. like 123) may refer generally to a member of a class of items (e.g. like computing devices) exemplified with a hybrid numeral (e.g. like 123A) and it will be understood that every item identified with a hybrid numeral is also an exemplar of the class. Moreover although a reference numeral shared between figures refers to the same item, most figures depict respective embodiments.

FIG. 2 shows one or more storage or display media 204 containing one or more instances of species 201A, of pointers 203, of depictions 297A-B, or of portions 293 thereof. Such depictions 297A may comprise a top view of a geographic map as a digital image 296A, for example, in which a composite site 123 (shown with diagonal shading) is augmented with a (virtual) model 202A of a viable shelter (e.g. a retail store) or other code- and specification-compliant structure. For each speciation protocol and project site one or more corresponding models 202A may be incrementally developed as a mode of feature augmentation further described below. The direction of such computation can be altered, moreover, such as by an activation of one or more controls 225A-B that enlarge the selected composite site 123 (e.g. by adding a parcel 160A, 161A); by an activation of one or more controls 225C that reduce the selected composite site 123 (by removing one or more parcels); or by an activation of one or more controls 225 that modify the speciation protocol or its parameters.

FIG. 3 shows one or more instances of systems 300 by which a device user in one region 11 (e.g. in Ontario, CA) may interact virtually with many parcels in another region 22 (e.g. New York, USA). Records 314 pertaining to such parcels may establish one or more associations 367, dimensions 368, types 370, valuations 380, or other quantifications 369 thereof. Such types 370 may establish codes 371, ownership, use restrictions, or other attribute definitions pertaining to each parcel or portion thereof. Alternatively or additionally, quantifications 369 (e.g. of transaction histories 381 of a subject parcel or that of comparable parcels 382) or attributes of current structures or features thereof may affect parcel or site valuations 380. Moreover in some cases users in respective regions 111B-C may collaborate so that a local agent may observe a subject parcel visually, for example, to facilitate same-day evaluation by remote device users buying or selling interests in the parcel. Records 314 pertaining to a parcel may not be online, for example, necessitating time-sensitive investigation by a local agent.

Whichever of these regions 111 contains the parcels 160-164 being analyzed corresponds to one or more local site maps (e.g. with one or more coordinates or dimensions 368), one or more municipal or other regional zone types 370 (e.g. defined by one or more parcel use constraint codes 371 or other regulatory definitions 372), one or more valuations 380 (e.g. affected by an ownership history or property transaction comparables 382), or other such information as described herein.

FIG. 3 also depicts special-purpose transistor-based circuitry 330—optionally implemented as an application specific integrated circuit (ASIC) or in a user interface (UI) governance server, for example—in which some or all of the functional modules described herein may be implemented. Transistor-based circuitry 330 includes one or more instances of various modules 331-338 as further described below. Interface modules 331, for example, each including an electrical node set 341 upon which informational data is represented digitally as a corresponding voltage configuration 351. Alternatively or additionally, transistor-based circuitry 330 may likewise include instances of control modules 332 (e.g. configured to invoke one or more other modules) each including an electrical node set 342 upon which informational data is represented digitally as a corresponding voltage configuration 352. Transistor-based circuitry 330 may likewise include instances of speciation modules 333 each including an electrical node set 343 upon which informational data is represented digitally as a corresponding voltage configuration 353. Transistor-based circuitry 330 may likewise include instances of authorization modules 334 each including an electrical node set 344 upon which informational data is represented digitally as a corresponding voltage configuration 354. Transistor-based circuitry 330 may likewise include instances of indexing modules 335 each including an electrical node set 345 upon which informational data is represented digitally as a corresponding voltage configuration 355. Transistor-based circuitry 330 may likewise include instances of response modules 336 each including an electrical node set 346 upon which informational data is represented digitally as a corresponding voltage configuration 356. Transistor-based circuitry 330 may likewise include instances of recognition/learning modules 337 each including an electrical node set 347 upon which informational data is represented digitally as a corresponding voltage configuration 357. And transistor-based circuitry 330 may likewise include instances of transmission modules 338 each including an electrical node set 348 upon which informational data is represented digitally as a corresponding voltage configuration 358. In some variants, as described below, such modules implement such functionality jointly (e.g. in conjunction with other modules or processors described herein). Alternatively or additionally, in some variants such modules (or components thereof) may be geographically distributed across one or more networks 350.

Figure 4:
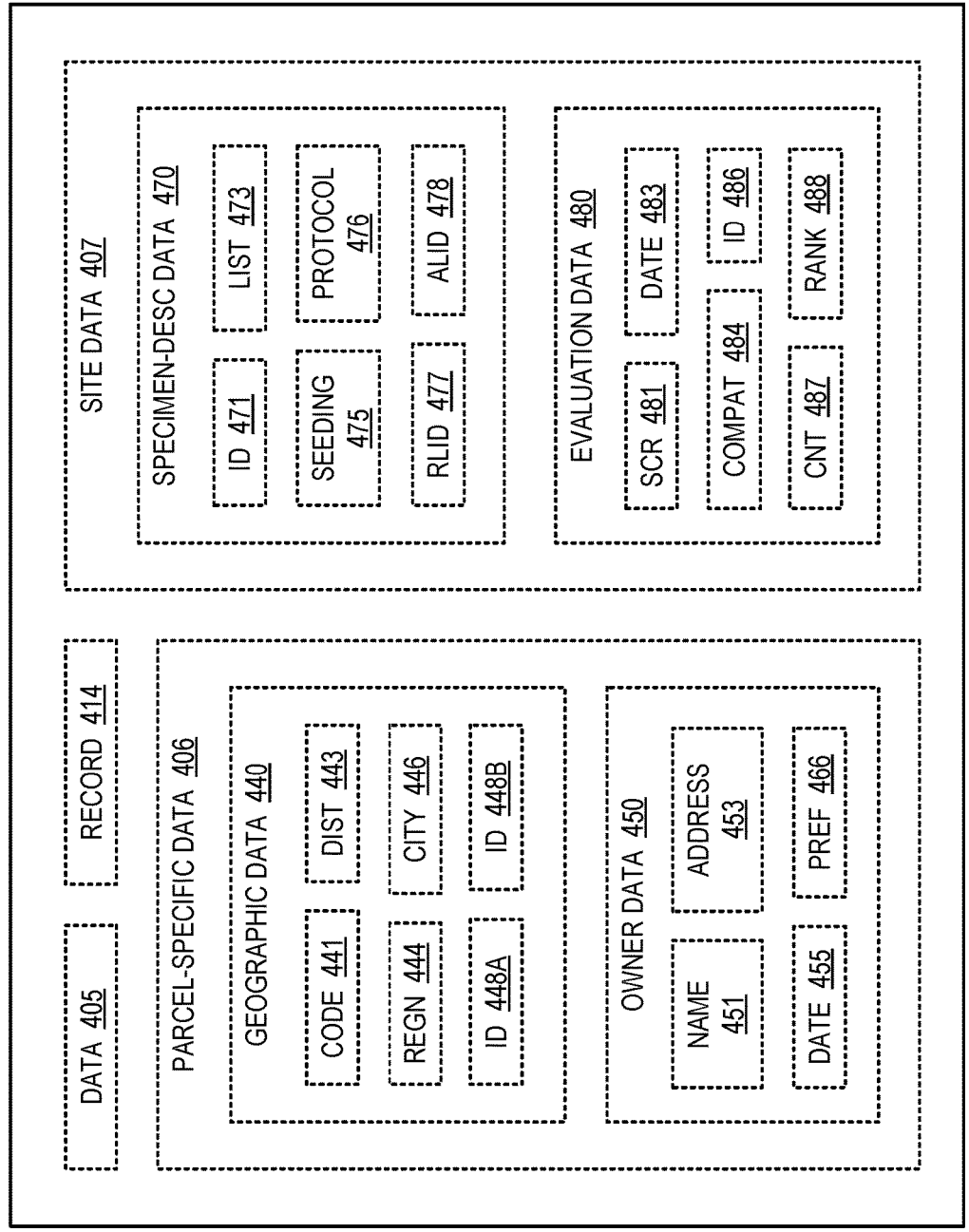
FIG. 4 depicts a distributed ledger in which one or more improved technologies may be incorporated.

FIG. 4 shows one or more data-handling media 404. Operational data 405 thereon may include one or more instances of records 414, of parcel-specific data 406, of project site data 407, of preference data, or of acquisition data. For example such parcel-specific data 406 may include one or more instances of postal codes 441, of identifiers of a district 443, of identifiers of a region 444, of identifiers of a city 444, of reference parcel identifiers 448A, of parcel identifiers 448B pertaining to parcels suitable for inclusion with a corresponding reference parcel for a project/site under consideration, of coordinates (e.g. pertaining to a lot boundary), or of other such geographic data 440. Alternatively or additionally such parcel-specific data 406 may include one or more instances of owner names 451; of corresponding street or email addresses 453, of dates 455 (e.g. of a recorded retrieval, transmitted offer, or other recorded event as described herein), of explicitly selected or other apparent preferences 466, or of other such owner data 450. Alternatively or additionally such parcel-specific data 406 may include one or more instances of public or other third-party records 314.

Likewise such project site data 407 may include one or more instances of project site identifiers 471, of parcel or subscriber lists 473 for each respective project site, of (protocols for) seeding 475 that defines how seeding is/was done for a given species or specimen, of identifiers of processing protocols 476 (e.g. that define how speciation is/was done for a given species or specimen), of reference parcel identifiers, of associated parcel identifiers, or of other specimen-descriptive data 470 referenced herein. Alternatively or additionally such project site data 407 may include one or more instances of specimen-specific objective machine-learning-based scores 481, of determination dates 483 or similar evaluation data provenance, of scores reflecting subjective specimen compatibilities 484 (e.g. partly based on objective indicia and partly based on a preference profile of a potential buyer as described herein), of evaluation identifiers 486 that designate what each rank or other score herein signifies, of cycle counts 487 that designate how many recursions or other iterations of a protocol 476 were used in repeatably generating a given species 201A (of FIG. 2) from its corresponding seeding 475, of current ranks 488 of each species hold relative to other generated species 201 of the same type, or other such augmented evaluation data 480.

In some variants such operational data 405 may likewise include one or more instances of session or other user interaction dates 483 (e.g. signaling when an entity requested information); of preference profile (e.g. designating points or ranges of ideal project site size, estimated price, or profit margin in a given investor's project or campaign); of search, presentation duration, or other action histories by which such preference profiles may be derived; or of other such expressions of (apparent) preferences 466.

In some variants such operational data may likewise include one or more instances of historical or proposed prices; of option exercise or other fulfillment deadlines; of lists; of messages, of default values (e.g. a designated value as described herein initially set by the system but available to change); of estimated returns on investment or other figures of merit; of tracked module invocations (whereby a task described herein is performed by a remote instance of one or more of the above-described modules 331-338 as a response to a locally transmitted request); or of other acquisition data pertaining to a potential or actual parcel availability described herein.

As used herein a "parcel assemblage" is a (nominally) contiguous set of real property parcels not yet all commonly owned. Two parcels are "contiguous" if they share a property line or if their respective boundaries are sufficiently proximate that the two parcels are functionally adjacent. Two parcels can be "adjacent" across a public street only if they are suitable to be linked by a bridge, tunnel, or other artificial structure. As used herein an "instantaneous" response to a triggering event is one that is completed in less than one second after the triggering event. As used herein an operation is "deterministic" only if current temporal indicia and iteration-specific randomness do not affect its outcome. As used herein a protocol or other process is "deterministically repeatable" if seeding information, protocol identification, versions, and other operational data 405 is preserved (e.g. on a public blockchain 455) with sufficient fidelity and lasting accessibility that a mutation or other digital speciation thereof that was generated before may be perfectly and systematically re-created. A collection of geographic parcels are referred to as "geographically dispersed" herein if more than half of the parcels of the collection are each separated from all of the other parcels in the collection by more than 100 meters. As used herein a project site is "identified" by obtaining street addresses, boundary coordinates or other legal definitions 372 that provide shape and position information, alphanumeric parcel identifiers 448, or other such parcel-specific data 406 describing parcels thereof.

Terms like "feature-augmentation-type" refer herein not only to feature augmentation per se but also to other technologies in which seeding or speciation are used for gleaning viable and detailed recommendation data (e.g. scores 481, ranks 488, merit-based default values, or other "better" configurations initially presented in lieu of other available counterparts) derived from one or more profile tags or other heuristics. In light of teachings herein, for example, such seeding or speciation (or both) can be gleaned from a crowdsourced or other action history so as to augment the features of the identified species without any undue experimentation. See FIGS. 8-13.

FIG. 5 shows one or more data-handling media 504 in which a composite site 123 has been sufficiently expanded that a larger building model 202B has become feasible. An alleyway gap 509 is now spanned by the model 202B signifying (1) that one or more land use restrictions 517 have been encoded to allow the corresponding alley to be repurposed for such construction and (2) that the composite site suitability is optimized by such a species 201. To the degree that such encoding relies upon an unverified assumption that a local government might authorize such repurposing, a species 201 should include a suitable annotation to that effect.

FIG. 6 shows an overhead view of a vicinity 600 in region 111A depicting unrealized improvements to potential assemblage construction sites 123A-B (e.g. in augmented reality video, virtual reality video, or in still images 296). In site 123A, a single virtual building model 202B of a best-speciated virtual building spans multiple land parcels 160-164 as shown in FIG. 1 or 6. As shown another reference parcel 160C is shown that is of a "first" type 370, 670A. Depending upon which one or more definitions 372 are used for defining the first type 370, 670A, this may signify that parcel 160C is owned by a "first" entity 610A or that parcel 160C has another "first" defining attribute 617A (or both). Likewise in various examples one or more type definitions 372 (e.g. featuring an owner or broker entity 610B or other parcel attributes 617B) establish that several parcels including a "primary" parcel 162A and an "alternative" parcel 162B are of a "second" parcel type 370, 670B as shown).

If a user 10 has manifested a subtle interest in a "primary" parcel 162A, it is useful that a response module 336 is configured to discover and develop one or more "best alternative" parcels 162B that have a same associated entity 610B (e.g. as a manager or operator) or other same type 370, 670B with the "primary" parcel 162A. An alternative may be evaluated as "best" according to a current scoring protocol 476 (e.g. comprising an application of one or more suitable scoring functions in a prescribed sequence) assigned to or selected by the device user 10, for example. As used herein a user's interest in a parcel is "subtle" if it is determined from the parcel being included in a composite project site of interest without the user having actuated any control 225 that coincides with the parcel. Likewise a user's interest in a parcel is "very subtle" if it is gleaned merely from being of the same type 370, 670 as a parcel for which the user has a subtle interest. This can occur, for example, in a context in which a selection protocol 476I assigned to or selected by the device user 10 is configured to identify which candidate parcel 162 among several is "best" by prioritizing project sites 123 and species 201 according to evaluation data 480 signaling a closest similarity to that of a site 123 that includes the "primary" parcel 162A. This can occur, for example, in a context in which the user would otherwise feel ambivalent about approaching a currently-associated human entity 610B of the second-type parcels; in which the identity of the "primary" parcel 162A is a valuable trade secret that would be destroyed by revealing it to the current owner; and in which processing one or more images 296 each corresponding to an alternative (project site 123 that includes an alternative) second-type parcel 162B allows the potential buyer or seller (or both) to assess a suitability 519 of each alternative second-type parcel 162B for a successful transaction and real-world project authorization. In some contexts this may include using a currently preferred speciation protocol 476B to develop a model 202C that spans each alternative second-type parcel 162B with one or more other parcels 163B of the corresponding project site 123. See FIG. 27.

Figure 7:
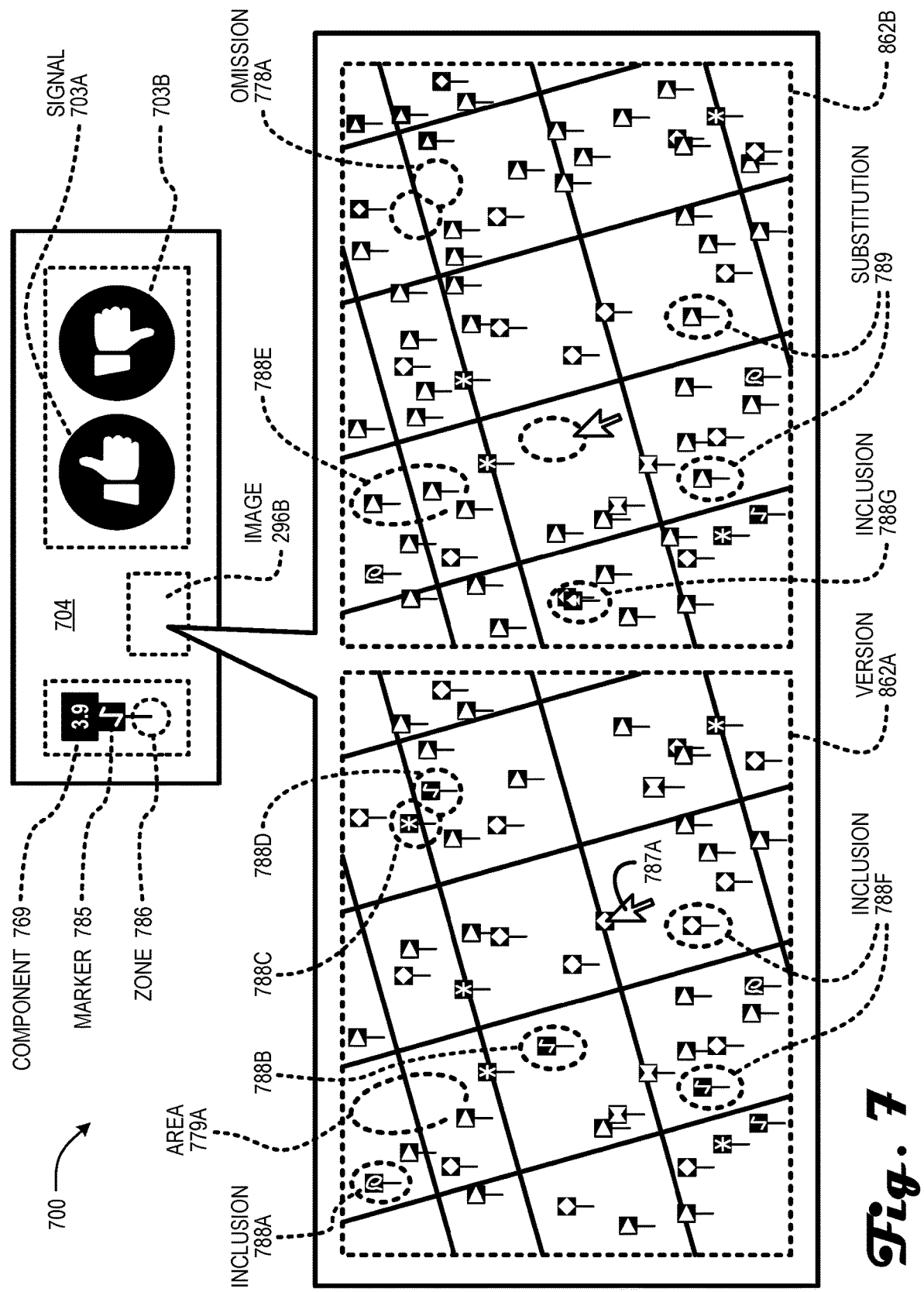
FIG. 7 illustrates a digital map progression in which one or more improved technologies may be incorporated.

FIG. 7 illustrates an image progression 700 of one or more data-handling media 704 in which one or more improved technologies may be incorporated. In depicting a region 111C (e.g. of the Greater Toronto area) an earlier version 862A of a map image 296B a Type "A" project site 121 is selected for inclusion 788A of a spiral-shape marker 785 that corresponds to (an instance of) a geographic zone 786 within region 111C.

In a later version 862B of the map image 296B the same site 121 is unchanged, still indicating the inclusion 788A. Earlier version 862A likewise depicts (an inclusion 788B of) a Type "B" project site 122A that is omitted from the later version 862B of the map image 296B, signaling that it has been disqualified from continued inclusion. Earlier version 862A likewise depicts (inclusion 788C-D of) Type "C" and "D" project sites 123 designated for omission 778A from the later version 862B of map image 296B. Later version 862B likewise depicts (an inclusion 788E of) some Type "E" project sites 121-123 that were absent from the earlier version 862B of the map image 296B, signaling that they have since been prioritized.

This may occur, for example, in a context in which one or more actions taken by a particular user 10 signal an apparent or other preference 466 not to view a large number of Type A-D project sites and in which a Type "C" and "D" project sites 123 may (in some variants) include a first-type or second-type parcel 161, 162 as described above. Such actions may include a favorable signal 703A with regard to one or more Type "E" project sites or an unfavorable signal 703B (e.g. actuating a "thumbs down" or "close" control 225) with regard to one or more other project sites. Favorable signals may include actuating a "zoom in" or "select" control 225 or hovering disproportionately over a favored marker 785 or zone 786 (e.g. relative to other markers 785, zones 786, or other such controls 225 incrementally actuated by hovering). Those skilled in the art will recognize other favorability-indicative or unfavorability-indicative actions, context-specific or otherwise, in light of teachings herein.

In some variants, moreover, such a speculative preference 466 may be acted upon by replacing one or more early inclusions 788F each with a corresponding substitution 789 and appropriate species reconfiguration and re-processing. This can occur, for example, in a context in which a user is (apparently) uninterested in a previously more prevalent project type and in which one or more project sites of interest are ripe for re-processing one or more attributes 617 of a project type that is now deemed favorable (e.g. Type "E"). Alternatively or additionally a concentration of higher-priority inclusions 788E mapped within an image 296 or other local region 111 may be enhanced by inserting such inclusions 788E in response to a favorable signal 703A (e.g. a pointer 787 hovering in a blank area 779A) or to high ranks 488 in newly found inclusions 788 in or near a mapped image 296B.

Alternatively or additionally, a broader inquiry about preference 466 may be implemented by causing an inclusion 788G of or substitution of an uncommon project type option as an automatic and conditional response to a determination that a new type has become available within a mapped region. This can occur, for example, in a context in which a user has navigated toward a sufficiently sparsely populated area (e.g. by requesting Postal Code M3C in Toronto) or in which one or more non-private developments by other users triggers an automatic development 900, 1400 of such a new type within or near a mapped region. See. FIG. 11.

Figure 8:
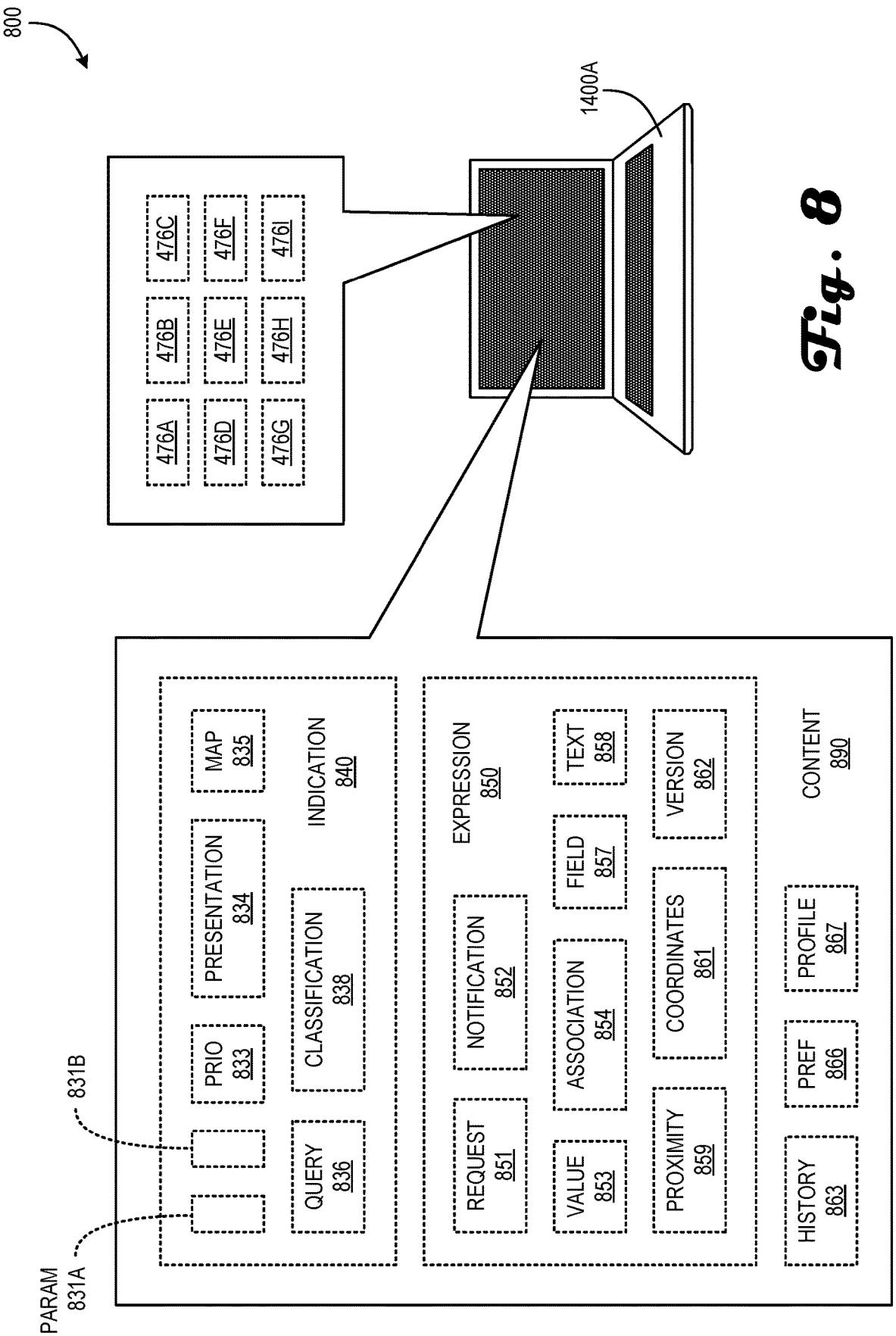
FIG. 8 depicts a system comprising a network-connected client device implementing various implementation protocols and other content in which one or more improved technologies may be incorporated.

FIG. 8 depicts a system 800 comprising a network-connected client device 1700A implementing various implementation protocols 476A-I and other digital content 890 in which one or more improved technologies may be incorporated. Such content 890 may include one or more instances of operating parameters 831A-B, of prioritizations 833, of presentations 834 (e.g. maps 835), of queries 836, of classifications 838, or of other such indications 840. Alternatively or additionally, such content 890 may include one or more instances of natural-language digital expressions 850, of histories 863, of preferences 866, or of profiles 867 (or combinations thereof). In some variants moreover expressions 850 may likewise include one or more instances of requests 851 or other notifications 852, of values 853, of associations 854, of editing or other parametric fields 857 that may comprise labels or other user text 858, of proximities 859, of coordinates 861, or of respective versions 862 thereof.

FIG. 9 depicts a high-level development 900 comprising an extraction 973, speciation 975, and rendering 976 according to a development protocol 476H and one or more operating parameters (e.g. seeding 475 or coordinates 861). During extraction 973 qualifying candidate sites 923A-D (e.g. ones that include a reference parcel 160D) are prioritized at a first stage 13 to form a best subset thereof at the second stage 14. Parcel-specific data 406A, site data 407A, one or more applicable types 670C, or other such content 990 for respective candidates may be used for prioritization of candidates. At least one prevailing site 923 is processed during speciation 975 to form a best subset of building models 202D-F or species at the third stage 15. At least one prevailing model/species is processed during rendering 976 to form one or more depictions 297C-D to form a presentable at least one best building model 202F in an inventory at stage 16.

FIG. 10 shows a geographic depiction 297E of several species 1021A, 1022A, 1023A, 1024A, 1025A, 1026A of unrealized (virtual) developments on a display or other non-transitory data handling medium 404, 504 like those described above. They are shown in relation to one or more (instances of mapped representations of) highways, bodies of water, (land tracts defined as) postal codes, or other such real-world features. This can occur, for example, in a context in which a project site-specific estimated total acquisition price, model-specific areal apportionments (e.g. simultaneously presenting respective square footages of two or more categories displayed with suitable labels for each), model-specific total development costs, expected return on investment, or other such quantifications 369 of particular merit are presented overlapping or otherwise adjacent a perspective rendering and in which an automatically generated and ranked alternative (project site 121-123 or) species 201, 1021-1026 encompassing a reference parcel 160 can be indexed through with a single user action that also triggers an update of the quantification(s) 369 to correspond with the shown species. In some variants, moreover, the duration of a presentation to a user 10 is used to update a preference profile 867 of the user, as further described below. A pointer 787A traces a path 1089 across several mostly-blank areas 33A-C, 34A-C that each correspond to a real-world area (e.g. a postal code, neighborhood, or other geographic region 111) potentially of particular interest to the user 10 moving the pointer 787A. Each movement, gaze, pause, or other machine-recognizable user action may signal user preference 466, 866 in light of teachings herein. See FIGS. 11-21. Hovering over (a marker 785 of) a species 1021-1026, for example, signals an interest in a modeled size quantification 369, map legend, or other single-site pop-up depiction (such as depictions 297C-D of FIG. 9) that becomes visible while hovering. A longer hover or examination signals more interest—e.g. using a threshold on the order of 20-80 milliseconds—as does zooming in on a nearby image center 31. Navigation actions like panning to an adjacent area 33, 34 may likewise be used, if such a threshold is exceeded, as an incremental favorable signal 703A of interest in whatever species 1021-1026 or areas 779 are presented during such action.

FIG. 11 shows a much more magnified map as a geographic depiction 297F that includes a new image center 31B consistent with a user having panned and zoomed or otherwise having triggered a navigation so as to depict some of the postal codes 33B-C and other features earlier viewed as the depiction 297E of FIG. 10. Most of the species 1021A, 1022A, 1023A, 1024A, 1025A, 1026A introduced in FIG. 10 "slid off" the map as a result of such navigation, with only a few species 1022B, 1024B, 1026B-C still shown "in situ" in both depictions 297E-F following the transition.

Depiction 297F also features several inchoate species 1027 comprising map-resident project sites of particular opportunity, such as where one or more component sites are already owned or readily acquired by an affiliate of the current device user. If the user hovers a pointer 1087 over or clicks on (a marker 785 of) an inchoate species 1027 a pop-up menu or similar control is presented by which the user is invited to confirm one or more type-indicative, size-indicative, or other default parameters 2047 by which an ensuing development 900, 1400 will proceed. Alternatively or additionally a development of such a preconfigured "next option" may be triggered programmatically as processing resources become available or otherwise as described herein.

Although panning or jumping or zooming to a depiction 297F having such a new image center 31B signals a geographic preference 466, 866 a significant amount of information may be added, removed, gleaned, and solicited in an intuitive manner Some variants feature a programmatic inclusion 788H partly based on a display having plenty of unused map space (e.g. having a net species density D below a threshold T that is on the order of 0.2 to 0.5 species per square centimeter on a display or projection surface) and partly based on a user having selected a species 1025 of the same type during the same session. Some variants feature a programmatic omission 778B of even an already-complete species from inventory based on a rarity of that type even with such a sparse map to avoid an expectation of such instances be processed and presented later in the session. To satisfy such an expectation, another approach is to supply a type-indicative directional marker 1185A—optionally with a distance-indicative scalar component—until and unless another suitable species 1021 of that same type falls within a user-selected region of interest. To satisfy a user's curiosity, an interface may be programmed to show the user a more detailed marker 1185B that includes a building shape or further operational controls, for example, in response to a pointer 1084 hovering over a smaller marker 785, 1185A so that a user understands immediately what the marker means. Likewise a type-indicative directional marker 1185C for an uncommon-type species that is about to appear within a user-selected region of interest may be supplied so as to allow the user to have an immediate and intuitive opportunity to learn about that uncommon project type 370 without having to undertake a detailed dialog or learning curve.

Figure 12:
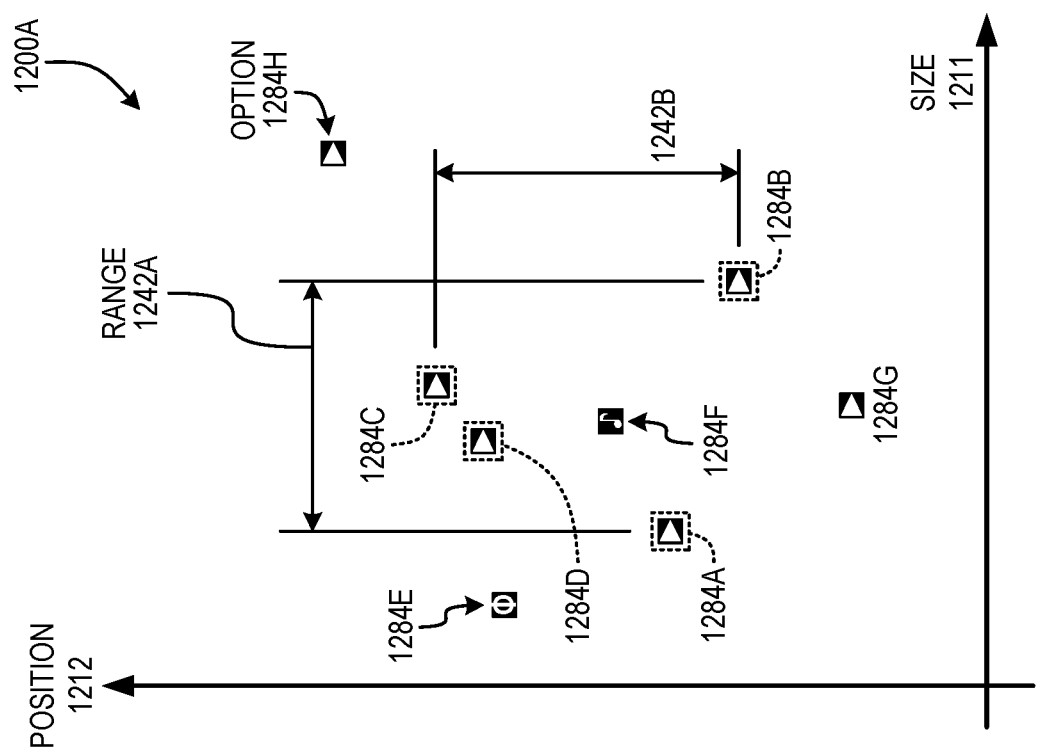
FIG. 12 depicts a plot of project site (candidate) positions against various types of potential project sizes in which one or more improved technologies may be incorporated.

FIG. 12 shows a plot 1200A depicting the exact project sizes 1211 and position 1211 of each of several project options 1284A-J of potential interest to a particular user during a user interaction session. As indicated with dashed squares, a distribution of user-favored project options 1284A-D and other project options 1284E-H are each plotted against their respective scalar sizes 1211 (e.g. as measured in square feet or other resources/objectives). This can result, for example, from a user clicking on various versions 862 of maps, lists, or other images that are of the same type 370 as denoted by respective markers 785 in a context in which such plots are helpful for a reader of this document but not needed for any user.

Figure 13:
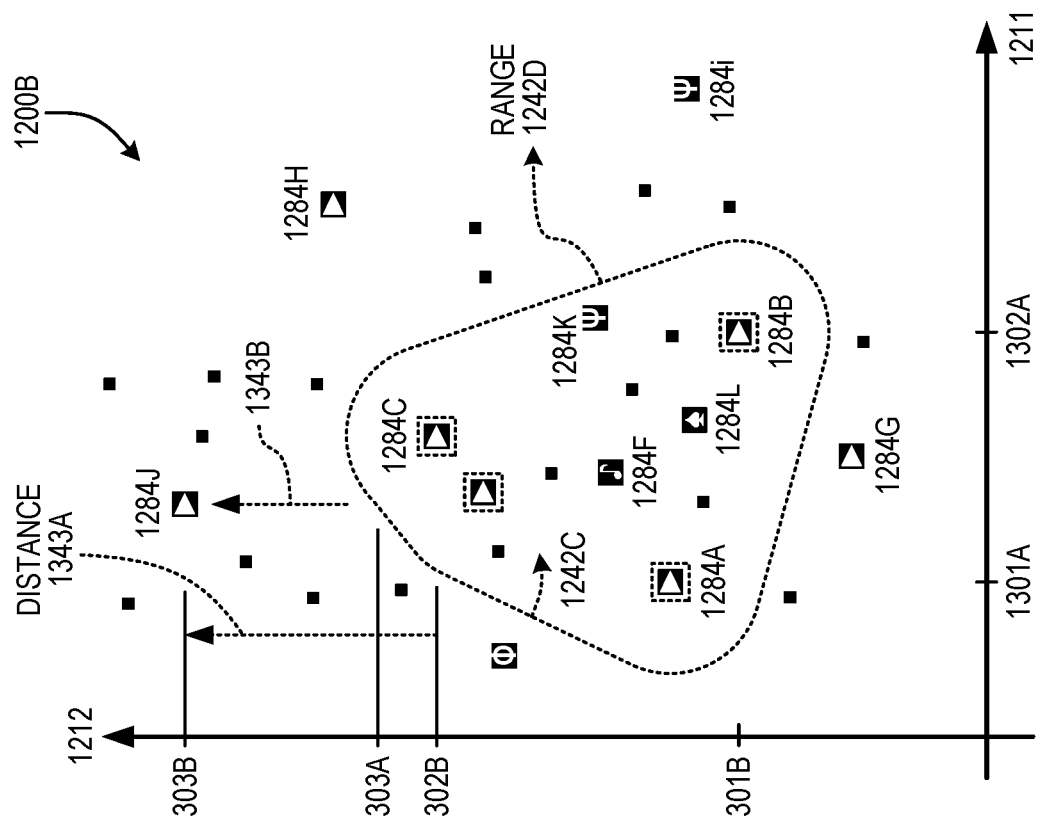
FIG. 13 depicts another plot of potential project site positions with additional ranges and options in which one or more improved technologies may be incorporated.

A rightmost column of site options are all portrayed with an iconic triangular marker 785, signifying that each is a developed species 1025 of the same project type 370 as other instances of species mapped in FIGS. 7 and 10-11 or plotted in FIGS. 12-13. As shown four of these species 1025 have been "favored" (such as by a user selectively opting to view a depiction or giving another favorable signal 703A thereof while viewing a map 835). Some of the options 1284E-F depict project types 370 (e.g. each signifying a less-common category of virtual building such as a museum or stadium) that are included on a map mainly to help a user understand the context. The other six options 1284A-D, 1284G-H are more common, but only four of the options 1284A-D are actually favored by the user so far. Those four options establish a size range 1242A and a positional range 1242B that say a lot about a user's latent preferences, but so do nearby-plotted options 1284G-H that a user has apparently seen but not favored. And so do within-range options that are (visible as being) of other types 370 and apparently seen but not favored by the user.

Such subtle indications of user preference are especially useful, for example, in a context in which significant learning and tedious expression would otherwise delay or prevent an actionable understanding sufficient to warrant development 900, 1400 tailored to such preferences. Technologies described herein may be used to glean latent and specific preferences, for example, relating to a latitude, longitude, distance from a shore or other border, or other geographical factors. See FIGS. 19-22. They may also be used to glean useful preferences pertaining to traffic, crime, population density, or other quasi-geographical factors by encoding project features into a scoring protocol 476D by which an artificial intelligence module (e.g. a neural network) may discern which next candidate options are most worth of development 900, 1400 in real time.

As used herein a direction may be called "forward" if it is apparently favored by a user or otherwise presumably pointing toward an advantage. In some variants a "forward" direction is determined, for example, by responding to a user's newly-favored species/project options changing (1) by establishing and testing hypotheses via testing a distribution change 1244 against 32+ compass directions, a larger project size 1211, a smaller project size 1211, and other options as hypotheses and (2) designating one or more (apparent) primary or secondary directions 2012 that seem likelier in light of the distribution change 1244.

In some variants a user's "favored" features are determined with hindsight or other nuance. In one protocol a first indexing modules 335 is configured to respond to one or more user actions 1594 identifying several options 1025 of a primary project type 370 by designating the primary project type 370 as "favored." A second indexing module 335 is invoked to determine systematically whether a secondary project type 370 is favored by triggering a development 900, 1400 of one or more other-types options 1021-1024 within one or more ranges 1242 associated with a distribution 1250 comprising the several options 1025 of the primary project type 370 and after causing a presentation 834 of at least one option (e.g. to identify species 1021-1022) of the one or more other-types options 1021-1024 of the other project types 370 modifying the presentation 834 so as to indicate that (apparently) a secondary project type 370 is currently preferred as a conditional response to at least one option is (apparently) also favored.

In some variants a forward change 1244 to an established range 1242 is tested for completeness by responding to (one or more user actions 1594 identifying) several options 1025 of a primary project type 370 by designating the primary project type 370 as "favored" and inviting an expansion of the range 1242 further forward by triggering a development 900, 1400 of one or more same-type options 1025 repeatedly so long as the more-forward options are favored repeatedly. This can occur, for example, in a context in which such an iterative migration jumps "forward" fast enough to cross a user's forward-most preference boundary so that further-forward options 1025 are presented vividly (e.g. with species in which presented depictions include building shapes) but not favored all in a single interaction session.

Alternatively or additionally a distribution of favored options 1025 may be systematically enriched by a scoring protocol 476D that favors an intermediate range 1242H within and spanning a midpoint of a primary range 1242 or largest interstitial range 1242F. This can occur, for example, in a context in which such an enrichment may diversify favored options so as to facilitate subsequent further exploration in other "forward" directions and in which a user might not otherwise feel that a session was "complete"

enough in revealing compatible options within a region, so that no offers or other actions of commitment seem appropriate until a later date.

Plot 1200A signals that no spade-shaped markers 785 are currently favored, for example, nor are any Z-mirrored offsets 1205C or species 1022 or any psi-shaped offsets 1205A or species. Plot 1200A also signals inchoate species 1027 that signal map-resident project sites of particular opportunity, such as where one or more component sites are already owned or readily acquired. If a user hovers a pointer 1084 over or clicks on (a marker 785 of) an inchoate species 1027 a pop-up menu or similar option is presented by which a user is invited to confirm one or more type-indicative, size-indicative, or other default parameters 1247 and thereby to trigger a development. Alternatively or additionally a development of such a preconfigured "next option" may be triggered programmatically as processing resources become available or otherwise as described herein.

FIG. 13 shows another plot 1200B that depicts several favored project site/species options 1284A-D of a single type 370 as well as other site/species options 1284E-H that are at least somewhat useful for gleaning one or more preliminary preferences 466, 866 unobtrusively. Like size range 1242A and position range 1242B of FIG. 12, a range 1242C fairly signaling similarity to options 1284A-D is suitable for use in determining scoring protocols 476D or otherwise implementing best "next steps" for identifying and presenting relevant additional options 1284*i*-K.

Perhaps a least relevant one of these is option 1284*i* at least insofar that (1) it seems unlikely to be of interest to someone who favors options 1284A-D and (2) even if it is favored it is not very apparent why. It could be an anomaly, for example, signaling user error or preference for a larger-size project or preference for a new and uncommon project type 370 that does not resemble that of species 1021-1026. This ambiguity could be resolved or at least reduce by a development 900 of one or more other options 1284K within or near one or more ranges 1242A-C that circumscribe already-favored options 1284A-D. But until such other-type outlying options 1284 are favored by a less-ambiguous user action it might be said that they add little insight into any user preferences 466, 866. Initially such options 1284*i* are of smaller diagnostic value.

The same cannot be said as to options 1284G, 1284J that offer a moderately different position 1212 or as to options 1284H that offer a moderately different size 1211 relative to (one or more ranges 1242A-C that fairly) signal similarity to favored options 1284A-D. Range 1242C is constructed by drawing circles that are each concentric with a corresponding favored option 1284A-D, including all points between or among those circles. But it will be understood that polygons or many other shapes that circumscribe a group of favored options will likewise fairly signal similarity to such favored options without any undue experimentation. In some variants, moreover, such a range 1242 may correspond with two or more areas that are not geographically contiguous.

As used herein an option 1284J is "significantly" larger than a favored range 1242 if an expansive separation therebetween is a distance 1343A-B more than 10% of a positional extent of the range 1242 or more than one standard deviation away from a mean of favored option points therein. As used herein an option 1284J is "moderately" larger than a favored range 1242 if such a separation therebetween is more than 50% and less than 200% of a positional extent of the range 1242 or is 2-5 standard deviations above a mean of favored option points therein.

As used herein an option 1284G is "significantly" smaller than a favored range 1242 if a reductive separation therebetween is a distance more than 10% below a lower positional extent of the range 1242 or more than one standard deviation below a mean of favored option points therein. As used herein an option 1284G is "moderately" smaller than a favored range 1242 if such a separation therebetween is more than 25% and less than 75% smaller than a positional extent of the range 1242 or is 2-5 standard deviations below a mean of favored option points therein.

As used herein an option 1284H is "significantly" different than a favored range 1242 if it is significantly larger or smaller. And as used herein an option 1284H is "moderately" different than a favored range 1242 if it is moderately larger or smaller. By whatever expression 850 a same-type option 1284 is presumptively most valuable if it is moderately different than a favored range 1242 that fairly signals similarity to other project options of the same type 370 and in a generally "forward" direction 2012 that is sparsely developed. And a new-type option is presumptively most valuable if it is (1) within or less-than-moderately different than a favored range 1242 or (2) selectively responsive to a development request that identifies a species type 370 into which an inchoate species 1027 or open area 779 should be developed. See FIGS. 9 and 14.

Figure 14:
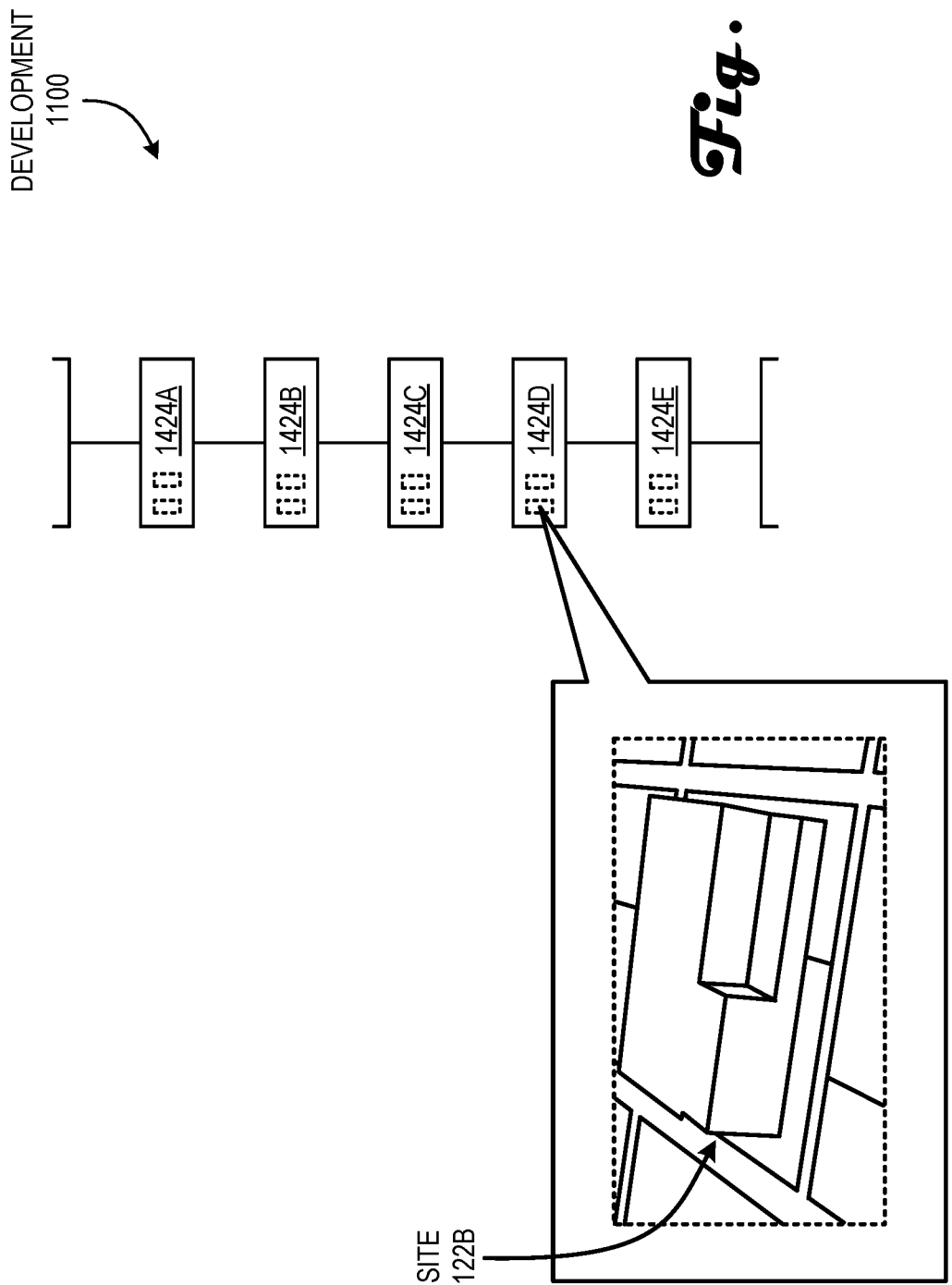
FIG. 14 depicts a digital object development in which one or more improved technologies may be incorporated.

FIG. 14 depicts a digital object development 1400 in which one or more improved technologies may be incorporated. Each iteration 1424A-E may signal an incremental step of extraction 973, speciation 975, or rendering 976 or components thereof according to any of various protocols 476A-I. In many contexts such iterations 1424 will include one or more depictions of a site 122B selected or otherwise configured such that one or more virtual structures shown on a site 122B have user-specific or cohort-specific suitability 519 that tends to improve over time using supervised or other machine learning technologies and the best available preference data as described herein.

Figure 15:
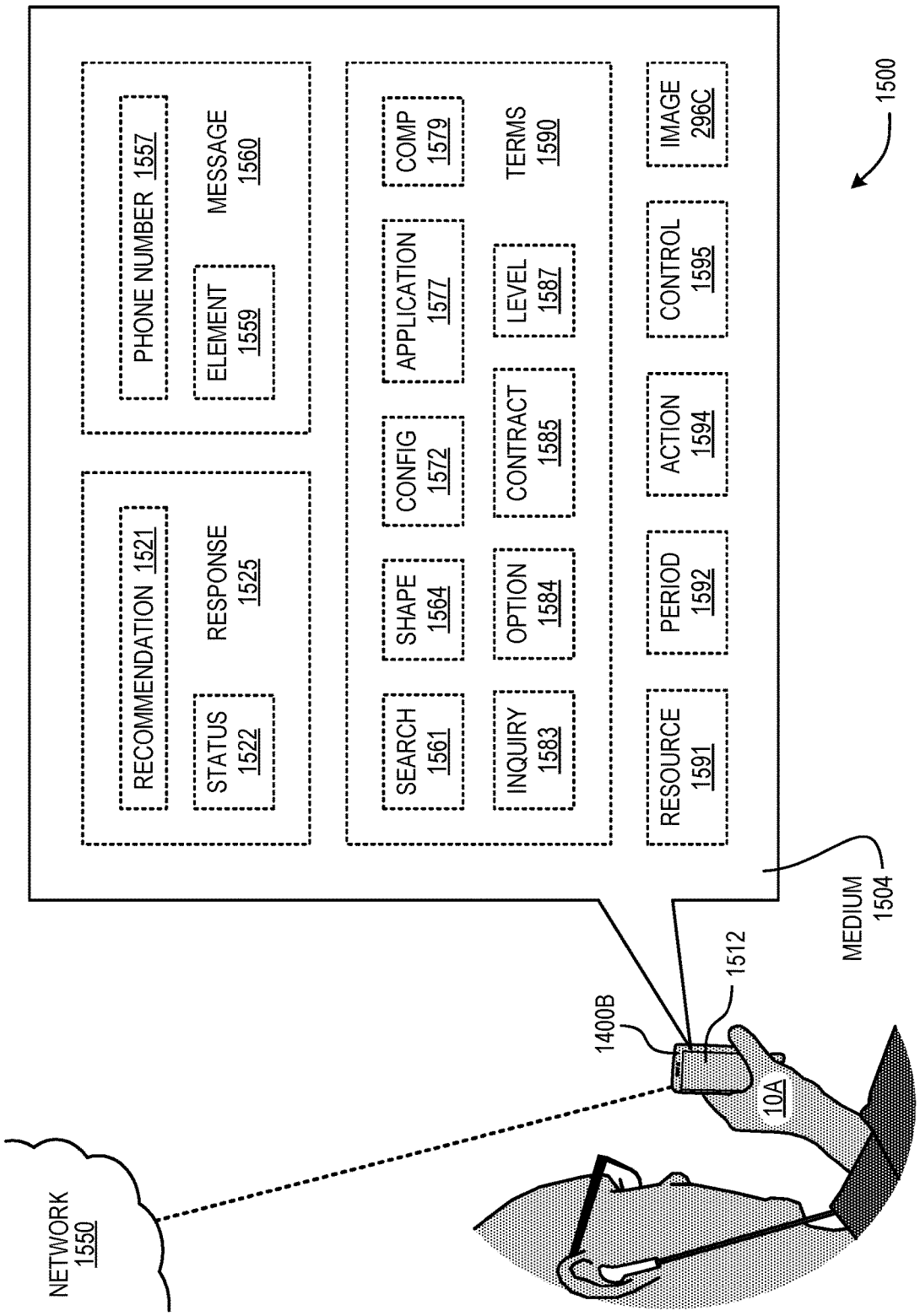
FIG. 15 depicts a user carrying a network-connected mobile device in which one or more improved technologies may be incorporated.

FIG. 15 shows a system 1500 in which a client device 1700B may interact with one or more networks 350, 1550 and may store, display, or implement computation protocols 476 upon one or more data-handling media 1504 (e.g. display screen 1512). Such media 1504 may handle one or more instances of recommendations 1521, of statuses 1522, or of other responses 1525; or of phone numbers 1557 or other elements 1559 related to various messages 1560. In some contexts such responses/messages may feature or otherwise implement one or more instances of searches 1561, of project site or building shapes 1564, or of various other configurations 1572 described herein; of applications 1577; of comparisons 1579 (e.g. by a recognition module or other learning module 337); of inquiries 1583; of options 1584; of contracts 1585; of levels 1587; or of other such terms 1590 described herein. Device 1700B may likewise include or otherwise access one or more instances of resources 1591 (e.g. records), of time periods 1592, of user actions 1594 (e.g. gestures or input), of controls 1595, or of graphical images 296C.

In some variants one or more special-purpose modules 331-338 are configured to facilitate adducing information about one or more preferences of a user 10 by a kind of crowdsourcing, optionally in response to an association 854 between the user 10 and (actions of) one or more other users 10. For example an interface module 331 may be configured to trigger one or more geographically mapped or other presentations 834 of a first project site prioritization 833 favoring first-type and second-type project options 1584 (see FIG. 10) over a third-type project option 1584 (e.g. corresponding to a less-favored species 1022, 1023) to a display screen 1512 of device 1700B. This can occur, for example, in a context in which a response module 336 is configured to express a second project site prioritization 833 automatically and conditionally favoring the third-type project option 1584 over the first-type and second-type project options 1584 to the display screen 1512 partly based on an explicit indication 840 (e.g. from a first indexing module 335) of a preference 866 of the user 10 of the client device 1700B for the third-type composite project option 1584 over the second-type project option 1584 (e.g. directly from the display screen 1512 having dismissed or otherwise disparaged the second-type composite project option 1584) and partly based on an implicit indication 840 of a preference 866 (e.g. from another indexing module 335) of the user 10 for the third-type composite project option 1584 over the first-type project option 1584 inferred from (at least) second and third device users 10 who have dismissed or otherwise disparaged the first-type composite project option 1584. In some variants, for example, such effective speculative preferential inferences can justify advanced extraction 973, speciation 975 or rendering 976 during a session or week of (a latest one of) the user actions 1594 and in which such development 1400 would otherwise either require prohibitively expensive and pervasive development 1400 to maintain or be pervasively obsolete (e.g. based upon stale operational data 405). See FIGS. 16 and 26. Alternatively or additionally such a presentation 834 may depict or otherwise correspond to one or more rendered images 296 virtually representative of a mapped area or other local content 890, 990 (e.g. depicting a geometric shape 1564 of other-type composite project options 1584).

FIG. 13 illustrates one or more data-handling media 1604 (e.g. a display presenting an image 296 or other memory/storage) containing an offer-descriptive message 1560 comprising a sender identifier 1626, a recipient identifier 1627, and a series of natural-language clauses 1677A-E. As shown clause 1677A includes a subject line that comprises a scalar expression 850 of parcel-specific premium price 2438 (e.g. "Want to sell for $195,000 today?").

Clause 1677B includes a background statement identifying (at least) a published information source (e.g. "tax records"), a street address or other parcel identifier, and a corresponding published valuation 380 (e.g. "According to Zillow, your property at 1923 Main Street is worth $176,475"). Clause 1677B also presents an offer-descriptive statement featuring a proposed payment amount 1645 identified by a natural-language description 1616 (e.g. "earnest money" or "option purchase price"), and a payment mode identifier 1617 (e.g. "wire transfer" or "cashier's check") intended to entice the owner (e.g. "We want to give you a $1000 down payment immediately, directly via Venmo today.")

Clause 1677C includes additional transaction terms 1590 including a proposed duration 1628 and a request 851 for a phone number 1557 or other routing element 1559 (e.g. as contact information) to facilitate the inchoate transaction (e.g. "It may take 18 months for us to decide whether to complete the purchase, but either way you keep the $1000. Does that sound fair? If so please reply with your phone number."). Clause 1677D includes additional transaction terms 1590 (e.g. "Please note that if you accept the $1000, you will have entered a legally binding contract. Also please note that another seller might accept this $1000 on a similar property if you don't reply quickly. This is a 'first come, first serve' opportunity."). Clause 1677E includes a reference to further transaction terms (e.g. "Detailed terms for this contract are provided below."). Following the salutation and signature, the prospective buying entity may self-identify with a place name 1667 local to the reference parcel or an area code 1668 local to the reference parcel.

In some variants multi-parcel development 900, 1400 are facilitated by invoking transistor-based circuitry (e.g. one or more instances of interface modules 331) configured to cause a depiction 297 of an augmented first species 201A of a first composite project site 123A that combines (at least) a first-type subject parcel 161A with a second-type primary parcel 162A and invoking transistor-based circuitry (e.g. one or more instances of authorization modules 334) configured to respond to a parcel-specific first user request 851 or other first user action 1594 specific to the second-type primary parcel 162A (e.g. clicking a "show owner" button or other such first action 1594 indicative of a desire to display such particular metadata). Such an authorization module 334 may, for example allow an indication 840 to be presented of one or more second-type parcels 162 that include a second-type alternative parcel 162B wherein responding to the first user request 851 in reference to the second-type primary parcel 162A comprises invoking transistor-based circuitry (e.g. one or more instances of speciation modules 333) configured to develop (at least) an augmented version 862 of a species 201B of the second composite project site 123B that combines a virtual building model 202C spanning (at least) a third-type associated parcel 163B owned by a third entity 610 with the second-type alternative parcel 162B owned by the second entity 610B. This can occur, for example, in a context in which the first-type, second-type, and third-type parcels are all mutually exclusive, in which one or more virtual building models 202 span two or more land parcels 160-164 of the second project site through very numerous iterations 1424 of refinement speciation 975 as a conditional response 1525 to a parcel- or site-selective second user action 1594, in which a potential buyer would otherwise be forced to indicate an identity of the second-type primary parcel 162A before approaching each potential seller of a desirable second-type primary parcel 162A, and in which a sheer number of permutations of and iterations 1424 upon composite project options 1584 for plausible suitability 519 would otherwise render such vetted outreach much too computationally burdensome or counterintuitive for a potential buyer. In some variants, for example, such effective vetting may be accomplished by a strategic real-time response 1525 to a user selection or to one or more implicit indications 840 of user preferences 866 (or both). See FIG. 27.

Figure 17:
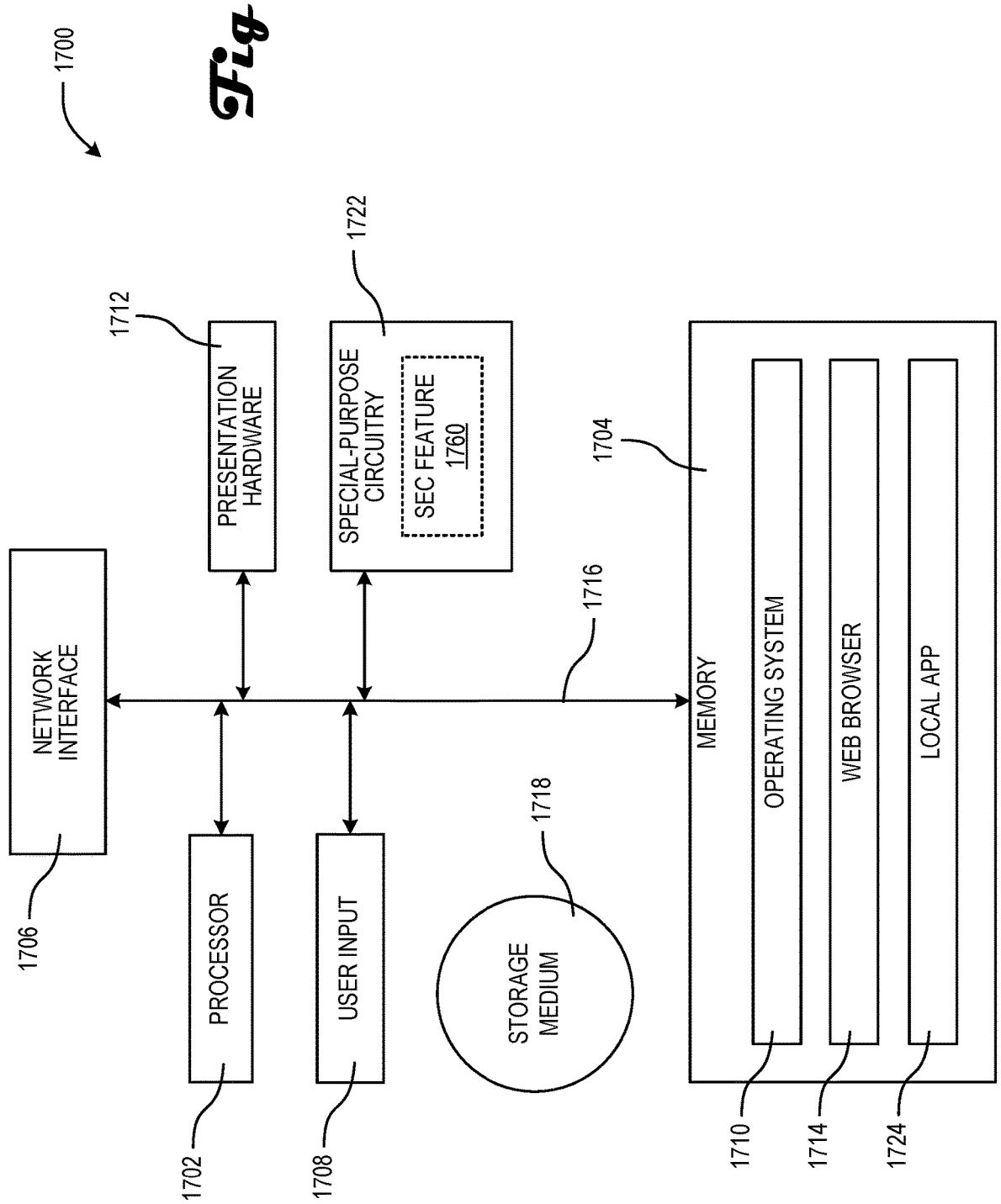
FIG. 17 depicts a client device in which one or more improved technologies may be incorporated.

Referring now to FIG. 17, there is shown a client device 1700 in which one or more technologies may be implemented. Device 1700 may include one or more instances of processors 1702, of memory 1704, of user inputs 1708, and of display screens 1712 all interconnected along with the network interface 1706 via a bus 1716. One or more network interfaces 1706 allow device 1700 to connect via the Internet or other networks to or within corporate or other human entities 610. Memory 1704 generally comprises a random access memory ("RAM"), a read only memory ("ROM"), and a permanent mass storage device, such as a disk drive.

Memory 1704 may contain one or more instances of operating systems 1710, web browsers 1714, and local apps 1724. These and other software components may be loaded from a non-transitory computer readable storage medium 1718 into memory 1704 of the client device 1700 using a drive mechanism (not shown) associated with a non-transitory computer readable storage medium 1718, such as a floppy disc, tape, DVD/CD-ROM drive, flash card, memory card, or the like. In some embodiments, software components may also be loaded via the network interface 1706, rather than via a computer readable storage medium 1718. Special-purpose circuitry 1722 may, in some variants, include some or all of the event-sequencing logic described herein as transistor-based circuitry 354 (e.g. in a peer-to-peer implementation) and one or more security features 1760 (e.g. a fob or similar security apparatus).

In some contexts security feature 1760 may implement or otherwise interact with a removable or other digital wallet (e.g. as security feature 1760). Such wallets may (optionally) each include one or more instances of private keys, of utility tokens, of crypto currency, of provenance data, or of device-executable code snippets (e.g. smart contracts) configured to perform one or more functions as described below. In some embodiments client device 1700 may include many more components than those shown in FIG. 17, but it is not necessary that all conventional components be shown in order to disclose an illustrative embodiment.

With regard to data distillation as described herein, the selective inclusion of suitable project sites and viable structures depicted thereon are described herein as an example of "pattern matching." In the context of artificial intelligence, pattern matching is a branch of machine learning in which token sequences are searched for occurrences of (data corresponding to) a pattern. In light of technologies described herein, advanced machine learning may allow one or more servers described herein to overcome a computational barrier that previously made effective pattern matching in regard to structures that could be built on a regional assortment of project sites computationally prohibitive. As described herein, various technologies allow artificial intelligence to generate, sift, and selectively present vetted hypothetical structures automatically. Terms like "pattern-matching-type" refer herein not only to pattern matching per se but also to prioritization and other technologies in which one or more sequences of tokens are searched for occurrences of suitable adjacent land parcels for assemblage analysis, ranking, or recommendation 1521 (e.g. in an image 296 presented to a display screen). In a virtual or augmented reality implementation, for example, such composite project sites and virtual structures thereon may come into view as a device 1700 approaches and enters a corresponding physical area 33, 34, 779.

Figure 18:
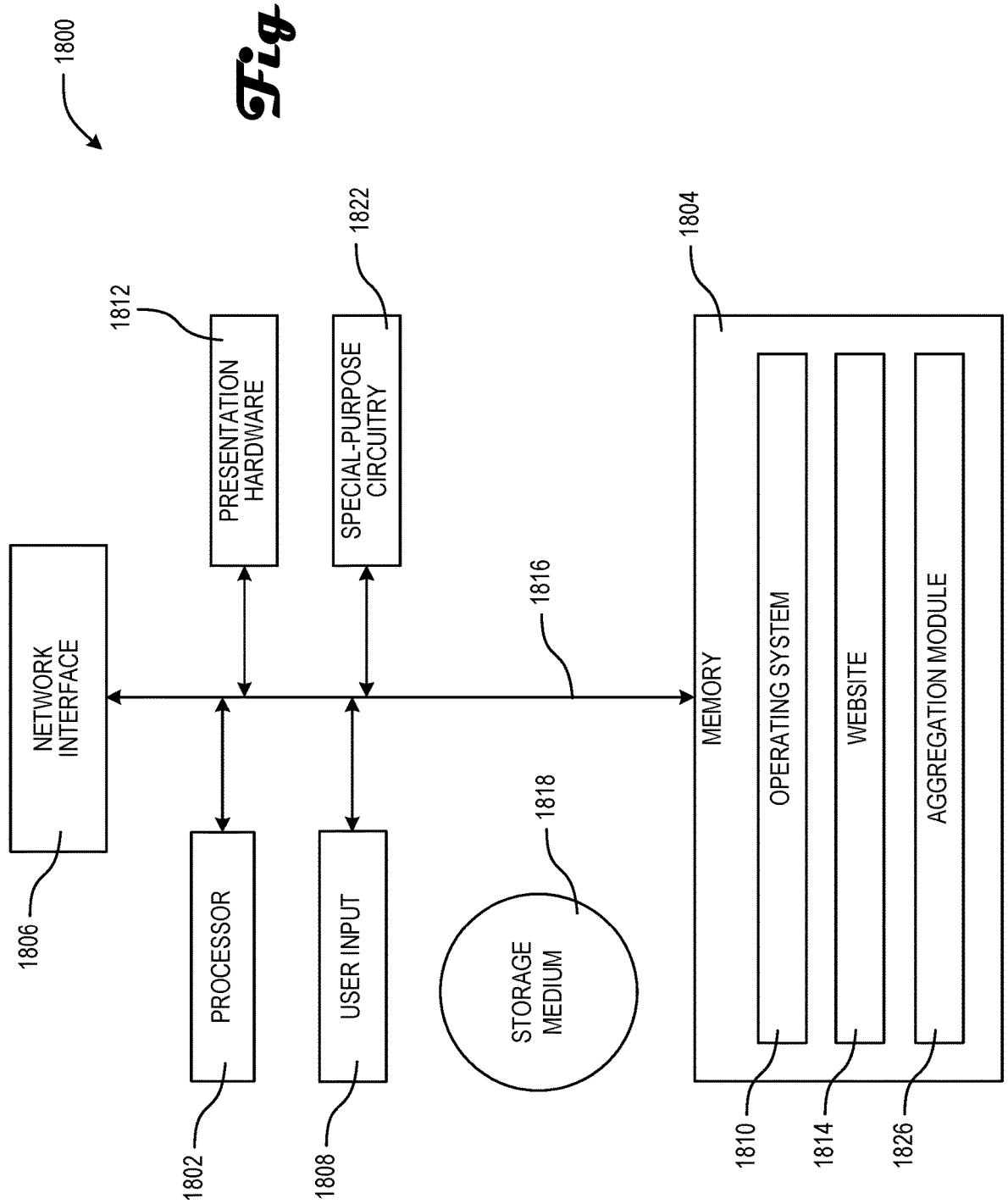
FIG. 18 depicts a server in which one or more improved technologies may be incorporated.
Figure 19:
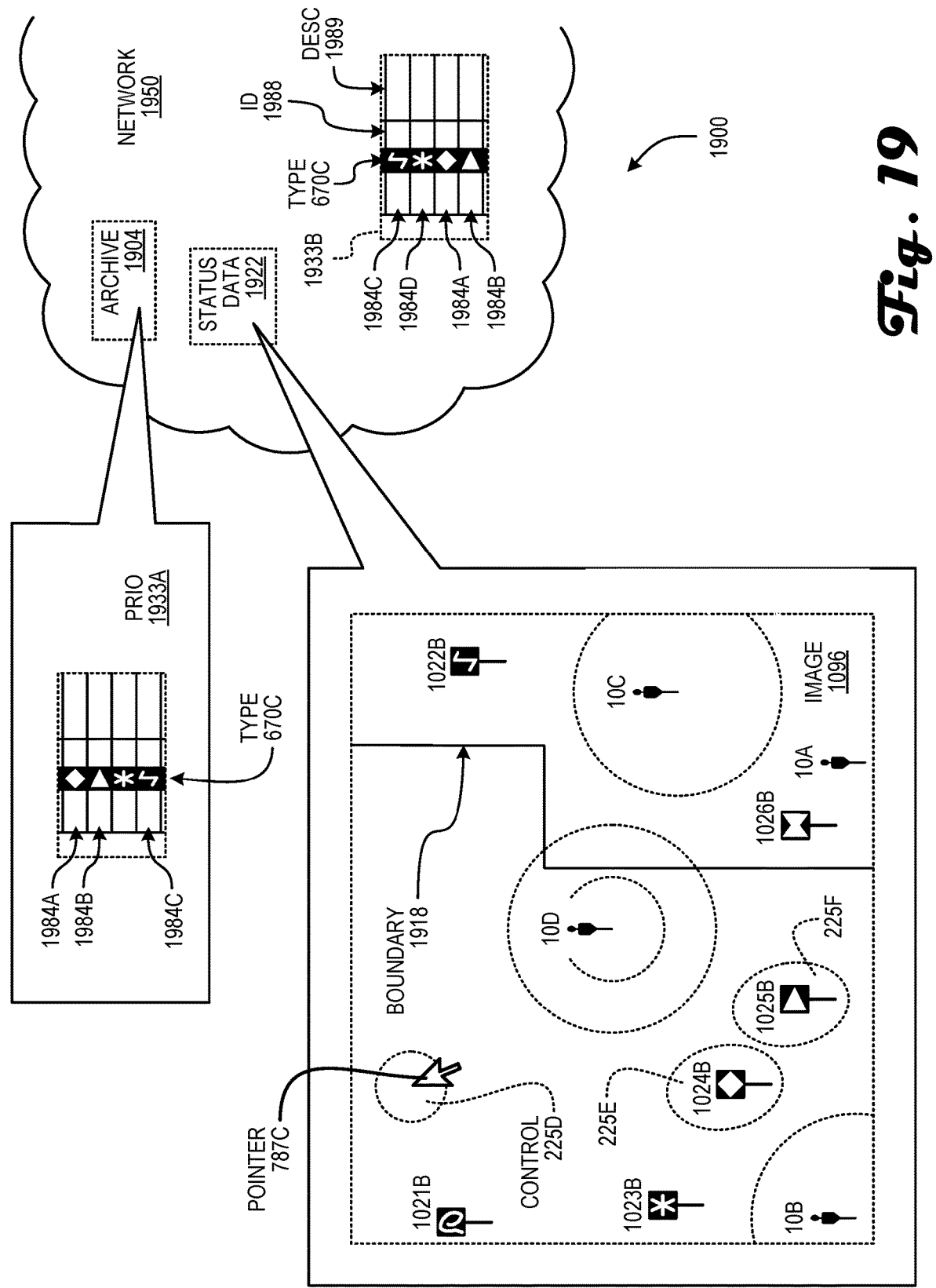
FIG. 19 depicts prioritizations and a map image in a network in which one or more improved technologies may be incorporated.

Referring now to FIG. 18, there is shown an exemplary server 1800 one or more of which may likewise be configured to perform functions as described below. Server 1800 may include one or more instances of processors 1802, of memory 1804, of user inputs 1808, and of display screens 1812 all interconnected along with the network interface 1806 via a bus 1816. One or more network interfaces 1806 allow server 1800 to connect via the Internet or other networks to or within entities as described below). Memory 1804 generally comprises a random access memory ("RAM"), a read only memory ("ROM"), and a permanent mass storage device, such as a disk drive.

Memory 1804 may contain one or more instances of operating systems 1810, hosted websites 1814, and aggregation modules 1826. These and other software components may be loaded from a non-transitory computer readable storage medium 1818 into memory 1804 of the server 1800 using a drive mechanism (not shown) associated with a non-transitory computer readable storage medium 1818, such as a floppy disc, tape, DVD/CD-ROM drive, flash card, memory card, or the like. In some embodiments, software components may also be loaded via the network interface 1806, rather than via a computer readable storage medium 1818. Special-purpose circuitry 1822 may, in some variants, include some or all of the event-sequencing logic described with reference to FIG. 3 (e.g. in a peer-to-peer implementation) and one or more security features (e.g. a firewall), not shown. In some embodiments server 1800 may include many more components than those shown in FIG. 18, but it is not necessary that all conventional components be shown in order to disclose an illustrative embodiment.

Figure 16:
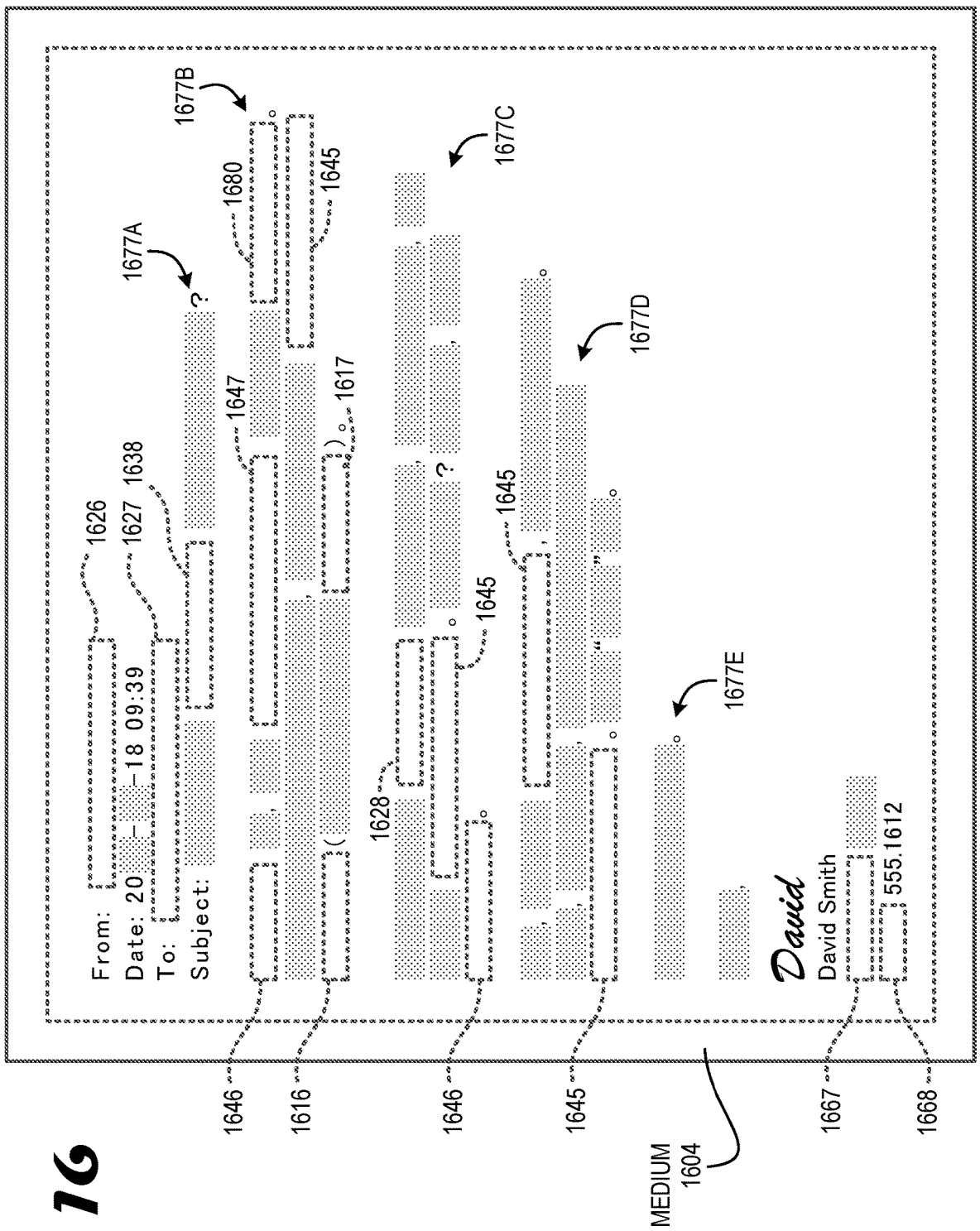
FIG. 16 depicts an offer-descriptive message generated according to one or more improved technologies.

Referring now to FIG. 16, there is shown an exemplary network 1950 that may implement or be connected with one or more other devices 1700, servers 1800, or networks 350, 1550 configured to perform functions as described herein. A mapped image 1096 of current status data 1922 is also shown featuring current positions of various users 10A-D in a cohort exploring a corresponding geographic region. Various types 670C of developed species 1021B, 1022B, 1023B, 1024B, 1025B, 1026B within that region are also shown in relation to streets, bodies of water, or other land features (e.g. boundaries 1918). In some contexts one or more controls 225D accessible via pointer 787B may signify an open area 779 that a user 10D may select, for example, to signal a requested development 900 of one or more sites there. Likewise one or more controls 225E-F may respectively signify one or more developed sites of respective species 1024, 1025 that a user 10D may select, for example, to see a complete set of parcel or model identifiers 1988, shape depictions, or other components of a description 1989. Alternatively or additionally such controls 225E-F may signal disparagement or trigger a modified development 900 thereof.

Also an archived (earlier) prioritization 1933A is shown in which a higher-ranked option 1984A was associated with a type of species 1024A-B then (apparently) preferred over one or more other options 1984B associated with a once-less-preferred type of species 1025A-B signaling, for example, that self-storage projects were once deemed preferable over other land use options. Likewise prioritization 1933A indicates that a moderately-ranked option 1984B is associated with an earlier type of species 1025A-B apparently preferred over one or more other options 1984C associated with a then-less-preferred type of species 1022A-B signaling, for example, that a site partly owned by a known or reasonable entity 610A was deemed preferable over a site partly owned by an unknown or unreasonable entity 610B. In this way a ranking of one or more options 1984A-C may depend upon a quantification 369 (e.g. comprising a count or reputation score) of one or more entities 610 corresponding to a site 923.

A later prioritization 1933B is likewise shown in which some options 1984A-B have become less preferable relative to one or more other options 1984C-D. This can occur, for example, in a context in which an evaluation protocol 476A has been applied to one or more of the options 1984A-D; in which one or more quantification 369 or types 370, 670 in (a description 1989 of) one or more of the options 1984A-D has been adjusted and they have been re-ranked accordingly; and in which such updated prioritizations 1933 are presented to the user in a ranked list 473. Alternatively or additionally such updated prioritizations 1933B may be indicated implicitly, such as by higher-ranked options 1984C-D being presented in (a mapped image 1096 or other) status data 1922 that features a removal/omission 778 of another option 1984A-B that was previously shown. Such changed prioritizations 1933B may be tailored to a particular user 10D in some variants, ranking species 1021-1026 (at least partly) based on a present-moment real-world distance from a mobile device 1700 of the target user 10D to each ranked site thereof or based on same-session user actions 1594 in which a pointer 787A-C controlled by that user 10D hovers over or near a marker 785 of each ranked species (or both). In some variants such a scoring protocol 476D (e.g. one that assigns different incremental ranking points for different kinds of interactions) can be particularly useful before a user 10D has given any explicit indications 840 that a given project species, site, or type is favored. A prioritization 833, 1933 for a new guest user 10D, for example, may include a scoring protocol 476D that places a positive incremental value 853 on a defined user action 1594 at a zone 786, site-specific label, or other component of a map-resident first marker 785, 1185. Alternatively or additionally such a scoring protocol may place a larger incremental value 853 (e.g. 3 points) upon a later action 1594 at a first marker than (that placed) on an earlier action 1594 (e.g. 0-1 points) at said first marker 785, 1185.

FIG. 20 shows a plot 1200C in which several sets of project options 1284, 1584, 1984 of potential interest to a user are each represented in a column. A scalar expression of each site's proximity to an ideal (e.g. as a point relative to a lakeshore or user's "perfect" project size) signals a corresponding respective offset 2005A-H (e.g. aligned with a forward direction). As indicated with dashed squares, a distribution 2050 of user-selected or otherwise favored project options 1025 and their respective offsets 2005E are shown. This can result, for example, from a user clicking on various versions 862 of maps, lists, or other images that are of the same type 370 as denoted by respective markers 785 in a context in which the distribution 2050 is also associated with one or more instances of changes 2044 from a prior version in a progression of distributions 2050; of means 2045, variances, or other terms of statistical characterization; of project types 370, compatibilities 484, geographic regions, or other project attributes by which options/species are grouped; or of other parameters 2047 by which such distributions 2050 are generated or evaluated.

A rightmost column of site options are all portrayed with an iconic triangle-type marker 785, signifying that each is a developed species 1025 of the same project type 370 as other instances of species mapped in FIGS. 7 and 10-11 or plotted in FIGS. 12-13. As shown by dashed squares three of these species 1025 have been "favored" (such as by a user giving a favorable signal 703A thereof while viewing a map) and one has not. (Although these favored species 1025 are respectively indicated in FIG. 20 at a plot-resident minimum 1301C, maximum 1302C, and offset 2005E such favor will more often be ascertained via user actions 1594 across or near one or more species 1025 presented on a map 835 or options 1984B shown in a list 473 instead.) A range 1242E of size, positional, or other project-specific offsets 2005 of scalar values 853 is accordingly said to "span" the favored species 1025, the range including a minimum 1301C and a maximum 1302C as shown. This can occur, for example, in a context in which the user has not overtly selected any such favored type 370, size 1211, or other self-descriptive preference parameter 2047 during a current access session except by interacting with the several favored species as shown but in which (at least a distribution 2050 of) a user's latently-preferred direction 2012 has been inferred by such interaction; in which the user has had a long-enough opportunity (e.g. exceeding a threshold within an order of magnitude of 1-2 minutes) to view the unfavored same-type species 1025 plotted on the same map 835 as the others; in which an extension range 1242G spans a basic range minimum 1301C to a closest unfavored offset 2005H; in which a range 1242E that includes the several favored species is extended toward the unfavored offset 2005H so as to include some or all of extension range 1242; in which the resulting larger-than-basic range is thereafter used as a parameter 2047 in a scoring protocol 476D described herein; and in which at least a closest unfavored species 1025 thereby augments the distribution 2050 of favored species 1025.

In some variants a "forward" direction is determined, for example, by responding to a user's newly-favored species/project options changing (1) by establishing and testing hypotheses via testing a distribution change 2044 against 32+ compass directions, a larger project size 1211, a smaller project size 1211, and other options as hypotheses and (2) designating one or more (apparent) primary or secondary directions 2012 that seem likelier in light of the newly-favored species/project options.

In some variants a user's "favored" features are determined with hindsight or other nuance. In one protocol a first indexing modules 335 is configured to respond to one or more user actions 1594 identifying several options 1025 of a primary project type 370 by designating the primary project type 370 as "favored." A second indexing module 335 is invoked to determine systematically whether a secondary project type 370 is favored by triggering a development 900, 1400 of one or more other-types options 1021-1024 within one or more ranges 1242 associated with a distribution 1250 comprising the several options 1025 of the primary project type 370 and after causing a presentation 834 of at least one option (e.g. associated with species 1021-1022) of the one or more other-types options (e.g. associated with species 1021-1024) of the other project types 370 modifying the presentation 834 so as to indicate that (apparently) a secondary project type 370 is currently preferred as a conditional response to at least one option 1021-1022 (apparently) also being favored.

In some variants a forward change 2044 to an established range 1242 is tested for completeness by responding to (one or more user actions 1594 identifying) several options 1025 of a primary project type 370 by designating the primary project type 370 as "favored" and inviting an expansion of the range 1242 further forward by triggering a development 900, 1400 of one or more same-type options 1025 repeatedly so long as the more-forward options are favored repeatedly. This can occur, for example, in a context in which such an iterative migration jumps "forward" fast enough to cross a user's forward-most preference boundary so that further-forward options 1025 are presented vividly (i.e. with species in which presented depictions include building shapes) but not favored all in a single interaction session and in which discovering a device user's unconscious preference for a more forward project site would otherwise entail a non-intuitive and more intrusive expenditure of session time and other computing resources and thereby prevent many great multi-parcel development opportunities from ever being examined.

Alternatively or additionally a distribution of favored options 1025 may be systematically enriched by a scoring protocol 476D that favors an intermediate range 1242H within and spanning a midpoint of a primary range 1242 or largest interstitial range 1242F. This can occur, for example, in a context in which such an enrichment may diversify favored options so as to facilitate subsequent further exploration in other "forward" directions and in which a user might not otherwise feel that a session was "complete" enough in revealing compatible options within a region, so that no offers or other actions of commitment seem appropriate until a later date.

Plot 1200C signals that no spade-shaped markers 785 are currently favored, for example, nor are any Z-mirrored offsets 2005C or species 1022 or any psi-shaped offsets 2005A or species. Plot 1200C also signals inchoate species 1027 that signal map-resident project sites of particular opportunity, such as where one or more component sites are already owned or readily acquired. If a user hovers a pointer 1084 over or otherwise interacts with (a map-resident marker 785 of) an inchoate species 1027 a pop-up menu or similar option is presented by which a user is invited to confirm one or more type-indicative, size-indicative, or other default parameters 2047 and thereby to trigger a development. Alternatively or additionally a development of such a preconfigured "next option" may be triggered programmatically as processing resources become available or otherwise as described herein.

In some variants a machine learning method (see FIGS. 21-27 as described below) accelerates, guides, or otherwise facilitates computer-implemented development 900, 1400. A device operated by a user 10A is allowed to receive a first graphical presentation 834 of a first plurality of primary project options 1284, 1584, 1984. They are indicated on a first map 835 and at least some are directly or otherwise favorably designated by (one or more actions 1594 of) the user 10A. A position 1212 of a first (actually, currently, or otherwise) favored option 1284A of the primary project options is more forward in some humanly explainable direction 2012 than a position of a second option 1284B (e.g. at minimum 1301B) of the primary project options and so that a position of a third option 1284C (e.g. at maximum 1302B) of the primary project options is more forward than the position of the first option 1284A.

Certain user actions 1594 signal a user's stronger interest in more forward positions such as a favorable indication 840 in regard to a forward-most primary project option 1284B, a less-than-favorable indication 840 (e.g. a demotion in or removal from a "favorites" list 473) in regard to a rearward-most primary project option 1284C, a pointer movement path 1089 in a user-favored direction 2012, or a navigation in a forward direction 2012. One or more such user actions 1594 in a direction 2012 toward an area that has no same-type or other suitable primary project options triggers, in some variants, indexing and response modules 335, 336 to implement a real-time development 900, 1400 in which a scoring protocol 476D is optimized at a position 1303B further forward than a range 1242B-C that includes at least the first and third options 1284A, 1284C.

Those skilled in the art will recognize what user actions 1594 signal favor and can generally agree upon a convenient polygon, ellipse, or other range shape 1564 flows from the currently favored options to exclude severely divergent options 1284 selectively. As a conditional response 1525 to one or more user actions 1594 that signal a forward net change 2044 from a "before" distribution 2050 to an "after" distribution 2050 of favored options, the indexing module 335 selects adapts a scoring protocol 476D to be optimized at a position 1303B moderately further forward than the "before" range 1242. In some contexts the new position is offset further forward by a distance by a distance 1343 that is substantially proportional to (i.e. within a factor of 2) or at least within an order of magnitude of the forward net change 2044. This can occur, for example, in a context in which the forward net change 2044 is computed as a difference between the respective means 2045 of or mid-points of the before and after distributions 2050, in which the type 370 of the species 1025 developed at the new position may be the same as that of the favored primary project options 1284, and in which the method would otherwise need an unwieldy questionnaire or other slow interaction to glean a user's preferences so that vast numbers of iterations 1424 are not wasted on developing irrelevant or other unwise new project options 1284.

In some variants a second instance of indexing and response modules 335, 336 is configured to evaluate candidate positions using a scoring protocol 476D that is optimized further forward than a range 1242 that includes favored primary project options 1284. This can occur, for example, in a context in which the new species 1023B is of a second type 370 that is included in a new area 779B to alleviate a situation in which the user's actions 1594 (e.g. of navigations from map/depiction 297E to map/depiction 297F) would otherwise cause a disappearance of (a last species 1023A of) that second type 370 or in which the user's action(s) 1594 would otherwise necessitate one or more direction-indicative markers 1185A-C pointing toward an off-map species 1023A to avoid such a disappearance (or both). In the context of FIG. 11, for example, the inclusion 1023B of a new species 1023B as a real-time response 1594 to a user's zoom-in action to a depiction 297F that avoids any need to include a type-indicative directional marker 1185 pointing to an off-map species 1023A marked as the second type (e.g. with an asterisk) previously presented to the user 10A. The second instance ensures this outcome insofar that the new development option of the second-type species 1023B is partly based on navigating away from the previously-shown species 1023A and partly based on no other developed second-type species 1023 being suitable for inclusion within the corners of the new map/depiction 297F as detected by the response module(s) 335.

FIG. 21 illustrates an operational flow 2100 suitable for use with at least one embodiment, such as may be performed (in some variants) on one or more servers 1800 or using special-purpose circuitry 1722, 1822. As will be recognized by those having ordinary skill in the art, not all events of information management are illustrated in FIG. 21. Rather, for clarity, only those steps reasonably relevant to describing the distributed ledger interaction aspects of flow 2100 are shown and described. Those having ordinary skill in the art will also recognize the present embodiment is merely one exemplary embodiment and that variations on the present embodiment may be made without departing from the scope of the broader inventive concept set forth in the clauses and claims below.

Following a start operation, operation 2110 describes obtaining one or more user profiles (e.g. one or more interface modules 331 obtaining one or more user profiles). This can occur, for example, in a context in which such descriptions are provided in an account creation protocol. See FIG. 25.

Operation 2120 describes obtaining a map region of interest as a selection, default, zoom, or navigation (e.g. one or more response modules 336 obtaining a map region of interest as a selection, default, zoom, or navigation).

Operation 2130 describes obtaining a marker density between a lower boundary related to local species inventory and an upper boundary related to display size (e.g. one or more indexing modules 335 obtaining an ideal number or range of each type 370 of project that should be shown given how many suitable within-map species are available, what types are most popular among a cohort of users including the current user, what the priorities 833 are of the available options that are ready to show within the user-designated geographic range, and other such determinants). This can occur, for example, in a context in which a neural network makes such determinations over time using a scoring protocol 476D partly based on a user continuing the session or partly based on such users initiating an offer during the session.

Operation 2140 describes extending beyond a favored range of position or project size for one or more favored project types (e.g. a first control module 332 determining that one or more ranges 1242 of position 1212 or project size 1211 are inadequately circumscribed for a most-favored project type 370). This can occur, for example, in a context in which a user has made large recent strides to indicate a preference for seeing larger projects further to the west than have been shown and in which there is no convenient way for a user to inform the system that progress along these lines is taking too long.

Operation 2150 describes extending project type diversity within one or more favored ranges (e.g. a second control module 332 restoring or expanding a diversity of types that was earlier presented to the user in the same session within one or more favored ranges 1242 by triggering development 900, 1400 of an inchoate species 1027 or by sifting other suitable sites that may prove attractive within the one or more ranges 1242). This can occur, for example, in a context in which a single unfavored species of each type 370 suffices to demonstrate the user's disinterest in those types because those single unfavored species 1024 were each plottable amongst several favored species 1025 and in which such sufficiency could not otherwise be established at a desired level of magnification without markers 785 making other markers 785 illegible.

FIG. 22 illustrates an operational flow 2200 suitable for use with at least one embodiment, such as may be performed (in some variants) on one or more servers 1800 or using special-purpose circuitry 1722, 1822. As will be recognized by those having ordinary skill in the art, not all events of information management are illustrated in FIG. 22. Rather, for clarity, only those steps reasonably relevant to describing the distributed ledger interaction aspects of flow 2200 are shown and described. Those having ordinary skill in the art will also recognize the present embodiment is merely one exemplary embodiment and that variations on the present embodiment may be made without departing from the scope of the broader inventive concept set forth in the clauses and claims below.

Operation 2215 describes obtaining an identification of first and second composite project sites both containing a reference parcel, wherein the first assemblage includes a first parcel adjacent the reference parcel in combination with the reference parcel, wherein the second assemblage includes a second parcel adjacent the reference parcel in combination with the reference parcel, and wherein a reference recordation signals that the reference parcel is not commonly owned with the first or second parcels (e.g. one or more interface modules 331 receiving or generating an identification of component parcels in respective first and second project sites 121, 122 both containing a reference parcel 160, wherein the first project site 121 includes a first parcel 161 adjacent the reference parcel 160 in combination with the reference parcel 160, wherein the second project site 122 includes a second parcel 162 adjacent the reference parcel 160 in combination with the reference parcel 160, and wherein one or more public records 314 signal that the reference parcel 160 is not commonly owned with the first parcel 161 or with the second parcel 162). This can occur, for example, in a context in which each interface module 331 manifests parcel identifiers 448A-B, boundary coordinates 861, and other such information about the parcels as respective (instances of) voltage configurations 351 thereof.

Operation 2230 describes recursively or otherwise obtaining first and second building models of the first assemblage each based on a respective application of first and second deterministically repeatable speciation protocols to a first multi-parcel-site-specific seeding configuration associated with the first assemblage (e.g. an instance of a speciation module 333 obtaining first and second deterministically identified instances of species 201 including one or more simulated building models 202 depicted upon the first project site 121 wherein each such species 201 is based on a respective application 1577 of at least first and second speciation protocols 476B to a first multi-parcel-site-specific seeding configuration associated with the first project site 121). This can occur, for example, in a context in which the first speciation protocol 476B comprises a single-shelter algorithm like that of Table 3 herein; in which the second (instance of a) speciation protocol 476B comprises a multi-building model algorithm like that of Table 4 herein; and in which seeding 475 for such algorithms comprises a street address or other parcel identifier 448A, coordinates 861, or other repeatable designation of the reference parcel 160 together with a repeatable designation of other parcels of the first project site 121 as respective voltage configurations 353.

Operation 2240 describes recursively obtaining first and second building models of the second assemblage each based on a respective application of first and second deterministically repeatable speciation protocols to a first multi-parcel-site-specific seeding configuration associated with the second project site (e.g. a second instance of a speciation module 333 obtaining first and second deterministic instances of species 201 including one or more simulated building models 202 depicted at least partly upon the second project site 122, wherein each such species 201 is based on an application 1577 of respective speciation protocols 476B to a multi-parcel-site-specific seeding 475 associated with the second project site 122). This can occur, for example, in a context in which the "first" speciation protocol 476B is a multi-building model algorithm like that of Table 4 herein; in which the "second" speciation protocol 476B is a single-shelter algorithm like that of Table 3 herein; and in which seeding 475 for such algorithms comprises a reference parcel identifier 448A or other repeatable designation of the reference parcel 160 together with a repeatable designation of other parcels of the second project site 122 as respective voltage configurations 353.

Operation 2250 describes causing the first building model of the first assemblage to be prioritized over the second building model of the first assemblage and to be presented to a user of a visual display in lieu of the second building model based on a machine-learning-based scoring protocol (e.g. a first instance of an authorization module 334 causing a first species 201 of the first project site 121 to be ranked above a second instance of an alternative species of the first project site 121 and to be presented to device user 10C using one or more display screens 1712 in lieu of the alternative species based on a machine-learning-based score 481, rank 488, or other evaluation). This can occur, for example, in a context in which such evaluation data 480 comprises explicit preferences 866 from the device user 10C; a preference model 202 derived from search, presentation duration, or other user action history 863; or no preference data at all. Alternatively or additionally, such preference data relating to one or more entities 610 may be obtained or used (or both)

as a primary aspect of a default prioritization 833, 1933 or supervised-learning-type protocol 476.

Terms like "supervised-learning-type" refer herein not only to supervised learning per se but also to other technologies in which input data is mapped to output data based on training data that pairs numerous vector-valued input objects (e.g. defining composite project sites, speciations, or other such operational data 405) each to a corresponding preferable output value 853 (e.g. a valuation 380, score 481, latitude, offset, selection, rank 488, authorization, size estimate, or other preference indication 840) using one or more user-provided inductive biases (e.g. observed user actions 1594). In light of teachings herein, for example, such machine learning implementations can be gleaned from search terms 1590 or other user inputs 1708 from such entities 610 without any undue experimentation.

Operation 2265 describes causing the first building model of the second assemblage to be prioritized over the second building model of the second assemblage, to displace the first building model of the first assemblage, and to be presented via the visual display in lieu of the second building model of the second assemblage all partly based on the machine-learning-based scoring protocol and partly based on one or more preference-indicative actions of the user of the visual display (e.g. a second instance of an authorization module 334 and one or more indexing modules 335 jointly causing the first species 201 of the second project site 122 to be deemed preferable over the second species of the second project site 122; to replace or partly occlude a rendering of the first species 201 of the first project site 121; and to be presented to the user in lieu of the second species of the second project site 122 partly based on the machine-learning-based scoring protocol 476D and partly based on one or more preference-indicative actions 1594 of the user). This can occur, for example, in a context in which an authorization module 334 manifests an identifier of the first project site as a voltage configuration 354 thereof; in which the rendering of the first species 201 of the first project site 121 is thereby initially presented to the user; in which an indexing module 335 manifests a touchscreen activation or other preference-indicative user action 1594 as a voltage configuration 355 to index to a next-most-preferable option; in which the visual display presents (the first species 201 of) the second project site 122 in response 1525; and in which multiple visual display devices would otherwise be required to allow the automatically created message draft to be tailored by the user before transmission.

Operation 2280 describes causing a draft offer-descriptive message containing a parcel identifier, a parcel valuation, and a premium valuation to be presented simultaneously via the visual display as a real-time response to a request associated with the reference parcel following a presentation of one or more such building models via the visual display (e.g. one or more control modules 332 causing a draft offer-descriptive message containing a street address or other parcel identifier 448A; a public-records or independent-party-provided parcel valuation 380; and premium valuation 10-50% higher than the prior parcel valuation 380 to be presented simultaneously via the one or more display screens 1712 as a real-time response 1525 to a request 851 associated with the reference parcel 160 following a presentation 834 of one or more such building models 202 corresponding to the message). This can occur, for example, in a context in which the control module(s) 332 manifest the draft message in a memory (e.g. as a voltage configuration 357 on electrical nodes 347 thereof) and in which parcel adjacency would not otherwise get appropriately proactive consideration when undertaking to acquire real property parcels from multiple respective sellers.

Operation 2290 describes causing numerous additional pairings of a subject parcel identifier with a corresponding valuation to be presented together after a corresponding building model all within a one-hour period (e.g. one or more response modules 336 serially or otherwise causing (at least) dozens of additional pairings of a street address of a subject parcel 160 each with a corresponding published or other conventional valuation 380 of that parcel to be presented together after a corresponding species 201 of a preferable project site 121 of that parcel all within a one-hour period). This can occur, for example, in a context in which the user has reviewed project sites 121-122 and corresponding species 201 as a semi-automatic protocol for validating parcel suitability 519; in which the response module(s) 336 manifest such pairings in a proposed offer batch of more than half of the parcels in those validated project sites; in which the user has reviewed a draft (version of a) message for at least one such parcel on a prior occasion; in which such validations are manifested as a voltage configuration 356 on electrical nodes 346 thereof); in which a transmission module 338 may thereafter send such offer-descriptive content 890 to email or other addresses 453 associated with each owner name 451 thereof; and in which more than 12 contemporaneous parallel offers all within the one-hour period and all based on the same machine-learning-based scoring protocol would otherwise remain unattainable. Alternatively or additionally, the "corresponding" valuations may include premium valuations each at least partly based on a conventional valuation 380 of the subject parcel (derived as a markup percentage designated by the user, e.g.).

In light of teachings herein, numerous existing techniques may be applied for configuring special-purpose circuitry or other structures effective for obtaining real property data and presenting key aspects of potential developments thereon as described herein without undue experimentation. See, e.g., U.S. patent Ser. No. 10/679,205 ("Systems and methods regarding point-of-recognition optimization of onsite user purchases at a physical location"); U.S. patent Ser. No. 10/528,652 ("Generating predictive models for authoring short messages"); U.S. patent Ser. No. 10/521,943 ("Lot planning"); U.S. patent Ser. No. 10/521,865 ("Structural characteristic extraction and insurance quote generation using 3D images"); U.S. patent Ser. No. 10/510,087 ("Method and apparatus for conducting an information brokering service"); U.S. patent Ser. No. 10/459,981 ("Computerized system and method for automatically generating and providing interactive query suggestions within an electronic mail system"); U.S. patent Ser. No. 10/496,927 ("Systems for time-series predictive data analytics, and related methods and apparatus"); U.S. patent Ser. No. 10/467,353 ("Building model with capture of as built features and experiential data"); U.S. patent Ser. No. 10/387,414 ("High performance big data computing system and platform"); U.S. patent Ser. No. 10/382,383 ("Social media post facilitation systems and methods"); U.S. patent Ser. No. 10/198,735 ("Automatically determining market rental rate index for properties"); U.S. patent Ser. No. 10/192,275 ("Automated real estate valuation system"); U.S. patent Ser. No. 10/190,791 ("Three-dimensional building management system visualization"); U.S. Pub. No. 20170109668 ("Model for Linking Between Nonconsecutively Performed Steps in a Business Process; and U.S. Pub. No. 20170109638 ("Ensemble-Based Identification of Executions of a Business Process"). Moreover in light of teachings herein, numerous existing techniques may be applied for implementing extraction, modeling, scoring, selection, feature augmentation, speciation, rendering, and other development protocols as described herein without undue experimentation. See, e.g., U.S. patent Ser. No. 11/158,118 ("Language model, method and apparatus for interpreting zoning legal text"); U.S. patent Ser. No. 11/157,930 ("Systems and methods for defining candidate and target locations based on items and user attributes"); U.S. patent Ser. No. 11/134,359 ("Systems and methods for calibrated location prediction"); U.S. patent Ser. No. 11/068,385 ("Behavior driven development test framework for application programming interfaces and webservices"); U.S. patent Ser. No. 11/044,393 ("System for curation and display of location-dependent augmented reality content in an augmented estate system"); U.S. patent Ser. No. 10/992,836 ("Augmented property system of curated augmented reality media elements"); U.S. patent Ser. No. 10/983,026 ("Methods of updating data in a virtual model of a structure"); U.S. patent Ser. No. 10/860,023 ("Systems and methods for safe decision making of autonomous vehicles"); U.S. patent Ser. No. 10/818,082 ("Method and system for parametrically creating an optimal three dimensional building structure"); U.S. patent Ser. No. 10/706,057 ("Presenting groups of content item selected for a social networking system user based on content item characteristics"); and U.S. patent Ser. No. 10/296,961 ("Hybrid recommendation system").

Figure 23:
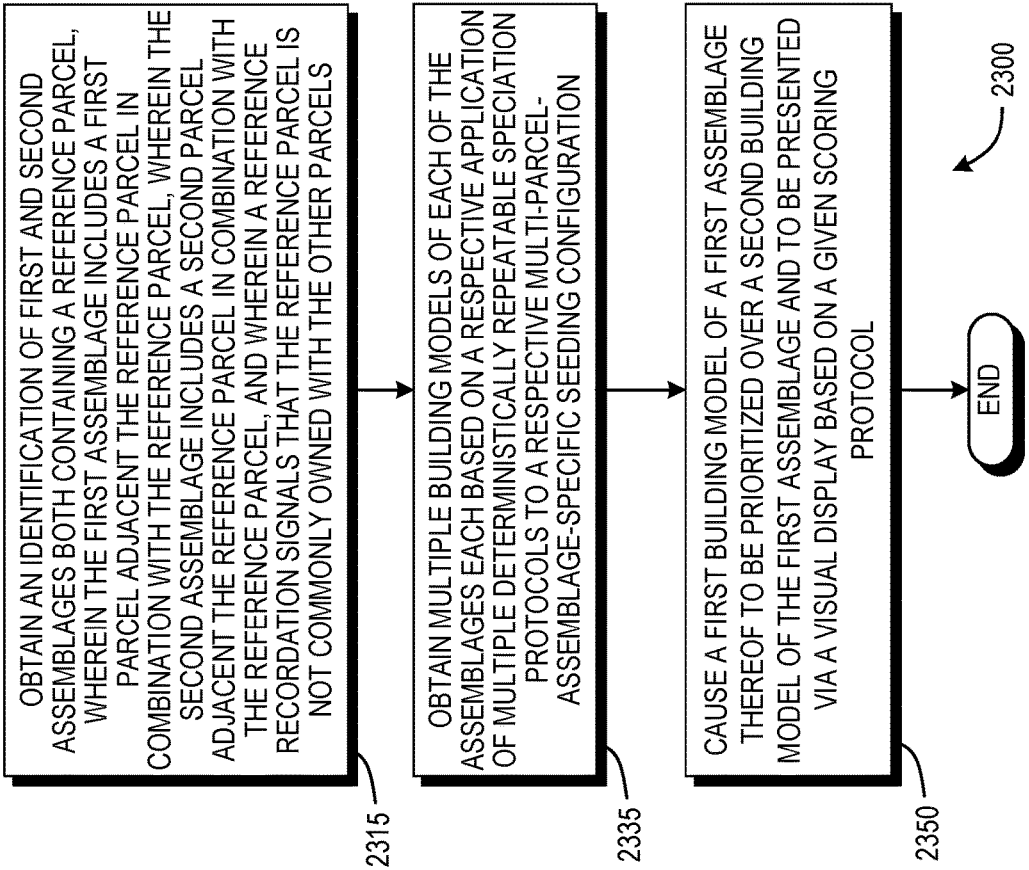
FIG. 23 depicts yet another operational flow in which one or more improved technologies may be incorporated.

FIG. 23 illustrates an operational flow 2300 suitable for use with at least one embodiment, such as may be performed (in some variants) on one or more servers 1800 using special-purpose circuitry 1822. Operation 2315 describes obtaining an identification of first and second assemblages both containing a reference parcel, wherein the first assemblage includes a first parcel adjacent the reference parcel in combination with the reference parcel, wherein the second assemblage includes a second parcel adjacent the reference parcel in combination with the reference parcel, and wherein a reference recordation signals that the reference parcel is not commonly owned with the other parcels (e.g. one or more interface modules 331 generally configured and invoked as described above).

Operation 2335 describes obtaining multiple building models of each of the assemblages each based on a respective application of multiple deterministically repeatable speciation protocols to a respective multi-parcel-site-specific seeding configuration (e.g. one or more speciation modules 333 generally configured and invoked as described above).

Operation 2350 describes causing a first building model of a first assemblage thereof to be prioritized over a second building model of the first assemblage and to be presented via a visual display based on a given scoring protocol (e.g. one or more authorization module 334 generally configured and invoked as described above). This can occur, for example, in a context in which such diverse, selective, consensus-driven, or other controllable presentations 834 allow a developer to see and act upon vetted search results that could not have been visualized via a single display screen 1512 and in which such complex arrangements of property transfers would otherwise be too diffuse to allow any such multi-parcel-site-specific development to occur without government compulsion or significant duress.

Figure 24:
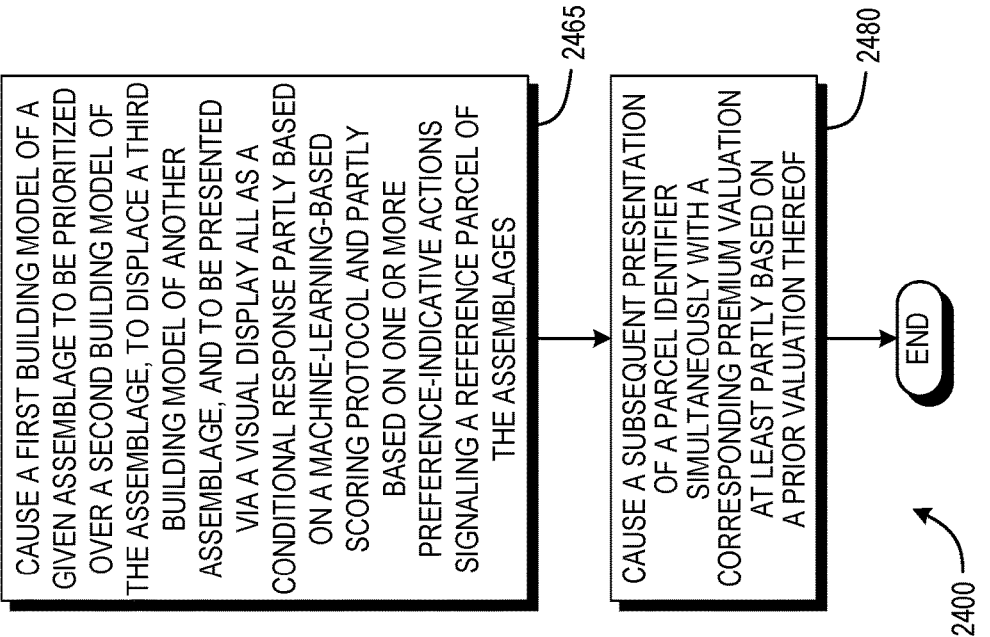
FIG. 24 depicts still another operational flow in which one or more improved technologies may be incorporated.

FIG. 24 illustrates an operational flow 2400 suitable for use with at least one embodiment, such as may be performed (in some variants) on one or more servers 1800 using special-purpose circuitry 1822. Operation 2465 describes causing a first building model of a given assemblage to be prioritized over a second building model of the assemblage, to displace a third building model of another assemblage, and to be presented via a visual display all as a conditional response 1525 partly based on a machine-learning-based scoring protocol and partly based on one or more preference-indicative actions 1594 signaling a reference parcel of the composite project sites (e.g. one or more authorization module 334 generally configured and invoked as described above via the visual display).

Operation 2480 describes causing a subsequent presentation of a parcel identifier simultaneously with a corresponding premium valuation at least partly based on a prior valuation thereof (e.g. one or more response, configuration, and transmission modules 356-358 generally configured and cooperatively invoked as described above).

Figure 25:
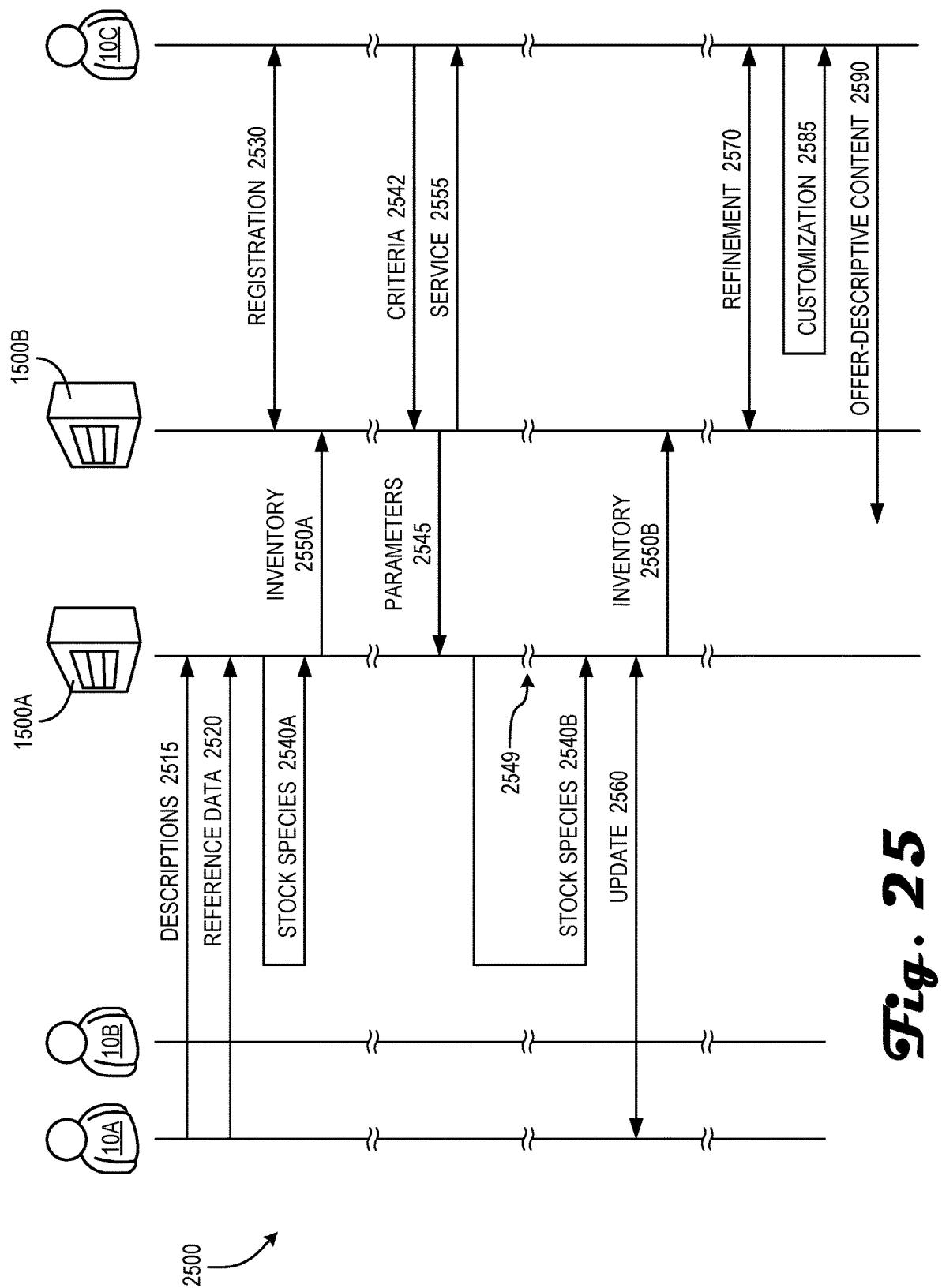
FIG. 25 depicts a particular scenario and progressive data flow in which client devices interact with one or more servers according to one or more improved technologies.

FIG. 25 depicts a particular scenario and progressive data flow 2500 in which client devices 1700 respectively used by several users 10 or other entities 610 interact with one or more servers 1800 in regard to a potential transfer of a reference parcel 160 in facilitating development of a multi-parcel site. A species development server 1800A receives parcel descriptions 2515 and other reference data 2520 such as site maps 835, zone types 370, valuations 380, or other operational data 405. Thousands of diverse stock species 2540A are developed in numerous urban and suburban regions across multiple price ranges and zoning-compatible land uses. Many such species posit a largest superset project site 123 (nominally) incompatible with an inclusion of additional adjacent land. Many others are based upon price-appropriate subset thereof that are consistent with interior area sizes or other aspects of a particular investor's preference profile 867. Meanwhile several entities 610 undergo registration, which may provide overt expressions 850 of preference 866 to interface server 1800B that may inform a most promising inventory 2550A. For example property search development criteria 2542 may provide operating parameters 831 to development server to enhance the available inventory 2550A through further speciation, as well as to support an immediate service 2555 of rendering candidate project sites and building model configurations 1572.

After an implementation delay 2549 of several additional hours or days, such focused search parameters 2545 may have been used by the development server(s) 1800A to develop additional project sites (and species thereof) of likely interest (as manifested by a compatibility 484, rank 488, or other score 481 thereof) in an enhanced inventory 2550B. Moreover prior offers or other available owner data 450, contractual restriction status may be useful to update 2560 to facilitate real-time parcel selection refinement 2570, offer customization 2585, and the resulting firm offers or other offer-descriptive content 890 being distributed to owners of parcels of confirmed interest.

Figure 26:
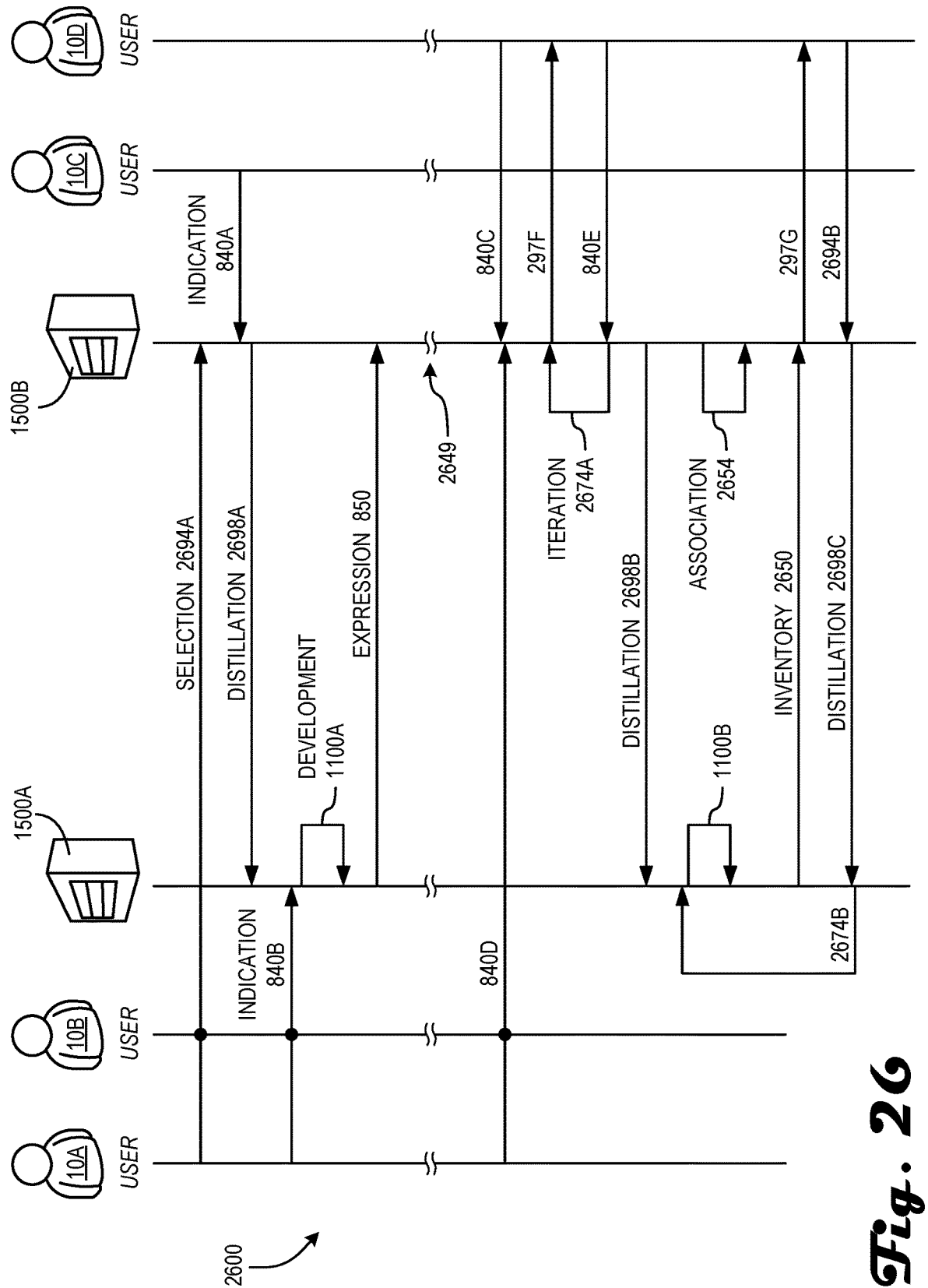
FIG. 26 depicts another particular scenario and progressive data flow in which client devices interact with one or more servers according to one or more improved technologies.

FIG. 26 depicts a particular scenario and progressive data flow 2600 in which client devices 1700 respectively used by several device users 10A-D (e.g. as owner entities or developers) interact with one or more servers 1800 pursuant to various protocols 476 that facilitate feature augmentation such as efficient machine-assisted development of multi-parcel sites 121-123. As shown some existing users in a cohort each send one or more selections 2694A that signal one or more components 769 of types of virtual construction species 1021-1026 of interest, negatively or positively. Such selections 2694 (e.g. for navigation, inspection, or requested processing) may, for example, indirectly indicate which sites, sizes, or other such components 769 pertain to alternative offerings worth developing. User 10C likewise sends selections and other indications 840A to one or more interface servers 1800B so as to allow an interactive presentation of an established inventory of virtual depictions 297 and other project-descriptive content 890 to each visiting user 10. Such selections 2694 and other indications 840B are sampled or otherwise summarized and forwarded as an occasional distillation 2698A to backend server 1800A. Server 1800A uses such indications 840 to guide development 1400A pertaining to various processing operations such as speciation 975 and rendering 976, after which a resulting set of expressions 850 (e.g. lists 473 or maps 835) is sent to server 1800B.

After at least one overnight delay 2649, one or more selections 2694 or other indications 840C are received from a new device user 10D, such as for establishing an account and an initial geography of interest. In response to this and other indications 840D of user preference 466, 866 one or more modules 331-338 within or accessible to server 1800B manifest a succession of preliminary depictions 297F featuring one or more regional maps 835 populated with a tailored assortment of virtual species 201, 1021-1026 shown among existing real-world structures. Additional iterations 2674A of navigational indications 840E (e.g. paths 1087 or control activations) trigger corresponding refined versions 862 of inclusions 788, prioritizations 833, messages 1560, or other updated depictions 297 as described herein. Such user actions also form a basis for one or more incremental preference distillations 2698B that are provided to backend server 1800A. This allows efficient ongoing improvement of existing project sites or development 1400B of new multi-parcel sites 121-123 or other map inclusions 788. See FIGS. 1-12.

In some variants, for example, such development 1400B may be informed by one or more common terms 1590 or other newfound associations 2654 between a current user 10D and one or more preference indications 840 provided by other users 10. Alternatively or additionally such development 1400B may be based on one or more new distillations 2698 resulting from a newly-implemented learning/extraction protocol 476G. Such distillation 2698C may occur in response to selections 2694B or other indications 840 (e.g. using buttons or other controls 225 as described herein) in reference to each presented depiction 297G or other expression 850 through numerous iterations 2674B. Such iterations 2674B may guide efficient ongoing development 1400 as well as better understood associations 2654 among users, such as an automatic assignment of a now-active user 10D to a cohort of other device users who have apparent similarities and whose prior actions are accordingly useful for predicting one or more preferences of the now-active user 10D as a passive inference, whereby computer resource waste is reduced as further described herein.

In some variants vivid new spatial depictions 297 of best-in-class species 1021-1025 tailored to be of particular interest to a particular user 10D are generated. This can occur, for example, in a context in which one or more indexing modules 335 (e.g. in a client device 1700 or server 1800) distill menu selections 2694A and other indications 840A-B of user preference 466, 866 into aggregated profiles 867 that typify respective cohorts of users (e.g. commercial or residential developers) each characterized by preferences not shared by some other factions of users 10.

In some variants a single type 370, 670 of users has triggered an association among them by having indicated a similar land use classification 838, geographic dimension 368, or other such project attribute 617 (or combinations thereof) so that a learning module 337 uses an action history 863 of some users 10A-C in a cohort as training data 405-407 to predict one or more preferences 466, 866 of another user 10D who is later assigned to the cohort. In some contexts, for example, such preferences 466, 866 selectively qualify some composite project species 1021-1025 for prioritization (e.g. over one or more other species 1026) and a pre-existing inventory 2550 of options 1984A-D includes one or more species 1021-1022 were initially deemed worthy of inclusion 788 (e.g. in prioritization 1933A) but are later omitted or otherwise demoted on behalf a particular user 10D (e.g. in prioritization 1933B). Moreover such incremental prioritizations can be ongoing and may influence how limited computing resources may be applied for development 1400 and expression 850 in the near term (e.g. overnight) or even in real time (e.g. within less than 30 seconds after one or more indications 840B-C to which they are responsive.

After a delay 2649 of days or weeks, an indication 840C of what project types, locations, or other attributes 617 are impliedly of interest. In response, from a developed inventory of local species a map version 862A or image 1096 thereof, model rendering, or other detailed depiction 297F or requested or suitable species 1021-1025 is presented via a local device 1700 to user 10D. And additional indications 840D-E (e.g. favorable signals 703A or other user actions 1594 pertaining to a navigation, magnification, closer inspection, or other preference 866) from respective users 10 signal which candidate species 1021-1023 are fittest for prioritization in a next (instance of a) version 862 to each such user 10 as well as one or more other users within a cohort.

At programmatic intervals a distillation 2698B of user indicative information causes additional development 1400B (e.g. featuring new extraction 973, speciation 975, rendering 976, or a combination thereof) to occur as a tailored response 1525 to a detected status 1522 (e.g. a sufficient number of iterations 840C-E and or other counted events exceeding a threshold as detected by an indexing module 335). This may cause an interface module 331 to express a second project site prioritization 833 1933B later favoring the third-type project option 1984C (e.g. corresponding to a second-type species 1022 or third-type species 1023 over the first-type and second-type project options 1984A, 1984B to the first device user 10D.

In some contexts, for example, such a changed prioritization 1933B may be partly based on an explicit indication 840E of a preference 866 of user 10D for the third-type composite project option 1984C over the second-type project option 1984B (e.g. directly from user 10D having disparaged the second-type composite project option 1984B) and partly based on an implicit indication 840 of an apparent preference 866 of user 10D for the third-type composite project option 1984C over the first-type project option 1984A inferred from other users 10A-B who have (dismissed or otherwise) disparaged the first-type composite project option 1984A) being related to user 10D.

Alternatively or additionally such a status may trigger an additional expression 850 (e.g. comprising another instance of a now-favored species 1023) as a conditional response 1525 (at least partly) based on the implicit and explicit indications 840 of the preference 866 of the first device user 10D for the third-type composite project option 1984C. This can occur, for example, in a context in which an association 2654 between user 10D and other users 10A-C is After an implementation delay 2649 of several additional hours or days, such focused search parameters 2645 may have been used by the development server(s) 1800A to develop additional project sites (and species thereof) of likely interest (as manifested by a compatibility 484, rank 488, or other score 481 thereof) in an enhanced inventory 2650.

Figure 27:
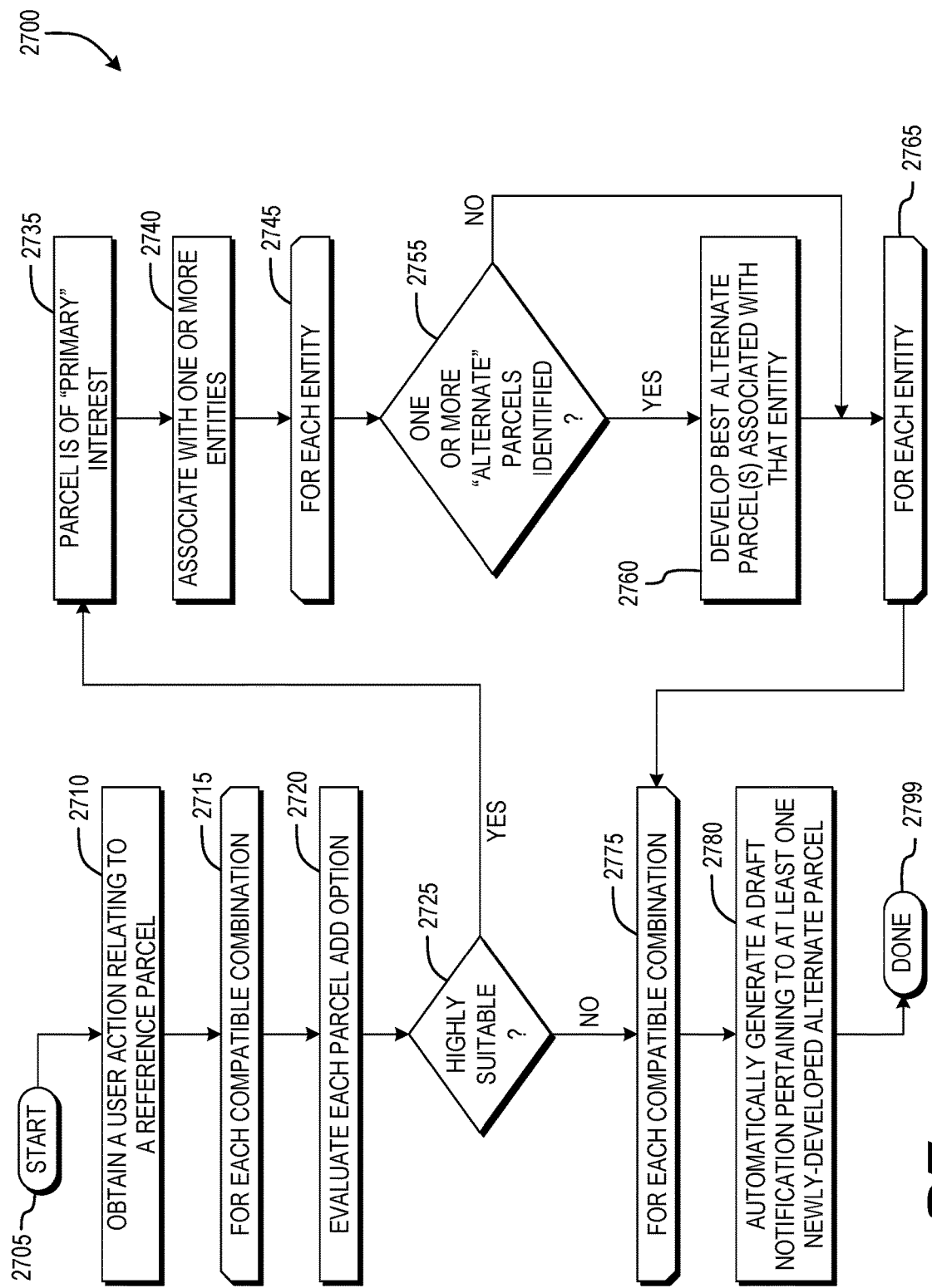
FIG. 27 depicts another scenario and progressive data flow in which client devices interact with one or more servers according to one or more improved technologies.

FIG. 27 illustrates an operational flow 2700 suitable for use with at least one embodiment, such as may be performed (in some variants) on one or more servers 1800 or using special-purpose circuitry 1722, 1822. As will be recognized by those having ordinary skill in the art, not all events of information management are illustrated in FIG. 27. Rather, for clarity, only those steps reasonably relevant to describing the distributed ledger interaction aspects of flow 2700 are shown and described. Those having ordinary skill in the art will also recognize the present embodiment is merely one exemplary embodiment and that variations on the present embodiment may be made without departing from the scope of the broader inventive concept set forth in the clauses and claims below.

After a start operation, 2705, operation 2710 describes obtaining a user action relating to a reference parcel. Control then passes to operation 2715.

Operation 2715 describes beginning a (potentially iterative) loop beginning at operation 2720 in relation to one or more compatible options (e.g. respective sets of one or more parcels that can be combined with the reference parcel 160 into an assemblage or other composite site using one or more restrictions 517 provided by or otherwise suitable for a current user 10 or cohort).

Operation 2720 describes evaluating a current parcel add option (e.g. using one or more scoring protocols provided by or otherwise suitable for a current user 10 or cohort). Control then passes to operation 2725.

Operation 2725 describes determining whether an added parcel is highly suitable (e.g. using one or more scoring protocols 476D that ascertain whether a quantified evaluation exceeds a threshold). If so then control passes to operation 2735, otherwise to operation 2775.

Operation 2735 describes deeming the parcel to be of primary interest. Control then passes to operation 2740.

Operation 2740 describes associating a current primary parcel with one or more entities (e.g. using one or more lookup protocols 476 that ascertain who owns or manages a parcel that might be acquired). Control then passes to operation 2745.

Operation 2745 describes beginning a (potentially iterative) loop beginning at operation 2755 in relation to one or more entities who own or manage a primary parcel. Control then passes to operation 2755.

Operation 2755 describes determining whether one or more alternate parcels owned or managed by the same entity are identified (e.g. using one or more lookup protocols 476 that handle ownership or listing records 414). If so then control passes to operation 2760, otherwise to operation 2765.

Operation 2760 describes developing one or more alternate parcels owned or managed by the same entity (e.g. using one or more scoring and development protocols 476D, 476H). Control then passes to operation 2765.

Operation 2765 describes iterating a loop begun at operation 2745 if appropriate. Otherwise control then passes to operation 2775.

Operation 2775 describes iterating a loop begun at operation 2715 if appropriate. Otherwise control then passes to operation 2780.

Operation 2780 describes automatically generating a draft notification pertaining to at least one newly-developed alternate parcel (e.g. using one or more notification protocols 476). Control then concludes flow 2700 at operation 2799.

The following table illustrates a root genetic algorithm suitable for use (e.g. by one or more development servers 1800A) in one or more variants described herein:

TABLE 1

Algorithm 1 root genetic algorithm

```
1:  generation_0 = for M species:
2:      for N specimens:
3:          generate random specimen (according to strategy)
4:  generation_{n+1} = map for each species in generation_n:
5:      map for each specimen in species:
6:          if (random probability 70%):
7:              // do crossover
8:              if (random probability 1%):
9:                  get random other specimen from random other species
10:             else:
11:                 get random other specimen from this species
12:             specimen = crossover(specimen, other specimen)
13:         if (random probability 25%):
14:             specimen = mutate(specimen)
15:         if (random probability 0.5%):
16:             specimen = smooth(specimen)
17:         specimen = normalize(specimen)
18:         specimen.fitness = evaluate(specimen)
19:         return specimen
20: fitness change rate = 1000
21: best specimen ever = specimen having max(fitness from specimens
    in generation_0)
22: recurse through generations:
23:     // keep track of the best specimen we've ever seen
24:     best specimen = specimen having max(fitness from specimens in
        generation)
25:     if best specimen.fitness > best specimen ever.fitness:
26:         best specimen ever = best specimen
27:     // moving average to see how quickly we're improving
28:     fitness delta = best specimen.fitness − best specimen ever.fitness
29:     fitness change rate = (92% * fitness change rate) + (8% * fitness
        delta)
30:     if (fitness change rate < min change rate or generation number >=
        1800):
31:         abort
32: return best specimen ever
```

The following table illustrates an arena sizing algorithm suitable for use (e.g. by one or more development servers 1000C) in some variants described herein:

TABLE 2

Algorithm 2 arena sizing algorithm

```
1: // The arena is the local grid of cells in which specimens can be generated. A parcel's
lot area is mapped onto a grid of fixed-size cells with the following algorithm:
2:  parcel street line = the street line with the same name as the address of the parcel
3:  parcel orientation = angle from parcel centroid to parcel street line
4:  // This is used to transform points from global coordinates to an approximately
5:  accurate local coordinate system for the parcel based on the parcel centroid
6:  tolocal(centroid {x, y}, point {x, y}) =
7:      radius of earth = 6,371,009 m
8:      centroid radians = centroid * (π/180)
9:      point radians = point * (π/180)
```

TABLE 2-continued

Algorithm 2 arena sizing algorithm

```
10:     // cos(centroid radians.y) accounts for convergence of longitude lines toward the poles
11:     return {
12:         x = radius of earth * (point radians.x − centroid radians.x) * cos(centroid radians.y)
13:         y = radius of earth * (point radians.y − centroid radians.y)
14:     }
15: // Project the polygon to our local coordinate system in metres
16: local poly = map tolocal(parcel centroid, point) for each point in parcel polygon // lot lines
17: // Rotate the parcel to its orientation
18: local poly = rotate(local poly, parcel orientation)
19:
20: // Place the grid around the center of the rotated polygon. This rectangle will be
21: the defining shape of our arena
22: bounding box = make bounding box for local poly: {
23:     MinX = min(x) from local poly
24:     MinY = min(y) from local poly
25:     MaxX = max(x) from local poly
26:     MaxY = max(y) from local poly
27: }
28: // Size each cell inside the bounding rectangle - these are the discrete units that can be filled with different data
29: // ln = natural logarithm
30: smaller side = smaller of (MaxX − MinX) or (MaxY − MinY) from bounding box
31: cell size = ln(1 + smaller side / 10) / 1.5
32:
33: // Create a mask of cells within the bounding box that aren't actually within the parcel polygon
34: for each discrete cell {x, y} from {0, 0} in bounding box / cell size:
35:     cell point = minimum point from bounding box + (cell * cell size)
36:     cell rectangle = {cell point, cell point + cell size}
37:     if (cell rectangle is fully inside local poly):
38:         mask[x, y] = true
39:     else:
40:         mask[x, y] = false
41: // Defined for convenience:
42: arena width = floor(bounding box.(MaxX − MinX) / cell size)
43: arena height = floor(bounding box.(MaxY − MinY) / cell size)
44:
45: // The arena is defined as:
46: arena = {
47:     world poly, // the original polygon in world coordinates
48:     parcel orientation,
49:     centroid,
50:     local poly,
51:     bounding box,
52:     cell size,
53:     arena width,
54:     arena height,
55:     mask
56: }
57: // All array shapes and coordinates within strategies will typically be in arena cells.
```

The following table illustrates a single-shelter algorithm suitable for use in some speciation described herein:

TABLE 3

Algorithm 3 single-shelter algorithm

```
1:  // data structures
2:  params := {
3:      // We define multiple levels for a given configuration at which structures are built up
4:      levels = array [N] {
5:      height,
6:      // Areas where building is not permitted measured from the lot line
7:      setbacks { left, right, back, front }
8:      },
9:      // Parking parameters
10:     assumed unit size for parking,
11:     parking per dwelling unit,
12:     surface parking space area,
13:     underground parking space area,
```

TABLE 3-continued

| Algorithm 3 single-shelter algorithm |
| --- |

```
14:    underground parking permitted = boolean,
15:  }
16:  specimen := {
17:    params,
18:    // A particular cell can be in one of the following states:
19:    shape array [X] [Y] arena cells:
20:      values for:
21:        parking,
22:        empty,
23:        level₁,
24:    level₂,
25:    ...,
26:    levelₙ
27:  }
28:  // genetic algorithm operations
29:  random specimen =
30:    for each cell {x, y}:
31:      if mask[cell] = true:
32:        shape[cell] = random either empty or level₁
33:      else:
34:        shape[cell] = empty
35:  normalize(specimen) =
36:    set all cells where mask is false to empty
37:  crossover(specimen1, specimen2) =
38:    axis = randomly choose either X or Y
39:    split = randomly choose any coordinate within arena on axis
40:    return new specimen {
41:      shape = cells from specimen1 where coordinate on axis < split and
42:         cells from specimen2 where coordinate on axis >= split
43:    }
44:  // Smooth out the specimen, somewhat averaging each cell across its neighbours
45:  smooth(specimen) =
46:    map for each cell {x, y} in specimen:
47:      // Whichever distinct value has the highest sum score
48:      // For example, if there are three instances of level₂ in the neighbours
49:      // and others are empty, level₂ has a score of 6 and empty has a score of 3, so
50:      // we would choose level₂
51:      new value = value with highest score where:
52:        score 1 for value at {x, y}
53:        // neighbors
54:        score 2 for value at {x − 1, y − 1}
55:        score 2 for value at {x + 1, y − 1}
56:        score 2 for value at {x − 1, y + 1}
57:        score 2 for value at {x + 1, y + 1}
58:  mutate(specimen) =
59:    origin = randomly choose point where mask[point] = true
60:    level = n if shape[point] is levelₙ otherwise 0
61:    // either raise or lower structure
62:    new level = (if (random) level + 1 else level − 1) clip between 0 and max level
63:    // Expand the largest contiguous rectangle that fits fully within the enabled part of
64:    // the mask
65:    states = [
66:      X minus,
67:      X plus,
68:      Y minus,
69:      Y plus
70:    ]
71:    done = [false, false, false, false]
72:    rectangle = {origin, origin}
73:    loop through states as state:
74:      if not done[state]:
75:        // Ensure we can continue to expand
76:        if all points in expanded rectangle have mask[point] = true:
77:          expand rectangle in the direction of state
78:        else:
79:          // We can't expand more in this direction
80:          done[state] = true
81:      else:
82:        if all elements of done are true:
83:          break loop
84:    randomly choose an action from:
85:      Set:
86:        set all cells within rectangle to new level // where 0 means empty
87:      Set Parking:
88:        set all cells within rectangle to parking
89:      Shear:
90:        set all cells outside of rectangle to empty
```

TABLE 3-continued

Algorithm 3 single-shelter algorithm

```
91:        Flip X:
92:            mirror cells within rectangle along X axis
93:        Flip Y:
94:            mirror cells within rectangle along Y axis
95:     fitness(specimen) =
96:        // Compute all of the input parameters
97:        with lengths(specimen, level) for each level
98:        with lengths(specimen, parking)
99:        with heights(specimen, lengths)
100:       total storeys = max(heights)
101:       for each level:
102:           storeys = heights[level]
103:           limits = conditional limits for(storeys, total storeys)
104:           with length suboptimality(specimen, limits, lengths[level])
105:           with setback interference(specimen, limits, lengths[level])
106:           with coverage(specimen, limits, level)
107:       with length suboptimality(specimen, {min gap = 40 ft, min run = 18 ft},
lengths[parking])
108:       with area stats(specimen, heights)
109:       with parking stats(specimen, area stats)
110:    with connectedness(specimen)
111:    with count walls(specimen, axis) for axes X and Y
112:    return sum:
113:        40 * (5 + (area stats.spread / total # cells in arena)) +
114:        (if params.max FAR is set:
115:            if area stats.FAR < params.max FAR:
116:                −1 * (1 + 110 * (max FAR − area stats.FAR))³
117:            else if area stats.FAR > params.max FAR:
118:                // being over the max FAR is worse
119:                −10 * (1 + 110 * (area stats.FAR − max FAR))³
120:            else:
121:                0
122:        else:
123:            2 * (area stats.area)^{1.3}
124:        ) +
125:        1 * (1 + count walls.cells per wall)² + // long walls
126:        −10 * (count walls.walls)³ + // many walls
127:        2 * connectedness.connected +
128:        −2000 * (connectedness.alone)² +
129:        1 * (area stats.centrality)² +
130:        −5 * (1 + sum (
131:            (10 * under gap)² +
132:            (10 * under run)² +
133:            (0.3 * one side)² +
134:            (10 * inner hole)² +
135:            (10 * good points)² +
136:            (good)^{0.6} +
137:            if this is the first level and there is more than one level:
138:                (20 * gap)³
139:            else 0
140:        ) for each length suboptimality) +
141:        −5000 * (sum of setback interference for each level and side)² +
142:        −5 * (sum of coverage.excess for each level)² +
143:        −10000 * (only if greater than 0:
144:    (parking stats.underground parking + parking stats.surface parking) −
145:    parking stats.required parking) +
146:    (if parking stats.underground parking area > 0:
147:        // disincentivize underground parking vs. surface parking
148:        −1000 * (1 + parking stats.underground parking area / lot area)^{1.2})
149:    // Measure lengths of either under or on/over level accessible from each point
150:    // Result is an array for each axis where each cell maps to a value of either:
151:    // - Outside: cell is masked, outside the parcel
152:    // - Gap(length): this cell is part of a gap of "length" cells below the level
153:    // - OutsideGap(length): same as above but gap is on the outside edge of the parcel
154:    // - Run(length): this cell is part of a run of "length" cells on or above the level
155:    lengths(specimen, level) =
156:        for each row for each axis:
157:            for cells in row:
158:                if mask[cell] = false:
159:                    lengths[cell] = Outside
160:                else if shape[cell] >= level:
161:                    gather cells on this row while shape[cell] >= level
162:                    length = count cells
163:                    lengths[cells] = Run(length)
164:                else:
165:                    gather cells on this row while shape[cell] < level
166:                    length = count cells
167:                    if cells are on outside edge of row:
```

TABLE 3-continued

Algorithm 3 single-shelter algorithm

```
168:            lengths[cells] = OutsideGap(length)
169:        else:
170:            lengths[cells] = Gap(length)
171:    // Calculate supported heights for each level based on some concept of stability.
172:    // These heights will be treated as the actual heights for the specimen at each level
173:    // using the heights in the params as a maximum.
174:    heights(specimen, lengths) =
175:        stability = 4.0
176:        last computed = 0
177:        max supported = array of numbers for each level
178:        computed = array of numbers for each level
179:        for each level:
180:            average length x = calculate mean dimension of
181:   all Run(length) in lengths for X axis
182:            average length y = calculate mean dimension of
183:                all Run(length) in lengths for Y axis
184:            min mean length = the lowest of either average length x or average
length y
185:
186:            // The theoretically max supported height at this level.
187:            max supported[level] = last computed + (if min mean length > 0
188:                then min mean length * cell size * stability else 0)
189:
190:            min support = min(max supported for all levels up to and including this
one)
191:            // The actual computed height for this level.
192:            computed[level] = the lowest of either params.levels[level].height or
193:                floor(min support)
194:        return {max supported, computed}
195:    // "lengths" here is for a particular level or parking, not all of them
196:    length suboptimality(specimen, limits, lengths) =
197:        gap run x = gap run(limits, lengths, X)
198:        gap run y = gap run(limits, lengths, Y)
199:        one side = 0
200:        inner hole = 0
201:        for each cell {x, y}:
202:            if lengths[x, y] for either axis is Run(length):
203:                if length on either axis > limits.max one side:
204:                    one side += 1
205:            if lengths[x, y] for both axes is Gap: // NOT OutsideGap
206:                inner hole += 1
207:        return {
208:    sum everything from gap run x and gap run y,
209:    one side,
210:    inner hole
211:    }
212:    // "lengths" here is for a particular level or parking, not all of them
213:    // Evaluate statistics for the lengths matrix for the axis
214:    gap run(limits, lengths, axis) =
215:        min run = limits.min run as cells
216:        min gap = limits.min gap as cells
217:        output = {
218:    gap = 0
219:    run = 0
220:            under gap = 0
221:            under run = 0
222:            good = 0
223:    }
224:        for each row on axis:
225:            start = the index of the first OutsideGap in lengths
226:            end = the index of the last OutsideGap in lengths
227:            for each column between start and end:
228:                match lengths[axis, row, column]:
229:                    case Gap(length) or OutsideGap(length):
230:                        if this is not the first or last col and length < min gap:
231:                            output.under gap += (min gap − length)
232:                        else:
233:                            output.good += 1
234:                        if this is not OutsideGap:
235:                            out.gap += 1
236:                        skip ahead by length
237:                    case Run(length):
238:                        if length < min run:
239:                            output.under run += (min run − length)
240:                        else:
241:                            output.good += 1
242:                        output.run += 1
243:                        skip ahead by length
```

TABLE 3-continued

Algorithm 3 single-shelter algorithm

| | |
|---|---|
| 244: | case Outside: |
| 245: | continue |
| 246: | return output |
| 247: | setback interference(specimen, limits, lengths) = |
| 248: | interference = {left = 0, right = 0, back = 0, front = 0} |
| 249: | for each direction {Forward, Reverse} of each axis {X, Y}: |
| 250: | side if (Forward, X) = left |
| 251: | side if (Reverse, X) = right |
| 252: | side if (Forward, Y) = back |
| 253: | side if (Reverse, Y) = front |
| 254: | for each row: |
| 255: | initial gap = find first OutsideGap or Gap on axis by direction in row |
| 256: | if row contains any Run: |
| 257: | setback = limits.setbacks[side] |
| 258: | if initial gap.length < setback: |
| 259: | interference[side] += $(1 + setback - initial\ gap.length)^2$ |
| 260: | return interference |
| 261: | coverage(specimen, limits, level) = |
| 262: | max coverage = limits.max coverage or 100% |
| 263: | count = count cells in specimen.shape where value is at least level |
| 264: | area in one cell = $(cell\ size)^2$ |
| 265: | coverage = (count * area in one cell) / lot area |
| 266: | excess = if coverage > max coverage then coverage − max coverage else 0 |
| 267: | return {max coverage, coverage, excess} |
| 268: | area stats(specimen, heights) = |
| 269: | area in one cell = $(cell\ size)^2$ |
| 270: | area = 0 |
| 271: | spread = 0 |
| 272: | centrality sum = 0 |
| 273: | centrality weights = 0 |
| 274: | for each cell {x,y}: |
| 275: | if specimen.shape[x, y] is level: |
| 276: | area here = area in one cell * (heights.computed[level] in storeys) |
| 277: | area += area here |
| 278: | spread += 1 |
| 279: | centrality weight = 1 / (1 + (abs(x − width/2) + abs(y − height/2))/2) |
| 280: | centrality sum += area here * centrality weight |
| 281: | centrality weights += centrality weight |
| 282: | centrality = centrality sum / centrality weights |
| 283: | FAR = area / lot area |
| 284: | return {area, FAR, spread, centrality} |
| 285: | parking stats(specimen, area stats) = |
| 286: | area in one cell = $(cell\ size)^2$ |
| 287: | units for parking = area stats.area / params.assumed unit size for parking |
| 288: | required parking = ceil(units for parking * params.parking per dwelling unit) |
| 289: | surface parking area = (count cells that are parking) * area in one cell |
| 290: | surface parking = floor(surface parking area / params.surface parking space area) |
| 291: | underground parking = |
| 292: | if params.underground parking permitted: |
| 293: | required parking − surface parking or at least 0 |
| 294: | else: |
| 295: | 0 |
| 296: | underground parking area = |
| 297: | underground parking * params.underground parking space area |
| 298: | return { |
| 299: | required parking, |
| 300: | surface parking, |
| 301: | surface parking area, |
| 302: | underground parking, |
| 303: | underground parking area |
| 304: | } |
| 305: | connectedness(specimen) = |
| 306: | connected = 0 |
| 307: | alone = 0 |
| 308: | for each cell {x, y}: |
| 309: | if specimen.shape[x, y] is not empty: |
| 310: | neighbors = values of specimen.shape for following coordinates: |
| 311: | (x − 1, y − 1), |
| 312: | (x − 1, y + 1), |
| 313: | (x + 1, y − 1), |
| 314: | (x + 1, y + 1) |
| 315: | connected here = count neighbors where value is same as at x, y |
| 316: | if connected here > 0: |
| 317: | connected += connected here |
| 318: | else: |
| 319: | alone += 1 |
| 320: | |
| 321: | return {connected, alone} |

TABLE 3-continued

| Algorithm 3 single-shelter algorithm |
| --- |

```
322:    count walls(specimen, axis) =
323:        walls = 0
324:        wall cells = 0
325:        for each row on axis:
326:            // Edge-detect array – true where the cell is beside a different cell
327:            opposites = array [width] of boolean
328:            for each col on axis: // opposite coordinate of row
329:    value here = specimen.shape[axis, row, col]
330:    next value = specimen.shape[axis, row, col + 1] or empty
331:    opposites[col] = value here is not equal to next value
332:    last opposites = opposites from the previous row or array of all false
333:    for each (new edge, old edge) in (opposites, last opposites):
334:        if old edge = false and new edge = true:
335:            // The value has changed on this row
336:    // while it didn't in the previous row. This is the start of a wall.
337:            walls += 1
338:        if new edge = true:
339:            // Any time the value changed, this is part of a wall
340:            wall cells += 1
341:    return {walls, wall cells}
```

The following table illustrates a multi-building algorithm suitable for use in other speciation described herein:

TABLE 4

| Algorithm 4 multi-building algorithm |
| --- |

```
 1:    building definition := {
 2:        width, // x
 3:        length, // y
 4:        height, // z
 5:        floor area,
 6:        units, // dwelling units contained within the building
 7:        margins {left, right, back, front},
 8:        required padding, // additional unspecified area that must be added around the building
 9:        weight // relative weight for choosing this building
10:    }
11:    params := {
12:        max height,
13:        max area ratio, // FAR
14:        max units,
15:        min lot per unit, // minimum lot area per unit
16:        min lot width,
17:        path size,
18:        conditional limits,
19:        bake setbacks, // whether to put the setbacks on the arena rather than on the buildings
20:        measure outer setbacks, // whether to measure setbacks on the lot edge
21:        one lot only, // whether to only generate a single building
22:        access directions, // directions from which access is available (street/alley on that side)
23:        directions, // directions buildings can face
24:        no obstructions, // buildings must not be obstructed by other buildings to access the street
25:        bias to edge, // prefer buildings toward the edge
26:        building definitions
27:    }
28:    building instance := {
29:        building definition,
30:        origin {x, y},
31:        rotation: 0 | 90 | 180 | 270 degrees,
32:        padding {left, right, back, front}
33:    }
34:    path instance := {
35:        origin {x, y},
36:        size {w, l},
37:        rotation: 0 | 90 | 180 | 270 degrees
38:    }
39:    entity := building instance | path instance
40:    specimen := {
41:        params,
42:        entities array of entity
43:    }
```

TABLE 4-continued

Algorithm 4 multi-building algorithm

```
44:   min change rate = 0.001 // for genetic algorithm
45:   rectangle(entity) =
46:     case entity.rotation of:
47:       0 or 180: w = entity.size.w; l = entity.size.l
48:       90 or 270: w = entity.size.l; l = entity.size.w // flipped
49:     {entity.origin, {w, l}}
50:
51:   // This is defined by the parameters of the building definition
52:   building instance.size =
53:     {margins.left + width + margins.right, margins.front + length + margins.back]
54:   random specimen =
55:     insert random pattern(empty specimen)
56:   normalize(specimen) =
57:     if params.one lot only:
58:       keep only first entity in entities
59:     remove entity from entities where entity.direction is not in params.directions
60:     remove entity from entities where rectangle(entity) intersects arena.mask[false]
61:     if params.measure outer setbacks:
62:       remove entity from entities where rectangle(entity) intersects setbacks
63:     for each entity in entities:
64:       // No overlapping entities.
65:       if rectangle(entity) intersects the rectangle of any prior entity in order:
66:         remove entity
67:   crossover(specimen1, specimen2) =
68:     axis = random axis of either X or Y
69:     range = range along axis
70:     split = random point within range
71:     new specimen1 = specimen with entities from (
72:       entities from specimen1 where origin < split along axis +
73:       entities from specimen2 where origin >= split along axis
74:     )
75:     new specimen2 = specimen with entities from (
76:       entities from specimen2 where origin < split along axis +
77:       entities from specimen1 where origin >= split along axis
78:     )
79:     return (normalize(new specimen1), normalize(new specimen2))
80:   mutate(specimen) =
81:     // Try again if we fail to insert anything
82:     up to 4 times try:
83:       insert random pattern(specimen)
84:     if params.one lot only:
85:       entity = choose random entity from entities
86:       remove all from entities except entity // keep a random entity
87:   // weighted random
88:   random definition(params) =
89:     weights sum = sum of weight from params.definitions
90:     for each definition in params.definitions:
91:       let definition.max number = sum of weight from params.definitions prior to and including this definition
92:     number = random number between 0 and weights sum
93:     for each definition in params.definitions:
94:       if number < definition.max number:
95:         return definition
96:   insert random pattern(specimen) =
97:     rectangle = generate random rectangle within arena
98:     remove entities from specimen where rectangle(entity) intersects rectangle
99:     definition = random definition(params)
100:    rotation = randomly choose {0, 90, 180, 270}
101:    movement axis = case rotation of:
102:      0 or 180: Y
103:      90 or 270: X
104:    movement direction = case rotation of:
105:      0 or 90: Positive
106:      180 or 270: Negative
107:    // each row is the length of two buildings and a path
108:    for each row along movement axis in movement direction within rectangle:
109:      for each column opposite movement axis
110:    in movement direction within rectangle:
111:      for every 7th column:
112:        insert path instance covering entire column
113:      else:
114:        // buildings are facing the path
115:        insert building instance with opposite(rotation)
116:        insert path instance
117:        insert building instance with rotation
118:  fitness(specimen) =
119:    floor area = sum of building definition.floor area for each building instance
```

TABLE 4-continued

Algorithm 4 multi-building algorithm

| | |
|---|---|
| 120: | FAR = floor area / lot area |
| 121: | units count = sum of building definition.units for each building instance |
| 122: | variations = count distinct building definition for each building instance |
| 123: | max units = |
| 124: |   if params.min lot per unit: |
| 125: |     density based limit = floor(lot area / params.min lot per unit) |
| 126: |     lesser of density based limit or params.max units |
| 127: |   else: |
| 128: |     params.max units |
| 129: | excess units = |
| 130: |   if max units is set and units count > max units: |
| 131: |     units count − max units |
| 132: |   else: |
| 133: |     0 |
| 134: | with edge bias(specimen) |
| 135: | with facing preference(specimen) |
| 136: | with reachability(specimen) |
| 137: | return sum: |
| 138: |   (if params.max FAR is set: |
| 139: |     if FAR < params.max FAR: |
| 140: |       $-1 * (1 + 60 * (\text{max FAR} - \text{area stats.FAR}))^2$ |
| 141: |     else if FAR > params.max FAR: |
| 142: |       // being over the max FAR is worse |
| 143: |       $-1 * (1 + 120 * (\text{FAR} - \text{max FAR}))^2$ |
| 144: |     else: |
| 145: |       0 |
| 146: |   else: |
| 147: |     $2 * (\text{floor area})^{1.4}$ |
| 148: |   ) + |
| 149: |   1000 * (units count) + |
| 150: |   $20 * (\text{facing preference})^{1.2}$ + |
| 151: |   $-50 * (4 * (\text{variations} - 1))^2$ + |
| 152: |   $-1 * (100000 * \text{excess units})^2$ + |
| 153: |   $50 * (4 * \text{reachability.touching paths})^2$ + |
| 154: |   $-200 * (4 * \text{reachability.not connected})^2$ + |
| 155: |   $25 * (4 * \text{reachability.extra path touches})^{1.2}$ + |
| 156: |   $-100 * (\text{reachability.path edges})^2$ + |
| 157: |   (if params.bias to edge: |
| 158: |     100 * edge bias |
| 159: |   else: |
| 160: |     0) |
| 161: | facing preference(specimen) = |
| 162: |   sum for each building instance: |
| 163: |     case rotation of: |
| 164: |       0:    10 * building definition.units // front |
| 165: |       90 or 270:  3 * building definition.units // right or left |
| 166: |       180:  1 * building definition.units // back |
| 167: | reachability(specimen) = |
| 168: |   touching paths = 0 |
| 169: |   not connected = 0 |
| 170: |   extra path touches = 0 |
| 171: |   path edges = 0 |
| 172: |   clear to edge = 0 |
| 173: |   is covered by path(x0, y0, x1, y1) = |
| 174: |     for each box-wise (x, y) between (x0, y0) and (x1, y1): |
| 175: |       if entity intersecting (x, y) is path instance: |
| 176: |         return true |
| 177: |       otherwise false |
| 178: |   // Boxes covering the given edge of the given box to the edge of the arena |
| 179: |   edge sweep(left, x0, y0, x1, y1) = (0, y0, x0 − 1, y1) |
| 180: |   edge sweep(right, x0, y0, x1,y1) = (x1, y0, arena.width, y1) |
| 181: |   edge sweep(back, x0, y0, x1, y1) = (x0, 0, x1, y0 − 1) |
| 182: |   edge sweep(front, x0, y0, x1, y1) = (x0, y1, x1, arena.height) |
| 183: |   // check edge of box is not obstructed |
| 184: |   box clear to(direction, x0, y0, x1, y1) = |
| 185: |     if x0 > x1 then swap x0 with x1 |
| 186: |     if y0 > y1 then swap y0 with y1 |
| 187: |     (cx0, cy0, cx1, cy1) = edge sweep(direction, x0, y0, x1, y1) |
| 188: |     for each box-wise (x, y) between (x0, y0) and (x1, y1): |
| 189: |       if entity exists intersecting (x, y): |
| 190: |         return false |
| 191: |     otherwise true |
| 192: |   for each building instance entity: |
| 193: |     (x, y, w, l) = rectangle(entity) |
| 194: |     units = building definition.units |
| 195: |     // each side |
| 196: |     path touches = count where true: |
| 197: |       is covered by path(x, y − 1, x + w, y), |

TABLE 4-continued

Algorithm 4 multi-building algorithm

```
198:              is covered by path(x, y + l, x + w, y + l + 1),
199:              is covered by path(x − 1, y, x, y + l),
200:              is covered by path(x + w, y, x + w + 1, y + l)
201:           if path touches > 0:
202:              touching paths += units
203:              extra path touches += (path touches − 1) * units
204:           else:
205:              direction = entity.rotation as direction
206:              accessible = params.access directions contains direction
207:              if accessible and box clear to(direction, x, y, x + w, y + l):
208:                 clear to edge += units
209:              else:
210:                 not connected += units
211:        for each path instance entity:
212:           (x, y, w, l) = rectangle(entity)
213:           path edges += count where false:
214:              is covered by path(x, y − 1, x + w, y),
215:              is covered by path(x, y + l, x + w, y + l + 1),
216:              is covered by path(x − 1, y, x, y + l),
217:              is covered by path(x + w, y, x + w + 1, y + l)
218:        return {touching paths, not connected, extra path touches, path edges, clear to edge}
219:     edge bias(specimen) =
220:        search(left) = (X, forward)
221:        search(right) = (X, reverse)
222:        search(back) = (Y, forward)
223:        search(front) = (Y, reverse)
224:        average score = none for each side
225:        min score = none for each side
226:        max score = none for each side
227:        for each side:
228:           (axis, pattern) = search(side)
229:           gaps = empty list
230:           for each row in arena on axis:
231:              entity = none
232:              counting = false
233:              initial gap = 0
234:              for each column on the opposite axis via pattern:
235:                 if there is a building instance entity here at axis(row, column):
236:                    entity = entity here
237:                    break loop
238:                 else:
239:                    // Count how much of a gap we have before any
240:                    // building instances at the beginning of the row inside
241:                    // the lot line
242:                    if arena.mask[x, y] is true:
243:                       counting = true
244:                       initial gap += 1
245:                    else:
246:                       if counting then initial gap += 1
247:              if entity is set and entity is facing side:
248:                 push(gaps, cells to metres(initial gap))
249:           average score[side] = 1 / (0.1 + (sum gaps / count gaps)/100)
250:           min score[side] = 1 / (0.1 + (minimum value in gaps)/100)
251:           max score[side] = 1 / (0.1 + (maximum value in gaps)/100)
252:        average score mean = average of average score for each side
253:        min score mean = average of min score for each side
254:        max score mean = average of max score for each side
255:        return (average score mean + min score mean + max score mean) / 3
```

While various system, method, article of manufacture, or other embodiments or aspects have been disclosed above, also, other combinations of embodiments or aspects will be apparent to those skilled in the art in view of the above disclosure. The various embodiments and aspects disclosed above are for purposes of illustration and are not intended to be limiting, with the true scope and spirit being indicated in the final claim set that follows.

In the numbered clauses below, first combinations of aspects and embodiments are articulated in a shorthand form such that (1) according to respective embodiments, for each instance in which a "component" or other such identifiers appear to be introduced (e.g., with "a" or "an,") more than once in a given chain of clauses, such designations may either identify the same entity or distinct entities; and (2) what might be called "dependent" clauses below may or may not incorporate, in respective embodiments, the features of "independent" clauses to which they refer or other features described above.

Clauses

1. A machine learning method for facilitating multi-parcel development (e.g., comprising one or more data flows 2500, 2600 or operational flows 2100, 2200, 2300, 2400, 2700 described above) comprising:

invoking first transistor-based circuitry (e.g. one or more instances of interface modules 331) configured to cause a first presentation 834 of a first project site prioritization 833, 1933A favoring first-type and second-type project options 1584, 1984A-B (e.g. respectively corresponding to species 1024 and species 1025) over a third-type composite project option 1584, 1984 (e.g. corresponding to species 1022 or species 1023) to be presented to a first device user 10D wherein the first presentation 834 corresponds (at least) to a rendered image 296 depicting at least one geometric shape 1564 of at least one of the first-type composite project option 1584, 1984A or the second-type project option 1584, 1984B and wherein the first device user 10D is associated with second and third device users 10A-B; and invoking second transistor-based circuitry (e.g. one or more control and response modules 332, 336 jointly) configured to express a second project site prioritization 833, 1933B later favoring the third-type composite project option 1584, 1984 over the first-type and second-type project options 1584, 1984A-B to the first device user 10D partly based on the second and third device users 10A-B having disparaged the first-type composite project option 1584, 1984A and partly based on an explicit indication 840 (e.g. from a first indexing module 335) of a preference 466, 866 of the first device user 10D for the third-type composite project option 1584, 1984 whereby an expression 850 of the second project site prioritization 833, 1933B later favoring the third-type composite project option 1584, 1984 over the first-type and second-type project options 1584, 1984A-B is obtained that comprises a rendered image 296, 1096 depicting at least one geometric shape 1564 of the third-type composite project option 1584, 1984.

2. A machine learning method for facilitating multi-parcel development (e.g., comprising one or more data flows 2500, 2600 or operational flows 2100, 2200, 2300, 2400, 2700 described above) comprising:

invoking transistor-based circuitry (e.g. one or more interface modules 331) configured to cause a first presentation 834 of a first plurality of project options 1284, 1584, 1984 on a first map 835 (e.g. in a depiction 297A-G that shows a geographic shape such as by latitude and longitude) or ranked list 473 so that a position 1212 of a first option 1284A, 1284D of the project options is more forward (e.g. "approaching a lake" or "downhill" or toward some other latent or apparent user preference) than a position of a second option 1284B (e.g. at minimum 1301B) of the project options and so that a position of a third option 1284C (e.g. at maximum 1302B) of the project options is more forward than the position of the first option 1284A, 1284D of the project options; and invoking transistor-based circuitry (e.g. one or more indexing modules 335) configured to evaluate candidate positions using a scoring protocol 476D that is optimized at a position 1303B further forward than a range 1242 that includes the first and third options 1284A, 1284C by a distance 1343 substantially proportional to a magnitude of a forward net change 2044 (i.e. within a factor of 2) corresponding to a first positional distribution 2050 of project options 1284 to a later second positional distribution 2050 of project options 1284 conditionally in response 1525 to a first indication 840 of said forward net change 2044.

3. A machine learning method for facilitating multi-parcel development (e.g., comprising one or more data flows 2500, 2600 or operational flows 2100, 2200, 2300, 2400, 2700 described above) comprising:

invoking transistor-based circuitry (e.g. one or more interface modules 331) configured to cause a first presentation 834 of a first plurality of project options 1284, 1584, 1984 on a first map 835 (e.g. in a depiction 297A-G that shows a geographic shape such as by latitude and longitude) or ranked list 473 so that a position 1212 of a first option 1284A, 1284D of the project options is more forward (e.g. toward an user-signaled path 1089, range 1242, or item or in some other direction 2012 that a current user might generally favor) than a position of a second option 1284B (e.g. at minimum 1301B) of the project options and so that a position of a third option 1284C (e.g. at maximum 1302B) of the project options is more forward than the position of the first option 1284A, 1284D of the project options; and invoking transistor-based circuitry (e.g. one or more indexing modules 335) configured to evaluate candidate positions using a scoring protocol 476D that is optimized at a position 1303B offset further forward than a range 1242 that includes the first and third options 1284A, 1284C by a distance 1343 within an order of magnitude of a forward net change 2044 (i.e. within a factor of 10) from a first geographic or other positional distribution 2050 of project options 1284 to a later second positional distribution 2050 of project options 1284 conditionally in response 1525 to a first indication 840 of said forward net change 2044.

4. The machine learning method of any of the above methods comprising:

invoking transistor-based circuitry (e.g. one or more speciation modules 333) configured to develop a highest-scoring one of the candidate positions 1212 through numerous iterations 1424 of refinement speciation 975 using the scoring protocol 476D conditionally in response 1525 to the first indication 840 of the forward net change 2044 from the first positional distribution 2050 of earlier-favored project options 1284 to the later second positional distribution 2050 of project options 1284C-D, wherein (at least) an addition of the third option 1284C contributes positively to the forward net change 2044 (e.g. to a user's "favorites" list 473 or other favored set of species, options, or project sites of an earlier distribution so that a later version of the distribution 2050 it is treated as favored).

5. The machine learning method of any of the above methods comprising:

invoking transistor-based circuitry (e.g. one or more speciation modules 333) configured to develop a highest-scoring one of the candidate positions 1212 through very numerous iterations 1424 of refinement speciation 975 using the scoring protocol 476D automatically and conditionally in response 1525 to the first indication 840 of the forward net change 2044 from the first positional distribution 2050 of earlier-favored project options 1284 to the later second positional distribution 2050 of project options 1284C-D, wherein an addition of the third option 1284C and a removal/omission 778 of the second option 1284B (e.g. from a user's "favorites" list 473 or other favored set of species, options, or project sites of an earlier distribution so that a later version of the distribution 2050 it is not treated as favored) each contributes positively to the forward net change 2044.

6. A machine learning method for facilitating multi-parcel development (e.g., comprising one or more data flows 2500, 2600 or operational flows 2100, 2200, 2300, 2400, 2700 described above) comprising:

invoking first transistor-based circuitry (e.g. one or more instances of interface modules 331) configured to cause a first presentation 834 of a first project site prioritization 833, 1933A favoring first-type and second-type project options 1584, 1984A-B (e.g. respectively corresponding to species 1024 and species 1025) over a third-type composite project option 1584, 1984 (e.g. corresponding to species 1022 or species 1023) to be presented to a first device user 10D wherein the first presentation 834 corresponds (at least) to a rendered image 296 depicting at least one geometric shape 1564 of at least one of the first-type composite project option 1584, 1984A or the second-type project option 1584, 1984B; and invoking second transistor-based circuitry (e.g. one or more control and response modules 332, 336 jointly) configured to express a second project site prioritization 833, 1933B later favoring the third-type composite project option 1584, 1984 over the first-type and second-type project options 1584, 1984A-B to the first device user 10D partly based on one or more indications 840 (e.g. from a first indexing module 335) signaling that the first device user 10D (apparently) has a geographic preference 466, 866 for a vicinity 600 of the third-type composite project option 1584, 1984 over a vicinity of the first-type composite project option 1584 (e.g. favoring options in one district of the third type over those in another or favoring an area 779 on one side of a geographic boundary 1918 instead of an opposite side that contains the first-type composite project option 1584, 1984) and partly based on the one or more indications 840 (e.g. from a second indexing module 335) signaling that the first device user 10D is (apparently or actually) more concerned about the third-type composite project option 1584, 1984 than about the second-type composite project option 1584, 1984 whereby an expression 850 of the second project site prioritization 833, 1933B later favoring the third-type composite project option 1584, 1984 over the first-type and second-type project options 1584, 1984A-B signaling the second project site prioritization 833, 1933B that comprises a rendered image 296, 1096 depicting at least one geometric shape 1564 of the third-type composite project option 1584, 1984 is thereby presented to the first device user 10D.

7. A machine learning method for facilitating multi-parcel development (e.g., comprising one or more data flows 2500, 2600, 2700 or operational flows 2100, 2200, 2300, 2400 described above) comprising:

invoking transistor-based circuitry (e.g. one or more instances of interface modules 331) configured to cause a depiction 297 of an augmented first species 201A of a first composite project site 123A that combines a first-type subject parcel 161A with a second-type primary parcel 162A; and invoking transistor-based circuitry (e.g. one or more instances of authorization modules 334) configured to respond to a first user request 851 in reference to the second-type primary parcel 162A (e.g. clicking a "show owner" button or other such action 1594 indicative of a desire to display such metadata) by presenting an indication 840 of one or more second-type parcels 162 that include a second-type alternative parcel 162B wherein responding to the first user request 851 in reference to the second-type primary parcel 162A comprises invoking transistor-based circuitry (e.g. one or more instances of speciation modules 333) configured to develop (at least) an augmented (version 862 of a) species 201B of a second composite project site 123B that combines a virtual building model 202C spanning (at least) a third-type associated parcel 163B with the second-type alternative parcel 162B and wherein the first-type, second-type, and third-type parcels are all mutually exclusive (i.e. wherein no first-type parcel overlaps a second- or third-type parcel and no second-type parcel overlaps a third-type parcel).

8. The machine learning method of any of the above methods wherein one or more virtual building models 202 span two or more land parcels 160-164 of a composite project site 123A-B through numerous iterations 1424 of refinement speciation 975 as a conditional response 1525 to a project site prioritization 833, 1933.

9. The machine learning method of any of the above methods wherein one or more virtual building models 202 span two or more land parcels 160-164 of a composite project site 123A-B through very numerous iterations 1424 of refinement speciation 975 as a conditional response 1525 to a selective user action 1594 (e.g. a parcel selection).

10. The machine learning method of any of the above methods wherein one or more first-type parcels 161 including a first-type subject parcel 161A (thereof are included and) are each owned by a first entity 610A who does not own a second-type primary parcel 162A (thereof that is also included) and that is owned by a second entity 610B and wherein the method comprises:

invoking transistor-based circuitry (e.g. one or more instances of control modules 332) configured to present a depiction 297B of an augmented species 201B of a second composite project site 123B that combines at least the second-type alternative parcel 162B with a third-type associated parcel 163B as a (primary aspect of a) conditional response 1525 to a particular user action 1594 upon an indication 840 of one or more second-type parcels 162.

11. The machine learning method of any of the above methods wherein one or more first-type parcels 161 including the first-type subject parcel 161A are each owned by a first entity 610A who does not own the second-type primary parcel 162A and that are each owned by a second entity 610B who does not own any of the first-type parcels and wherein the method comprises:

invoking transistor-based circuitry (e.g. one or more instances of control modules 332) configured to present a depiction 297B of an augmented species 201B of a second composite project site 123B that combines at least the second-type alternative parcel 162B with a third-type associated parcel 163B as a (primary aspect of a) conditional response 1525 to a first user action 1594 upon (a control 255 representing or otherwise relating to) the second composite project site 123B.

12. The machine learning method of any of the above methods wherein a first type 370, 670A is defined so that one or more first-type parcels 161 (i.e. parcels of the first type 370, 670A) including the first-type subject parcel 161A are 100% owned by a first entity 610A who does not own the second-type primary parcel 162A; wherein a second type 370, 670B is defined so that second-type parcels 162 including the second-type alternative parcel 162B are 100% owned by a second entity 610B; and wherein one or more third-type parcels 163 including the third-type associated parcel 163B are 100% owned by a third entity 610.

13. The machine learning method of any of the above methods comprising:

generating a first draft message 1560 configured with both an indication 840 of one or more second-type parcels 162 that include a second-type alternative parcel 162B and a routing element 1559 associated with a second entity 610B who owns the one or more second-type parcels 162 as a conditional response 1525 to a second user action 1594 at a client device 1700 of another user 10; and transmitting a final version 862 of the message 1560 that includes at least the indication 840 of one or more second-type parcels 162 that include the second-type alternative parcel 162B to the second entity 610B using the routing element 1559 wherein the final version 862 of the message 1560 identifies the second-type alternative parcel 162B but does not identify the second-type primary parcel 162A 14. The machine learning method of any of the above methods comprising:

obtaining an augmented species 201B of a second composite project site 123B so as to combine at least a second-type alternative parcel 162B with a third-type associated parcel 163B and also with a building model 202 spanning two or more parcels 162B, 163B of the second composite project site 123B, wherein responding to a first user request 851 in reference to the second-type primary parcel 162A comprises:

invoking transistor-based circuitry (e.g. one or more instances of response modules 336) configured to identify a third-type associated parcel 163B owned by a third entity 610 as being suitable for combination with a second-type alternative parcel 162B owned by a second entity 610B and invoking transistor-based circuitry (e.g. one or more instances of speciation modules 333) configured to develop (at least) an augmented species 201B of the second composite project site 123B that combines a virtual building model 202C spanning at least the third-type associated parcel 163B owned by the third entity 610 with the second composite project site 123B both as a conditional response 1525 to a second user action 1594, wherein developing the augmented first species 201B of the second composite project site 123B comprises implementing one or more deterministically repeatable speciation protocols 476B upon the second composite project site 123B using a first multi-parcel-site-specific seeding configuration 1572 with the first user action 1594.

15. The machine learning method of any of the above methods wherein a scoring protocol 476D that affects a prioritization 833, 1933 places a positive incremental value 853 on a defined user action 1594 at a zone 786, label, or other component of a map-resident first marker 785, 1185.

16. The machine learning method of any of the above methods wherein a scoring protocol 476D as described herein places a lesser-but-positive value 853 upon an earlier action 1594 at the particular marker 785, 1185 than upon said defined action 1594 at the particular marker 785, 1185.

17. The machine learning method of any of the above methods comprising:

invoking transistor-based circuitry (e.g. one or more control modules 332) configured to add at least one option 1284 corresponding to the highest-scoring one of the candidate positions 1212 to the first map as an eligible new development option 1284K.

18. The machine learning method of any of the above methods comprising:

invoking transistor-based circuitry (e.g. one or more indexing modules 335) configured to signal a cardinal direction 2012 as "forward" among dozens of azimuths or more as a conditional response 1525 to one or more user actions 1594 signaling an apparent or other user preference 466, 866.

19. The machine learning method of any of the above methods comprising:

invoking transistor-based circuitry (e.g. one or more indexing modules 335) configured to signal a down-size direction 2012 as or up-size direction 2012 as "forward" among several operating parameters 2047 as a conditional response 1525 to one or more user actions 1594 signaling a first (apparent or other) user preference 466, 866.

20. The machine learning method of any of the above methods comprising:

invoking transistor-based circuitry (e.g. one or more indexing modules 335) configured to signal a "forward" direction 2012 as a conditional response 1525 to one or more user actions 1594 signaling a change 2044 of a user's favored project type(s) 370.

21. The machine learning method of any of the above methods wherein establishing a forward net change 2044 comprises:

obtaining a first positional distribution 2050 comprising a range 1242 that includes several candidate species 1025 including a most-forward candidate species 1025 having a most-forward offset 2005E; and obtaining a second positional distribution 2050 comprising the forward net change 2044 partly based on several offsets 2005 that each correspond to a corresponding one of the several candidate species 1025 and partly based on an addition/inclusion 788 of the most-rearward offset 2005H to the first positional distribution 2050 so that a foremost component of the second positional distribution 2050 advances forward.

22. The machine learning method of any of the above methods wherein establishing a forward net change 2044 comprises:

obtaining a first positional distribution 2050 comprising a range 1242 that includes several candidate species 1025 including a most-rearward candidate species 1025 having a most-rearward offset 2005H; and obtaining a second positional distribution 2050 comprising the forward net change 2044 partly based on several offsets 2005 that each correspond to a corresponding one of the several candidate species 1025 and partly based on user's deletion or other removal/omission 778 of the most-rearward offset 2005H from the first positional distribution 2050 so that a rearmost component/portion of the second positional distribution 2050 shrinks forward.

23. The machine learning method of any of the above methods wherein a forward net change 2044 (has been detected and) comprises a combination of a particular option 1284C (apparently or actually) becoming favored via user input 1708 (e.g. a favorable signal 703A from a first device user 10D) at a first device 1700 and another particular option 1284F becoming unfavored (e.g. by obtaining an unfavorable signal 703B from the first device user 10D) at the first device 1700.

24. The machine learning method of any of the above methods comprising:

invoking fifth transistor-based circuitry (e.g. one or more transmission modules 338) configures to cause an expression 850 of the highest-scoring one of the candidate positions 1212 by presenting a rendered image 296 depicting at least one geometric building shape 1564 spanning parcels of an eligible new development option 1284.

25. The machine learning method of any of the above methods wherein 100% of all third-type parcel(s) 163 are owned by a third entity 610 including the third-type associated parcel 163B.

26. The machine learning method of any of the above methods wherein one or more virtual building models 202 span two or more land parcels 160-164 of the third-type composite project option 1584, 1984 of the second presentation 834 through numerous iterations 1424 of refinement speciation 975 as a conditional response 1525 to the second project site prioritization 833, 1933B.

27. The machine learning method of any of the above methods wherein the second and third device users 10A-B having disparaged the first-type composite project option 1584, 1984A 1584, 1984A is deemed an implicit indication of a preference 466, 866 of the first device user 10D for the third-type composite project option 1584, 1984 over the first-type project option 1584, 1984A implied by the first device user 10D being associated with second and third device users 10A-B.

28. The machine learning method of any of the above methods wherein the explicit indication 840 expresses a first (dismissal or other) unfavorable signal 703B pertaining to the second-type project option 1584, 1984B as a preference 466, 866 of the first device user 10D for the third-type composite project option 1584, 1984 over at least the second-type project option 1584, 1984B.

29. The machine learning method of any of the above methods comprising:

invoking transistor-based circuitry (e.g. one or more instances of machine learning modules 337) configured to improve a first inclusion 788 spanning (a boundary between) the second-type parcel 162 and another parcel of a second-type site species 1022 through numerous iterations 1424 of refinement speciation 975 as a conditional real-time response 1525 to the second project site prioritization 833, 1933B; and 30. The machine learning method of any of the above methods comprising:

invoking transistor-based circuitry configured to improve a first inclusion 788 spanning (a boundary between) the second-type parcel 162 and another parcel of the second-type site species 1022 through numerous iterations 1424 of refinement speciation 975 as a conditional real-time response 1525 to the second project site prioritization 833, 1933B; and initiating a development 1400B (e.g. by an additional machine learning module 337) of an additional inclusion 788 spanning (at least one boundary between) the first-type parcel 161 and another parcel of the first-type site species 1021 through numerous iterations 1424 of speciation 975 as a conditional real-time response 1525 to the second project site prioritization 833, 1933B.

31. The machine learning method of any of the above methods wherein an other-type composite project option 1584, 1984 features a first-type site species 1021 comprising a first-type parcel 161, the method comprising:

automatically initiating a development 1400B of an additional (instance of an) inclusion 788 spanning (at least one boundary between) the first-type parcel 161 and another parcel of the first-type site species 1021 through numerous iterations 1424 of speciation 975 as a conditional real-time response 1525 to the second project site prioritization 833, 1933B.

32. The machine learning method of any of the above methods wherein the first device user 10D is associated a cohort of other device users 10A-C by one or more geographic terms 1590 (e.g. postal codes 371 or place names).

33. The machine learning method of any of the above methods wherein the first device user 10D is associated a cohort of other device users 10A-C (at least) by one or more natural language place names (e.g. identifiers 448 of a neighborhood, county, or city 446)

34. The machine learning method of any of the above methods wherein the first device user 10D is associated a cohort of other device users 10A-C by one or more selective terms 1590 (e.g. search terms, project types, or other categorical selections 2694) used by all members of the cohort.

35. The machine learning method of any of the above methods wherein an other-type composite project option 1584, 1984 features a first-type site species 1021 comprising a first-type parcel 161, the method comprising:

automatically initiating a development 1400B of an additional (instance of an) inclusion 788 spanning (at least one boundary between) the first-type parcel 161 and another parcel of the first-type site species 1021 through numerous iterations 1424 of speciation 975 as a conditional response 1525 to a determination that a type 370, 670 of the other-type composite project option 1584, 1984 is preferred by the first device user 10D relative to one or more types 670 of the first-type and second-type composite project options 1584, 1984A-B as a component 769 of the second project site prioritization 833, 1933B.

36. The machine learning method of any of the above methods wherein an other-type composite project option 1584, 1984 features a first-type site species 1021 comprising a first-type parcel 161 and wherein the third-type composite project option 1584, 1984C features a second-type site species 1022 comprising a second-type parcel 162, the method comprising:

initiating a development 1400B of an additional (instance of an) inclusion 788 spanning (at least one boundary between) the first-type parcel 161 and another parcel of the first-type site species 1021 through numerous iterations 1424 of speciation 975 as a conditional response 1525 to the second project site prioritization 833, 1933B; and continuing a development 1400B of an improved inclusion 788 spanning (a boundary between) the second-type parcel 162 and another parcel of the second-type site species 1022 through very numerous iterations 1424 (i.e. at least hundreds) of refinement speciation 975 as a conditional response 1525 to the second project site prioritization 833, 1933B.

37. The machine learning method of any of the above methods wherein an other-type composite project option 1584, 1984 features a first-type site species 1021 comprising a first-type parcel 161 and wherein the third-type composite project option 1584, 1984C features a second-type site species 1022 comprising a second-type parcel 162, the method comprising:

automatically initiating a development 1400B of an additional (instance of an) inclusion 788 spanning (at least one boundary between) the first-type parcel 161 and another parcel of the first-type site species 1021 through numerous iterations 1424 of speciation 975 as a conditional response 1525 to a determination that a type 370, 670 of the other-type composite project option 1584, 1984 is (i.e. at least hundreds preferred by the first device user 10D relative to one or more types of the first-type and second-type composite project options 1584, 1984A-B as a component 769 of the second project site prioritization 833, 1933B; and automatically continuing a development 1400B of an improved inclusion 788 spanning (a boundary between) the second-type parcel 162 and another parcel of the second-type site species 1022 through very numerous iterations 1424 refinement speciation 975 as a conditional response 1525 to a determination that a type of the third-type composite project option 1584, 1984C is (apparently or actually) preferred by the first device user 10D relative to one or more types of the first-type and second-type composite project options 1584, 1984A-B as a component 769 of the second project site prioritization 833, 1933B.

38. The machine learning method of any of the above methods whereby an expression 850 of the second project site prioritization 833, 1933B later favoring the third-type project option 1584, 1984C over the first-type and second-type project options 1584, 1984A-B is obtained that comprises a geographically mapped presentation 834 that corresponds to an updated rendered depiction 297 (e.g. relative to a prior version 862A thereof) of one or more virtual building models 202 that span two or more land parcels 160-164 of a composite project site 121-123 of the updated rendered depiction 297.

39. The machine learning method of any of the above methods wherein the implicit indication 840 of the first device user 10D comprises an unfavorable (signal 703A or other) indication 840B, 840D relating to the first-type composite project option 1584, 1984A from at least one other device user 10 prior to any indication 840 relating to the first-type composite project option 1584, 1984A from the first device user 10D.

40. The machine learning method of any of the above methods wherein the implicit indication 840 of the first device user 10D comprises an unfavorable (signal 703A or other) indication 840B, 840D relating to the first-type composite project option 1584, 1984A from at least one other device user 10 in lieu of any indication 840 relating to the first-type composite project option 1584, 1984A from the first device user 10D.

41. The machine learning method of any of the above methods wherein the first geographically mapped presentation 834 includes a rendered image 296, 1096 (depicting at least one parcel or building shape 1564) of the second-type composite project option 1584, 1984B and wherein the explicit indication 840 (e.g. from one or more indexing modules 335) of the first device user 10D comprises a first unfavorable signal 703A presented simultaneously with the rendered image 296, 1096 (e.g. depicting at least one parcel or building shape 1564) of one or more other-type composite project options 1584, 1984B, 1584, 1984D (e.g. as a contextually explicit disparaging action 1594 thereof).

42. The machine learning method of any of the above methods wherein the first geographically mapped presentation 834 includes a rendered image 296, 1096 (depicting at least one parcel or building shape 1564) of the third-type composite project option 1584, 1984C.

43. The machine learning method of any of the above methods wherein the first geographically mapped presentation 834 includes a building shape 1564 of the first-type composite project option 1584, 1984A and wherein the second geographically mapped presentation 834 includes a building shape 1564 of the third-type composite project option 1584, 1984C in lieu of the building shape 1564 of the first-type composite project option 1584, 1984A.

44. The machine learning method of any of the above methods wherein the first geographically mapped presentation 834 includes a parcel shape 1564 of the first-type composite project option 1584, 1984A and wherein the second geographically mapped presentation 834 includes a parcel shape 1564 of the third-type composite project option 1584, 1984C in lieu of the parcel shape 1564 of the first-type composite project option 1584, 1984A.

45. The machine learning method of any of the above methods wherein each of the expressions 850 of a project site prioritization 833, 1933A comprises a geographically mapped presentation 834 that includes a rendered depiction 297 of one or more virtual building models 202 that span two or more land parcels 160-164 not commonly owned.

46. The machine learning method of any of the above methods wherein expressing a second project site prioritization 833, 1933B favoring the third-type project option 1584, 1984C (e.g. corresponding to a second-type species 1022) over the first-type and second-type project options 1584, 1984A-B comprises:

automatically and conditionally developing an additional (instance of a) third-type project option 1584, 1984; and modifying the geographically mapped presentation 834 to include an additional (instance of a) species 1022 of the additional third-type project option 1584, 1984C.

47. The machine learning method of any of the above methods comprising:

invoking transistor-based circuitry (e.g. one or more instances of interface modules 331) configured to associate the first user 10D at least with the second and third device users 10 based on at least these device users 10A-D all having disparaged at least the second-type project option 1584, 1984B and one or more other-type project options 1584, 1984 (directly or otherwise) but not having disparaged at least one other-type species 1026.

48. The machine learning method of any of the above methods comprising:

invoking transistor-based circuitry (e.g. one or more instances of interface modules 331) configured to associate the first user 10D at least with the second and third device users 10 based on at least these device users 10A-D all having disparaged at least one other-type project option 1584, 1984 directly by dismissing or otherwise disparaging at least one species 1025B that is of the same type as that one other-type project option 1584, 1984.

49. The machine learning method of any of the above methods comprising:

invoking transistor-based circuitry (e.g. one or more instances of interface modules 331) configured to associate the first user 10D at least with the second and third device users 10 based on at least these device users 10A-D all having disparaged at least one other-type project option 1584, 1984 indirectly by navigating away from the one other-type project option 1584, 1984.

50. The machine learning method of any of the above methods comprising:

invoking transistor-based circuitry (e.g. one or more instances of interface modules 331) configured to associate the first user 10D at least with the second and third device users 10 based on at least these device users 10A-D all having disparaged at least one other-type project option 1584, 1984 indirectly by using an interface map 835 for a long-enough period (e.g. for a period 1592 longer than a programmatic time limit that is more than an hour) without ever expressing any interest in any other-type project option 1584, 1984 thereof.

51. The machine learning method of any of the above methods comprising:

invoking transistor-based circuitry (e.g. one or more instances of interface modules 331) configured to associate the first user 10D at least with the second and third device users 10 based on at least these device users 10A-D all having disparaged at least one unwanted-type project option 1584, 1984 indirectly by choosing several favorite options 1584, 1984 (e.g. as favorite species 1022, 1023 or inclusions 788C-D thereof) of which none are of a corresponding unwanted type.

52. The machine learning method of any of the above methods comprising:

invoking transistor-based circuitry (e.g. one or more instances of interface modules 331) configured to associate the first user 10D at least with the second and third device users 10 based on the first, second, and third device users all having (selected or otherwise) expressed one or more (municipally defined or other) values 853 that "selectively" qualify all of the first-, second-, and third-type project options 1584, 1984A-C for inclusion in the first project site prioritization 833, 1933A wherein the qualification is selective insofar that at least one other-type species 1026 is excluded.

53. The machine learning method of any of the above methods comprising:

invoking transistor-based circuitry (e.g. one or more instances of interface modules 331) configured to associate the first user 10D at least with the second and third device users 10 based on the first, second, and third device users all having expressed a first land use classification 838 as one or more (parcel-descriptive or other) zoning values 853A that selectively qualifies all of the first-, second-, and third-type project options 1584, 1984A-C for inclusion in the first project site prioritization 833, 1933A (e.g. by excluding at least one other-type project option 1584, 1984).

54. The machine learning method of any of the above methods wherein the implicit indication 840 of the first device user 10D comprises a first unfavorable signal 703A presented while the rendered image 296, 1096 depicts at least one parcel shape 1564 of the first-type composite project option 1584, 1984A.

55. The machine learning method of any of the above methods wherein the implicit indication 840 (e.g. from a first indexing module 335) of the first device user 10D comprises a first ("show less" control 225 being activated or other) unfavorable signal 703A presented simultaneously with the rendered image 296, 1096 depicting at least one building shape 1564 of the first-type composite project option 1584, 1984A.

56. The machine learning method of any of the above methods wherein the implicit indication 840 of the first device user 10D comprises a first unfavorable signal 703A relating to the rendered image 296, 1096 of the first-type composite project option 1584, 1984A.

57. The machine learning method of any of the above methods wherein after (1) transmitting an expression 850 of an association 854, 2654 between the first project selection parameter 831A and the first device user 10D and an expression 850 of an association 854, 2654 between the second project selection parameter 831B and the first device user 10D both to the first device user 10D and (2) receiving a (dismissal or other) unfavorable signal 703B of the expression of the association 854, 2654 between the first project selection parameter 831A and the first device user 10D (e.g. by a transmission module 338), transistor-based circuitry (e.g. one or more instances of machine learning modules 337) is triggered to cause a development of a fourth-type composite project site selectively (at least partly) based on the second project selection parameter 831B (and not on the first project selection parameter 831A) without the first device user 10D yet having expressly confirmed or positively selected the association 854, 2654 with the second project selection parameter 831B.

58. The machine learning method of any of the above methods wherein after (1) one or more modules 331-338 transmitting an expression 850 of an association 854, 2654 between the first project selection parameter 831A and the first device user 10D and an expression 850 of an association 854, 2654 between the second project selection parameter 831B and the first device user 10D both to the first device user 10D and (2) the one or more modules 331-338 receiving a (deletion or other) unfavorable signal 703B of the expression 850 of the association 854, 2654 between the first project selection parameter 831A and the first device user 10D;

invoking transistor-based circuitry (e.g. one or more instances of control and machine learning modules 332, 337 jointly) configured to cause a development of a fourth-type composite project site selectively (at least partly) based on the second project selection parameter 831B (and not on the first project selection parameter 831A) without the first device user 10D ever having expressly confirmed or positively selected the association 854, 2654 with the second project selection parameter 831B; and invoking transistor-based circuitry (e.g. one or more instances of indexing and transmission modules 335, 338 jointly) configured to cause a geographically mapped presentation 834 of a second project site prioritization 833, 1933B that prioritizes the third- and fourth-type composite project sites over the first-type and second-type composite project sites selectively (at least partly) based on the second project selection parameter 831B (and not on the first project selection parameter 831A) without the first device user 10D ever having (expressly confirmed or otherwise positively) selected the association 854, 2654 with the second project selection parameter 831B.

59. The machine learning method of any of the above Clauses comprising:

obtaining an indication 840 of a subtle interest (e.g. one or more preferences 466, 866) of the first user 10 based on a second-type primary parcel 162A being included in a composite project site 123A without the first user 10 having actuated any controls 225 in that day that coincide with any second-type primary parcel 162.

60. The machine learning method of any of the above Clauses comprising:

obtaining an indication 840 of a subtle interest (e.g. one or more preferences 466, 866) of the first user 10 based on a second-type primary parcel 162A being included in a composite project site 123A without the first user 10 first having actuated any controls 225 in that day that expressly identified any entity 610B that (owns or otherwise) controls any second-type primary parcel 162.

61. The machine learning method of any of the above Clauses comprising:

obtaining an indication 840 of a subtle interest (e.g. one or more preferences 466, 866) of the first user 10 based on a second-type primary parcel 162A being included in a composite project site 123A without the first user 10 having actuated any controls 225 that coincide with any second-type primary parcel 162 or owner thereof; and responding to the subtle interest of the first user 10 in a best second-type primary parcel 162A by determining a plurality of alternative parcels 162 that have a same type 370, 670B with the second-type primary parcel 162A and by obtaining an indication 840 of which of the plurality of alternative parcels 162 is best according to a current scoring protocol 476D.

62. The machine learning method of any of the above Clauses comprising:

obtaining an indication 840 of a subtle interest (e.g. one or more preferences 466, 866) of the first user 10 based on a second-type primary parcel 162A being included in a composite project site 123A without the first user 10 having actuated any controls 225 that coincide with any second-type primary parcel 162 or owner thereof;

responding to the subtle interest of the first user 10 in a best second-type primary parcel 162A by determining a plurality of alternative parcels 162 that have a same type 370, 670B with the second-type primary parcel 162A and by obtaining an indication 840 of which of the plurality of alternative parcels 162 is best according to a current scoring protocol 476D; and presenting to the first user 10 an indication 840 which of the plurality of alternative parcels 162 is the best second-type primary parcel 162A after using a speciation protocol 476B so as to develop a building model 202C that spans the best second-type primary parcel 162A with one or more other parcels 163B of a corresponding project site 123B.

63. The machine learning method of any of the above Clauses comprising:

obtaining an indication 840 of a subtle interest (e.g. one or more preferences 466, 866) of the first user 10 based on a second-type primary parcel 162A being included in a composite project site 123A without the first user 10 having actuated any controls 225 that coincide with any second-type primary parcel 162 or owner thereof;

responding to the subtle interest of the first user 10 in a best second-type primary parcel 162A by determining a plurality of alternative parcels 162 that have a (same entity 610B or other) same type 370, 670B with the second-type primary parcel 162A and by obtaining an indication 840 of which of the plurality of alternative parcels 162 is best according to a current scoring protocol 476D; and presenting to the first user 10 an indication 840 which of the plurality of alternative parcels 162 is the best second-type primary parcel 162A after using a speciation protocol 476B so as to develop a building model 202C that spans the best second-type primary parcel 162A with one or more other parcels 163B of a corresponding project site 123B.

64. The machine learning method of any of the above Clauses wherein an indication 840 which of a plurality of alternative parcels 162 is the best second-type primary parcel 162A includes a single graphical image 296 that shows that the building model 202C spans both the best second-type primary parcel 162A and one or more other parcels 163B (at least).

65. The machine learning method of any of the above Clauses comprising:

generating a preliminary first draft message 1560 configured with both an indication 840 of the one or more second-type parcels 162 that include the second-type alternative parcel 162B and a routing element 1559 (e.g. a mailing/email address 453) associated with a second entity 610B who owns the one or more second-type parcels 162 as a conditional response 1525 to a second user action 1594B at a client device 1700; and transmitting a version of the message 1560 (e.g. after some refinement by way of human input) that includes at least the indication 840 of the one or more second-type parcels 162 that include the second-type alternative parcel 162B to the second entity 610B using the routing element 1559.

66. The machine learning method of any of the above Clauses comprising:

transmitting to an entity that owns both a higher-ranked primary parcel 162A and a lower-ranked alternative parcel 162B a message 1560 that refers to the lower-ranked alternative parcel 162B but does not identify the second-type primary parcel 162A.

67. The machine learning method of any of the above Clauses comprising:

responding to an identification of a particular entity 610B that owns a primary parcel 162A in a higher-ranked composite project site 123A by determining whether the particular entity 610B also owns an alternative parcel 162B and by implementing a speciation protocol 476B upon one or more lower-ranked composite project sites 123B that include the alternative parcel 162B; and thereafter addressing and transmitting to the particular entity 610B a message 1560 that refers to one or more components (e.g. an address or other indication of the alternative parcel 162B) of the lower-ranked composite project site 123B but that does not contain any (identification of or other) emphasis upon the higher-ranked composite project site 123A.

68. The machine learning method of any of the above Clauses comprising:

transmitting to a particular entity 610 that owns both a higher-ranked primary parcel 162A and a lower-ranked alternative parcel 162B a message 1560 that refers to a composite project site 123A that includes the lower-ranked alternative parcel 162B but does not refer (directly to the higher-ranked primary parcel 162A or otherwise) to any composite project site 123B that includes the second-type primary parcel 162A.

69. The machine learning method of any of the above Clauses comprising:

invoking transistor-based circuitry (e.g. a control module 332) configured to obtain (at least) an identification of first and second project sites 121-123 wherein the first project site 121, 123 includes a first parcel 161 adjacent a particular parcel 160 in combination with the particular parcel 160 and wherein each of the first and second project sites 121-123 is a parcel assemblage.

70. The machine learning method of any of the above Clauses comprising:

invoking transistor-based circuitry configured to obtain an identification of first and second project sites 121, 122, 123 wherein a first (actual or other) project site 121, 123 includes a first parcel 161 adjacent a particular parcel 160 in combination with the particular parcel 160 and wherein the second project site 122, 123 likewise includes a second parcel 162 adjacent the particular parcel 160 in combination with the particular parcel 160.

71. The machine learning method of any of the above Clauses comprising:

invoking transistor-based circuitry (e.g. one or more other instances of control modules 332) configured to obtain an identification of first and second project sites 121, 122 wherein the first project site 121 includes a first parcel 161 adjacent a particular parcel 160 in combination with a particular parcel 160 and wherein the second project site 122 likewise includes a second parcel 162 adjacent the particular parcel 160 in combination with the particular parcel 160.

invoking transistor-based circuitry (e.g. one or more instances of speciation modules 333) configured to obtain first and second building models 202 of the first project site 121 each based on a respective application 1577 of first and second speciation protocols 476B to a first multi-parcel-site-specific seeding configuration 1572 associated with the first project site 121.

72. The machine learning method of any of the above Clauses comprising:

invoking transistor-based circuitry configured to obtain an identification of first and second project sites 121, 122 wherein the first project site 121 includes a first parcel 161 adjacent a particular parcel 160 in combination with the particular parcel 160 and wherein the second project site 122 likewise includes a second parcel 162 adjacent the particular parcel 160 in combination with the particular parcel 160; and invoking transistor-based circuitry configured to obtain first and second building models 202 of the first project site 121 each based on a respective application 1577 of first and second speciation protocols 476B to a first multi-parcel-site-specific seeding configuration 1572 associated with the first project site 121.

73. The machine learning method of any of the above Clauses comprising:

invoking transistor-based circuitry (e.g. one or more instances of control modules 332) configured to obtain an identification of first and second project sites 121, 122 wherein a first project site 121 includes a first parcel 161 adjacent a particular parcel 160 in combination with the particular parcel 160 and wherein the second project site 122 likewise includes a second parcel 162 adjacent the particular parcel 160 in combination with the particular parcel 160;

invoking transistor-based circuitry (e.g. one or more instances of speciation modules 333) configured to obtain first and second building models 202 of the first project site 121 each based on a respective application 1577 of first and second speciation protocols 476B to a first multi-parcel-site-specific seeding configuration 1572 associated with the first project site 121; and circuitry (e.g. another one or more instances of speciation modules 333) configured to obtain first and second building models 202 of the second project site 122 each based on a respective application 1577 of first and second speciation protocols 476B to a first multi-parcel-site-specific seeding configuration 1572 associated (at least) with the second project site 122.

74. The machine learning method of any of the above Clauses wherein one or more first-type parcels 161 are each owned by a first entity 610A and wherein one or more second-type parcels 162 are each owned by a second entity 610B.

75. The machine learning method of any of the above Clauses wherein one or more first-type parcels 161 (thereof are included and) are each owned by a first entity 610A; wherein one or more second-type parcels 162 are each owned by a second entity 610B; and wherein one or more third-type parcels 163 are each owned by a third entity 610.

76. The machine learning method of any of the above Clauses wherein the method comprises one or more pattern matching protocols 476E that cause a selection of an augmented first species 201A-C as described herein.

77. The machine learning method of any of the above Clauses wherein the method comprises one or more feature augmentation protocols 476F that cause a first species 201A-C to be augmented in numerous incremental improvements as described herein.

78. The machine learning method of any of the above Clauses comprising:

invoking transistor-based circuitry (e.g. another one or more instances of speciation modules 333) configured to obtain first and second building models 202 of the second composite project site 122 each based on a respective application 1577 of first and second speciation protocols 476B to a first multi-parcel-site-specific seeding configuration 1572 associated (at least) with the second composite project site 122.

79. The machine learning method of any of the above Clauses wherein a first speciation protocol 476B comprises a multi-building model algorithm like that of Table 4 herein.

80. The machine learning method of any of the above Clauses wherein one or more speciation protocols 476B comprises a single-shelter algorithm like that of Table 3 herein.

81. The machine learning method of any of the above Clauses wherein the first and second speciation protocols 476B each comprise a multi-building model algorithm or single-shelter algorithm and wherein seeding 475 for such algorithms comprises a (set of coordinates 861, dimensions 368, or other) repeatable designation of the reference parcel 160 together with a repeatable designation of at least one other parcel(s) thereof.

82. The machine learning method of any of the above Clauses comprising:

triggering a supervised-learning-type protocol 476C that includes pairing numerous vector-valued input objects (e.g. as operational data 405) each to a corresponding output value 853A-B using one or more user-provided inductive biases (e.g. observed user actions 1594).

83. The machine learning method of any of the above Clauses comprising:

triggering a supervised learning protocol 476C that includes pairing first input data that includes (at least) a first composite project site 121 with a corresponding indication 840 of user preference 866 (e.g. activating a control 1595 depicted in an image 296 of the first composite project site 121).

84. The machine learning method of any of the above Clauses comprising:

triggering a supervised learning protocol 476C that includes pairing numerous vector-valued input objects each to a corresponding desired output value 853A-B (e.g. a valuation 380, score 481, selection, rank 488, authorization, or other user-provided preference indication 840) using one or more user-provided inductive biases.

85. The machine learning method of any of the above Clauses comprising:

triggering a supervised learning protocol 476C that includes pairing numerous vector-valued input objects each to a corresponding desired output value 853A-B (e.g. a valuation 380, score 481, selection, rank 488, authorization, or other user-provided preference indication 840) using one or more user-provided inductive biases.

86. The machine learning method of any of the above Clauses comprising:

triggering a feature augmentation protocol 476F that includes an application 1577 of first and second speciation protocols to a first multi-parcel-site-specific seeding configuration 1572 associated with a first composite project site 121 as described herein.

87. The machine learning method of any of the above Clauses comprising:

extracting one or more pattern definition terms 1590 for use in a pattern matching protocol 476E as user input.

88. The machine learning method of any of the above Clauses comprising:

triggering a pattern-matching-type protocol 476E that determines a selective first inclusion of a first composite project site 123 in a geographical map 835.

89. The machine learning method of any of the above Clauses comprising:

triggering a pattern matching protocol 476E that determines a selective first inclusion of a first assemblage in a geographical map 835 of a development site 261, neighborhood, city 446, or other region 311 (e.g. as an inventory of matching models 202 or composite project sites that excludes some others in the region 311 that were not matching).

90. The machine learning method of any of the above Clauses comprising:

triggering a pattern matching protocol 476E that determines a selective first inclusion of a first assemblage and a selective exclusion of one or more other composite project sites within 4 kilometers of a first composite project site both (at least partly) based on an application 1577 of first and second speciation protocols to the first multi-parcel-site-specific seeding configuration 1572 associated with the first composite project site.

91. The machine learning method of any of the above Clauses comprising:
triggering a pattern matching protocol 476E that determines a selective first inclusion of a first assemblage and a selective exclusion of one or more other composite project sites within 4 kilometers of a first composite project site both partly based on an application 1577 of first and second (instances of) speciation protocols 476B to the first multi-parcel-site-specific seeding configuration 1572 associated with the first composite project site 121 and an application 1577 of the first and second speciation protocols to the first multi-parcel-site-specific seeding configuration 1572 associated with one or more other composite project sites.

92. The machine learning method of any of the above Clauses comprising:
triggering a feature augmentation protocol 476F that includes obtaining an other (instance of a) building model by gleaning a user-provided inductive bias manifesting a first inferred (apparent user) preference 866 for a first speciation protocol, generating an other building model using the first speciation protocol 476B in lieu of the second speciation protocol, and displaying the other building model simultaneously with the first building model 202 (e.g. by showing both in a map 835 of a city that includes both composite project sites thereof).

93. The machine learning method of any of the above Clauses wherein the method combines a supervised learning protocol 476C with a pattern matching protocol 476E.

94. The machine learning method of any of the above Clauses wherein the method combines a pattern matching protocol 476E with a feature augmentation protocol 476F.

95. The machine learning method of any of the above Clauses wherein the method combines a feature augmentation protocol 476F with a supervised learning protocol 476C.

96. The machine learning method of any of the above Clauses wherein a comparison 1579 among one or more records 314 signals that the particular parcel 160 is not commonly owned with the first parcel 161 or with the second parcel 162 (or with both).

97. The machine learning method of any of the above Clauses comprising:
invoking transistor-based circuitry (e.g. one or more instances of authorization modules 334) configured to cause the first building model 202 of the first composite project site 121 to be prioritized over the second building model 202 of the first composite project site 121 and to be presented to a user of a visual display 1512 (e.g. a device user 10C using one or more display screens 1712) in lieu of the second building model 202 based on a programmatic scoring protocol 476D (e.g. a machine-learning-based score 481, rank 488, or other valuation 380);

98. The machine learning method of any of the above Clauses comprising:
causing numerous additional composite project sites 121 to be depicted all via a single display screen 1712 all within a one-hour period 1592 wherein each of the additional composite project sites 121 links a corresponding parcel 160 to at least one corresponding adjacent parcel 161 with which the corresponding parcel 160 is adjacent and wherein the corresponding parcels 160 include the particular parcel 160.

99. The machine learning method of any of the above Clauses comprising:
causing a collection of numerous additional composite project sites 121 to be depicted all via a single display screen 1712 all within a ten-minute period 1592 wherein each of the additional composite project sites 121 links a corresponding parcel 160 to at least one corresponding adjacent parcel 161 with which the corresponding parcel 160 is adjacent and wherein the corresponding parcels 160 include the particular parcel 160.

100. The machine learning method of any of the above Clauses comprising:
causing a geographically dispersed collection of numerous additional composite project sites 121 to be depicted all via a single display screen 1712 all within a ten-minute period 1592 wherein each of the additional composite project sites 121 links a corresponding parcel 160 to at least one corresponding adjacent parcel 161 with which the corresponding parcel 160 is adjacent, wherein more than half of the numerous additional composite project sites 121 are separated from the other additional composite project sites 121 by more than 100 meters, and wherein the corresponding parcels 160 include the particular parcel 160.

101. The machine learning method of any of the above Clauses comprising:
causing a first digital resource 1591 to be offered simultaneously for many of the additional composite project sites 121 on a first-come first-served basis so that one or more options 1584 presented to entities 610 that own a majority of the additional composite project sites 121.

102. The machine learning method of any of the above Clauses comprising:
invoking transistor-based circuitry (e.g. another one or more instances of speciation modules 333) configured to obtain first and second building models 202 of a third composite project site 123 based on an application 1577 of the one or more other speciation protocols 476B to a first multi-parcel-site-specific seeding configuration 1572 associated with the third composite project site 123; and
invoking transistor-based circuitry (e.g. one or more instances of authorization modules 334) configured to cause the first building model 202 of the third composite project site 123 to be prioritized over the one or more building models 202 of the first and second composite project sites 121, 122 and to be signaled to the user 10 of the visual display 1512 (at least partly) based on a programmatic scoring protocol 476D.

103. The machine learning method of any of the above Clauses wherein the one or more records 314 signal that the particular parcel 160 is not commonly owned with the first parcel 161 and wherein the one or more records 314 signal that the particular parcel 160 is not commonly owned with the second parcel 162.

104. The machine learning method of any of the above Clauses wherein the one or more records 314 signal that the particular parcel 160 is not commonly owned with the first parcel 161 and wherein the one or more records 314 signal that the particular parcel 160 is not commonly owned with the second parcel 162 and wherein the first and second composite project sites 121, 122 are automatically included in an inventory as a conditional response 1525 to information in the one or more records 314 indicating that at least the first and second parcels 161, 162 are not commonly owned with one another.

105. The machine learning method of any of the above Clauses comprising:
causing the first building model of the second composite project site 122 to be presented via the visual display 1512, 1712 in lieu of the second building model of the second composite project site 122 partly based on the programmatic scoring protocol and partly based on one or more preference-indicative actions 1594 of a user of the visual display 1512, 1712 (e.g. as a contemporaneous direct or other response 1525 to an action of the user signaling interest in the particular parcel).

106. The machine learning method of any of the above Clauses comprising:

invoking transistor-based circuitry (e.g. one or more instances of authorization modules 334) configured to cause the first building model 202 of an other assemblage to be prioritized over (at least) the first and second composite project sites 121, 122 and to displace the first or second composite project site 121, 122 partly based on the programmatic scoring protocol 476D and partly based on a first preference-indicative action 1594 of the user of the visual display 1512, 1712 (e.g. as a contemporaneous direct or other response 1525 to the first preference-indicative action 1594 of the user signaling interest in the particular parcel).

107. The machine learning method of any of the above Clauses comprising:

invoking transistor-based circuitry (e.g. one or more instances of authorization modules 334) configured to cause the first building model 202 of the first composite project site 121 to be prioritized over the second building model 202 of the first composite project site 121 and to be presented to a user of a visual display (e.g. a device user 10C using one or more display screens 1712) in lieu of the second building model 202 based on a programmatic scoring protocol 476.

108. The machine learning method of any of the above Clauses comprising:

applying one or more deterministically repeatable speciation protocols 476B as the applications 1577 of the first and second speciation protocols 476B respectively to the first multi-parcel-site-specific seeding configuration 1572 associated with the first and second composite project sites 121, 122.

109. The machine learning method of any of the above Clauses comprising:

applying one or more deterministically repeatable speciation protocols 476B as the applications 1577 of the first and second speciation protocols 476B respectively to the first multi-parcel-site-specific seeding configuration 1572 associated with the first and second composite project sites 121, 122 by causing a recordation of one or more parameters 831 (as operational data 405) thereof on a public blockchain 455.

110. The machine learning method of any of the above Clauses comprising:

implementing the programmatic scoring protocol 476D to include a determination of one or more machine-learning-based assemblage valuations 380 as components of the programmatic scoring protocol 476.

111. The machine learning method of any of the above Clauses comprising:

implementing the programmatic scoring protocol 476D to include a determination of one or more machine-learning-based scores 481 as components of the programmatic scoring protocol 476.

112. The machine learning method of any of the above Clauses comprising:

implementing the programmatic scoring protocol 476D to include a determination of one or more machine-learning-based ranks 488 as components of the programmatic scoring protocol 476.

113. The machine learning method of any of the above Clauses wherein a project-type attribute 617 thereof is included after having been provided by a user 10 of a client device 1700 thereof.

114. The machine learning method of any of the above Clauses wherein a project-type attribute 617 thereof is included that comprises one or more one or more timing restrictions 517 thereof.

115. The machine learning method of any of the above Clauses wherein a project-type attribute 617 thereof is included that comprises one or more one or more development-feature-specific restrictions 517 thereof (e.g. in regard to when a parcel thereof will become available).

116. The machine learning method of any of the above Clauses wherein a project-type attribute 617 thereof is included that comprises one or more geographic restrictions 517 thereof (e.g. in regard to where a project site or parcel is).

117. The machine learning method of any of the above Clauses wherein a project-type attribute 617 thereof is included that comprises one or more species-type attributes 617 thereof (e.g. being a species of residential or hybrid project).

118. The machine learning method of any of the above Clauses wherein a project-type attribute 617 thereof is included that comprises one or more parcel-type-specific attributes 617 thereof (e.g. in regard to a zoning or parcel-shape category).

119. The machine learning method of any of the above Clauses wherein a project-type attribute 617 thereof is included that comprises one or more site-type-specific attributes 617 thereof (e.g. in regard to a site size or relationship to a waterfront or other geographic boundary 1918).

120. The machine learning method of any of the above Clauses wherein a project-type attribute 617 thereof is included that comprises one or more parcel-owner-specific attributes 617 thereof (e.g. being a whitelisted or otherwise favored entity 610).

121. The machine learning method of any of the above Clauses wherein a project-type attribute 617 thereof is included that comprises one or more model-type-specific attributes thereof (e.g. featuring a commercial, industrial or hybrid model).

122. The machine learning method of any of the above Clauses wherein a project-type attribute 617 thereof is included defining a vertical, areal, or other (approximate or other) physical dimension 368 thereof.

123. The machine learning method of any of the above Clauses wherein a project-type attribute 617 thereof pertains to a scoring, suitability, or other artificial quantification 369 thereof.

124. The machine learning method of any of the above Clauses wherein a first project type thereof is defined by combining two or more project-type attributes 617 as components thereof.

125. A machine learning system 300, 800, 1500 configured to perform any of the above-described methods.

126. A machine learning system 300, 800, 1500 for facilitating multi-parcel development wherein the system implements one or more data flows or operational flows (or both) as described herein.

127. A machine learning system 300, 800, 1500 configured to perform or otherwise facilitate most or all operations of flow 2200.

128. A machine learning system 300, 800, 1500 configured to perform or otherwise facilitate most or all operations of flow 2300.

129. A machine learning system 300, 800, 1500 configured to perform or otherwise facilitate most or all operations of flow 2400.

130. A machine learning system 300, 800, 1500 configured to perform or otherwise facilitate most or all operations of data flow 2500.

131. A machine learning system 300, 800, 1500 configured to perform or otherwise facilitate most or all operations of data flow 2600.

132. A machine learning system 300, 800, 1500 configured to perform or otherwise facilitate most or all operations of data flow 2700.

133. A machine learning system 300, 800, 1500 for facilitating multi-parcel development, the system comprising:

transistor-based circuitry (e.g. one or more instances of interface modules 331) configured to obtain an identification of (at least) first and second composite project sites 121, 122 wherein the first composite project site 121 includes a first parcel 161 adjacent the particular parcel 160 in combination with the particular parcel 160, wherein the second composite project site 122 likewise includes a second parcel 162 adjacent the particular parcel 160 in combination with the particular parcel 160, and wherein one or more records 314 signal that the particular parcel 160 is not commonly owned with the first parcel 161 or with the second parcel 162 (or with both);

transistor-based circuitry (e.g. one or more instances of speciation modules 333) configured to obtain first and second building models 202 of the first composite project site 121 each based on (at least) a respective application 1577 of first and second speciation protocols 476B to a first multi-parcel-site-specific seeding configuration 1572 associated with the first composite project site 121; and transistor-based circuitry (e.g. another one or more instances of speciation modules 333) configured to obtain first and second building models 202 of the second composite project site 122 each based on a respective application 1577 of first and second speciation protocols 476B (at least) to a first multi-parcel-site-specific seeding configuration 1572 associated with the second composite project site 122.

134. A machine learning system 300, 400, 1500 for facilitating multi-parcel development, comprising:

transistor-based circuitry (e.g. one or more instances of interface modules 331) configured to cause a geographically mapped presentation 834 of a first project site prioritization 833, 1933A favoring first-type and second-type project options 1584, 1984A-B (e.g. respectively corresponding to fourth-type species 1024 and fifth-type species 1025) over a third-type project option 1584, 1984 (e.g. corresponding to a second-type species 1022 or third-type species 1023) to a first device user 10D; and transistor-based circuitry (e.g. one or more control and response modules 332, 336 jointly) configured to express a second project site prioritization 833, 1933B later favoring the third-type project option 1584, 1984 (e.g. corresponding to a second-type species 1022) over the first-type and second-type project options 1584, 1984A-B (e.g. respectively corresponding to fourth-type species 1024 and fifth-type species 1025) to the first device user 10D partly based on an explicit indication 840 (e.g. from a first indexing module 335) of a preference 866 of the first device user 10D for the third-type composite project option 1584, 1984 over the second-type project option 1584, 1984B (e.g. from the first device user 10D having disparaged the second-type composite project option and partly based on an implicit indication 840 of a preference 866 (e.g. from another indexing module 335) of the first device user 10D for the third-type composite project option 1584, 1984 over the first-type project option 1584, 1984A inferred from (at least) second and third device users 10A-B who have (dismissed or otherwise) disparaged the first-type composite project option 1584, 1984A.

135. Any machine learning system as described above, the system comprising:

transistor-based circuitry configured to improve a first inclusion 788 spanning (a boundary between) the second-type parcel 162 and another parcel of the second-type site species 1022 through numerous iterations 1424 of refinement speciation 975 as a conditional real-time response 1525 to the second project site prioritization 833, 1933B.

136. Any machine learning system as described above, the system comprising:

transistor-based circuitry (e.g. one or more instances of machine learning modules 337) configured to improve a first inclusion 788 spanning (a boundary between) the second-type parcel 162 and another parcel of the second-type site species 1022 through numerous iterations 1424 of refinement speciation 975 as a conditional real-time response 1525 to the second project site prioritization 833, 1933B; and transistor-based circuitry configured to implement a development 1400B (e.g. by an additional machine learning module 337) of an additional instance of an inclusion 788 spanning the first-type parcel 161 and another parcel of the first-type site species 1021 through numerous iterations 1424 of speciation 975 as a conditional real-time response 1525 to the second project site prioritization 833, 1933B.

137. Any machine learning system as described above wherein (at least two of) the mentioned instances of transistor-based circuitry are geographically remote from one another (i.e. more than 1 kilometer apart).

138. Any machine learning system as described above wherein all of the mentioned instances of transistor-based circuitry reside within a single device (e.g. an ASIC).

139. Any machine learning system as described above including a first indexing module 335 that comprises:

transistor-based circuitry 330 configured to manifest an activation of a control 1595 as a voltage configuration 355 to index to a next-most-preferable option, wherein such indexing modifies a user selection.

140. Any machine learning system as described above including a first response module 336 that comprises:

transistor-based circuitry 330 configured to generate a conditional response 1525 in which numerous parcels 160 in a region 311 each undergoes one or more augmentations, disqualifications, or other such distillations (see FIG. 22).

141. Any machine learning system as described above including a first transmission module 338 that comprises:

transistor-based circuitry 330 configured to transmit one or more inquiries 1583 or related resources 1591, optionally including a primary aspect thereof sent to a cryptographically secured digital wallet (e.g. as security feature 1760) that receives or provides the one or more resources 1591.

142. Any machine learning system as described above including a first transmission module 338 that comprises:

transistor-based circuitry 330 configured to transmit one or more inquiries 1583 or related resources 1591, optionally including a primary aspect thereof sent to one or more mining rigs that comprise proof-of-work blockchain node devices 1700.

143. Any machine learning system as described above including a first transmission module 338 that comprises:

transistor-based circuitry 330 configured to transmit one or more inquiries 1583 or related resources 1591, optionally including a primary aspect thereof sent to one or more stake authority nodes that comprise proof-of-stake blockchain node devices 1700.

144. Any machine learning system as described above including a first control module 332 that comprises:

transistor-based circuitry 330 configured to perform an instance of one or more other modules by delegation (e.g. by triggering one or more functions thereof to be performed abroad or in one or more cloud servers 1800).

With respect to the numbered claims expressed below, those skilled in the art will appreciate that recited operations therein may generally be performed in any order. Also, although various operational flows are presented in sequence(s), it should be understood that the various operations may be performed in other orders than those which are illustrated or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other such transitive, relational, or other connections do not generally exclude such variants, unless context dictates otherwise.

What is claimed is:

1. A feature augmentation and pattern matching method for facilitating multi-parcel development, comprising:
    causing, by first transistor-based circuitry, a depiction of an augmented first species of a first composite project site that combines a first-type subject parcel with a second-type primary parcel wherein one or more first-type parcels including said first-type subject parcel are each owned by a first entity who does not own said second-type primary parcel;
    responding to a first user request in reference to said second-type primary parcel, by second transistor-based circuitry, by presenting an indication of numerous second-type parcels that include a second-type alternative parcel and that are each owned by a second entity who does not own any of said first-type parcels wherein said responding to said first user request in reference to said second-type primary parcel comprises invoking transistor-based circuitry configured to develop an augmented first species of a second composite project site that combines a virtual building model spanning a third-type associated parcel owned by a third entity with said second-type alternative parcel owned by said second entity; wherein said first user request is a first user action; and wherein said first-type, second-type, and third-type parcels are all mutually exclusive parcel types;
    developing, by third transistor-based circuitry, an augmented second species of said second composite project site that combines a virtual building model spanning at least said third-type associated parcel owned by said third entity with said second composite project site as a second user action;
    generating, by fourth transistor-based circuitry, a preliminary first draft message configured with both an indication of said numerous second-type parcels that include said second-type alternative parcel and a routing element associated with said second entity who owns said numerous second-type parcels as a conditional response to a second user action at a client device; and
    transmitting, by fifth transistor-based circuitry, a version of said message that includes at least said indication of said numerous second-type parcels that include said second-type alternative parcel to said second entity using said routing element without identifying said second-type primary parcel and without any reference to said first composite project site.

2. The method of claim 1 wherein one or more virtual building models span two or more land parcels of said second composite project site through very numerous iterations of refinement speciation as a conditional response to a parcel-selective user action that is not said first user request.

3. The method of claim 1 wherein developing said augmented first species of said second composite project site that combines said virtual building model spanning at least said third-type associated parcel owned by said third entity with said second composite project site as said conditional response to said first user action comprises:
    implementing one or more deterministically repeatable speciation protocols upon said second composite project site based on said first user action.

4. The method of claim 1 comprising:
    indicating said second composite project site as prioritized over said first composite project site in a message transmitted to said second entity.

5. A feature augmentation and pattern matching method for facilitating multi-parcel development, comprising:
    causing, by first transistor-based circuitry, depiction of an augmented first species of a first composite project site that combines a first-type subject parcel with a second-type primary parcel;
    responding to a first user request in reference to said second-type primary parcel, by second transistor-based circuitry, by presenting an indication of several second-type parcels that include a second-type alternative parcel wherein said responding to said first user request in reference to said second-type primary parcel comprises developing an augmented first species of a second composite project site that combines a virtual first building model spanning a third-type associated parcel with said second-type alternative parcel; wherein said first user request is a first user action; and wherein said first-type, second-type, and third-type parcels are all mutually exclusive parcel types;
    causing, by third transistor-based circuitry, a presentation of said augmented second species of said second composite project site in a first assemblage that combines at least said second-type alternative parcel with said third-type associated parcel by implementing one or more deterministically repeatable speciation protocols upon said second composite project site using a first multi-parcel-site-specific seeding configuration with said first user action wherein said augmented second species includes said virtual first building model;
    identifying, by fourth transistor-based circuitry, said third-type associated parcel as being suitable for combination with said second-type alternative parcel;
    causing, by fifth transistor-based circuitry, a development of said augmented first species of said second composite project site so as to combine a virtual building model spanning at least said third-type associated parcel with said second composite project site both as a conditional response to a second user action, wherein developing said augmented first species of said second composite project site comprises implementing one or more deterministically repeatable speciation protocols upon said second composite project site using a first multi-parcel-site-specific seeding configuration with said first user action; and producing, by sixth transistor-based circuitry, a natural-language message identifying one or more components of said first assemblage that combines at least said second-type alternative parcel with said third-type associated parcel after said presentation of said first augmented species of said second composite project site in said first assemblage.

6. The method of claim 5 wherein a first type is defined so that said one or more first-type parcels including said first-type subject parcel are owned by a first entity who does not own said second-type primary parcel; wherein a second type is defined so that said several second-type parcels are owned by a second entity; and wherein one or more third-type parcels including said third-type associated parcel are owned by a third entity.

7. The method of claim 5 comprising:

automatically generating a message configured with both an indication of said several second-type parcels that include said second-type alternative parcel and a routing element associated with a device user who owns said several second-type parcels as a conditional response to a user action at a client device of another user; and transmitting a final version of said message that includes at least said indication of said several second-type parcels that include said second-type alternative parcel to said device user who owns said several second-type parcels using said routing element wherein said final version of said message identifies said second-type alternative parcel but does not identify said second-type primary parcel.

8. The method of claim 5 comprising:

triggering a feature augmentation protocol that includes obtaining another building model by gleaning a user-provided inductive bias manifesting a first inferred preference for a first speciation protocol, generating said other building model using said first speciation protocol, and displaying said other building model simultaneously with said first building model.

9. A computer program product comprising:

one or more non-transitory, tangible, nonvolatile storage media; and machine instructions borne on said one or more non-transitory, tangible, nonvolatile storage media which, when running on one or more computer systems, cause said one or more computer systems to perform a method for facilitating multi-parcel development comprising:

causing a depiction of an augmented first species of a first composite project site that combines a first-type subject parcel with a second-type primary parcel;

responding to a first user action in reference to said second-type primary parcel by presenting an indication of several second-type parcels that include a second-type alternative parcel by developing an augmented first species of a second composite project site that combines a virtual building model spanning a third-type associated parcel with said second-type alternative parcel and also with a building model spanning two or more parcels of said second composite project site; and developing an augmented second species of said second composite project site that combines a virtual building model spanning at least said third-type associated parcel with said second composite project site both as a conditional response to a second user action by implementing one or more deterministically repeatable speciation protocols upon said second composite project site using a first multi-parcel-site-specific seeding configuration with said first user action.

10. The computer program product of claim 9 wherein said method for facilitating multi-parcel development comprises:

signaling a forward direction as a conditional response to one or more indications of a user-favored project type change (1) by obtaining a first positional distribution comprising a range that includes several candidate species including a most-forward candidate species having a most-forward offset and (2) by obtaining a second positional distribution comprising said forward net change partly based on several offsets that each correspond to a corresponding one of said several candidate species and partly based on an addition/inclusion of a most-rearward offset to said first positional distribution so that a foremost component of said second positional distribution advances forward.

11. The computer program product of claim 9 wherein said method for facilitating multi-parcel development comprises:

generating a preliminary first draft message configured with both an indication of said one or more second-type parcels that include said second-type alternative parcel and a routing element associated with a second entity who owns said one or more second-type parcels as a conditional response to said second user action; and transmitting a version of said message that includes at least said indication of said one or more second-type parcels that include said second-type alternative parcel to said second entity using said routing element.

12. The computer program product of claim 9 wherein said method for facilitating multi-parcel development comprises:

transmitting an expression of an association between a first project selection parameter and a first device user and an expression of an association between a second project selection parameter and said first device user both to said first device user;

receiving an unfavorable signal of said expression of said association between said first project selection parameter and said first device user;

causing a development of a third composite project site selectively based on said second project selection parameter without said first device user yet having expressed said association with said second project selection parameter; and automatically initiating a development of an additional inclusion spanning said first-type parcel and another parcel of said first-type site species through numerous iterations of speciation as a conditional real-time response to a project site reprioritization.

13. The computer program product of claim 9 wherein said method for facilitating multi-parcel development comprises:

obtaining an indication of a subtle interest of a first user based on a second-type primary parcel being included in said first composite project site without said first user having actuated any controls that coincide with any second-type primary parcel or owner thereof;

responding to said subtle interest of said first user in a best second-type primary parcel by determining a plurality of alternative parcels that have a same type with said second-type primary parcel and by obtaining an indication of which of said plurality of alternative parcels is best according to a current scoring protocol; and transmitting to an entity that owns both a higher-ranked primary parcel and a lower-ranked alternative parcel a message that refers to said composite project site that includes said lower-ranked alternative parcel but does not refer to any composite project site that includes said second-type primary parcel.

14. The computer program product of claim 9 wherein said method for facilitating multi-parcel development comprises:

obtaining said first and second building models of said first project site each based on a respective application of two or more deterministically repeatable speciation protocols to a first multi-parcel-site-specific seeding configuration associated with said first project site; and triggering a supervised learning protocol that includes pairing first input data that includes said first composite project site with a corresponding indication of user preference.

15. The computer program product of claim 9 wherein said method for facilitating multi-parcel development comprises:

triggering a supervised learning protocol that includes pairing numerous vector-valued input objects each to a corresponding desired output value; and triggering a feature augmentation protocol that includes an application of said one or more deterministically repeatable speciation protocols to a first multi-parcel-site-specific seeding configuration associated with said first composite project site.

16. The computer program product of claim 9 wherein said method for facilitating multi-parcel development comprises:

triggering a pattern matching protocol that determines a selective first inclusion of a first assemblage and a selective exclusion of one or more other composite project sites within 4 kilometers of said first composite project site both based on an application of said one or more deterministically repeatable speciation protocols to said first multi-parcel-site-specific seeding configuration associated with said first composite project site; and triggering a feature augmentation protocol that includes generating an other building model using a first one of said one or more deterministically repeatable speciation protocols displaying said other building model simultaneously with said first building model by showing both in a map that includes both said first and second composite project sites.

17. The computer program product of claim 9 wherein said method for facilitating multi-parcel development combines a supervised learning protocol with both a pattern matching protocol and a feature augmentation protocol and wherein a comparison among one or more records signals that said third-type associated parcel is not commonly owned with said first-type parcels or with said second-type parcels.

18. The computer program product of claim 9 wherein said method for facilitating multi-parcel development comprises:

invoking transistor-based circuitry configured to manifest an activation of a control as a voltage configuration to index to a next-most-preferable option, wherein such indexing modifies a user selection as said second user action.

19. The computer program product of claim 9 wherein said method for facilitating multi-parcel development comprises:

invoking transistor-based circuitry configured to transmit one or more resources including a component thereof sent to a cryptographically secured digital wallet that receives or provides said one or more resources.

20. The computer program product of claim 9 wherein said method for facilitating multi-parcel development comprises:

invoking transistor transistor-based circuitry configured to transmit one or more resources including a component thereof sent to one or more mining rigs that comprise proof-of-work blockchain node devices.

21. The computer program product of claim 9 wherein said method for facilitating multi-parcel development comprises:

invoking transistor transistor-based circuitry configured to transmit one or more resources including a component thereof sent to one or more stake authority nodes that comprise proof-of-stake blockchain node devices.

* * * * *